(12) United States Patent
Strothmann et al.

(10) Patent No.: US 9,704,769 B2
(45) Date of Patent: Jul. 11, 2017

(54) SEMICONDUCTOR DEVICE AND METHOD OF FORMING ENCAPSULATED WAFER LEVEL CHIP SCALE PACKAGE (EWLCSP)

(71) Applicant: STATS ChipPAC, Ltd., Singapore (SG)

(72) Inventors: Thomas J. Strothmann, Tuscon, AZ (US); Seung Wook Yoon, Singapore (SG); Yaojian Lin, Singapore (SG)

(73) Assignee: STATS ChipPAC Pte. Ltd., Singapore (SG)

( * ) Notice: Subject to any disclaimer, the term of this patent is extended or adjusted under 35 U.S.C. 154(b) by 0 days.

(21) Appl. No.: 14/627,347

(22) Filed: Feb. 20, 2015

(65) Prior Publication Data

US 2015/0243575 A1 Aug. 27, 2015

Related U.S. Application Data

(60) Provisional application No. 61/945,739, filed on Feb. 27, 2014.

(51) Int. Cl.
*H01L 21/56* (2006.01)
*H01L 23/31* (2006.01)
*H01L 23/00* (2006.01)

(52) U.S. Cl.
CPC ...... *H01L 23/3114* (2013.01); *H01L 23/3157* (2013.01); *H01L 24/96* (2013.01);
(Continued)

(58) Field of Classification Search
CPC ......... H01L 21/67126; H01L 21/67282; H01L 24/97; H01L 2924/14; H01L 21/48;
(Continued)

(56) References Cited

U.S. PATENT DOCUMENTS

| 5,834,844 A | 11/1998 | Akagawa et al. |
| 5,960,308 A | 9/1999 | Akagawa et al. |

(Continued)

FOREIGN PATENT DOCUMENTS

JP 8330313 A 12/1996

OTHER PUBLICATIONS

Yoon, S.W., "Integrated 3D Wafer Level Packaging Solutions for Mobile Applications", SEMICON, Singapore 2013.
(Continued)

*Primary Examiner* — Jasmine Clark
(74) *Attorney, Agent, or Firm* — Robert D. Atkins; Patent Law Group: Atkins and Associates, P.C.

(57) ABSTRACT

A semiconductor device has a semiconductor die and an encapsulant around the semiconductor die. A fan-in interconnect structure is formed over the semiconductor die while leaving the encapsulant devoid of the interconnect structure. The fan-in interconnect structure includes an insulating layer and a conductive layer formed over the semiconductor die. The conductive layer remains within a footprint of the semiconductor die. A portion of encapsulant is removed from over the semiconductor die. A backside protection layer is formed over a non-active surface of the semiconductor die after depositing the encapsulant. The backside protection layer is formed by screen printing or lamination. The backside protection layer includes an opaque, transparent, or translucent material. The backside protection layer is marked for alignment using a laser. A reconstituted panel including the semiconductor die is singulated through the encapsulant to leave encapsulant disposed over a sidewall of the semiconductor die.

23 Claims, 26 Drawing Sheets

(52) U.S. Cl.
CPC ............ *H01L 24/97* (2013.01); *H01L 21/561* (2013.01); *H01L 21/568* (2013.01); *H01L 23/562* (2013.01); *H01L 2224/04105* (2013.01); *H01L 2224/11* (2013.01); *H01L 2224/12105* (2013.01); *H01L 2224/73267* (2013.01); *H01L 2924/18162* (2013.01); *H01L 2924/3511* (2013.01)

(58) Field of Classification Search
CPC . H01L 21/561; H01L 21/563; H01L 23/3121; H01L 2224/023; H01L 23/544; H01L 2924/12042; H01L 24/11; H01L 23/3107; H01L 24/96; H01L 2924/181; H01L 2224/03; H01L 24/16; H01L 23/49816
See application file for complete search history.

(56) References Cited

U.S. PATENT DOCUMENTS

| | | |
|---|---|---|
| 6,023,094 A | 2/2000 | Kao et al. |
| 6,030,512 A | 2/2000 | Ihara et al. |
| 6,175,162 B1 | 1/2001 | Kao et al. |
| 6,200,888 B1 | 3/2001 | Ito et al. |
| 6,709,953 B2 | 3/2004 | Vasquez et al. |
| 6,734,532 B2 | 5/2004 | Koduri et al. |
| 6,916,688 B1 | 7/2005 | Kelkar et al. |
| 6,919,262 B2 | 7/2005 | Senoo et al. |
| 7,109,587 B1 | 9/2006 | Li |
| 7,135,385 B1 | 11/2006 | Patwardhan et al. |
| 7,256,074 B2 | 8/2007 | Voelz |
| 7,417,311 B2 | 8/2008 | Yamano |
| 7,468,292 B2 | 12/2008 | Yamano |
| 7,642,128 B1 | 1/2010 | Lin et al. |
| 7,642,175 B1 | 1/2010 | Patwardhan et al. |
| 7,915,690 B2* | 3/2011 | Shen ............... H01L 21/568 257/390 |
| 8,258,633 B2 | 9/2012 | Sezi et al. |
| 8,367,475 B2 | 2/2013 | Law et al. |
| 2010/0095739 A1 | 4/2010 | DeNatale et al. |
| 2011/0037163 A1* | 2/2011 | Lachner ............... H01L 21/561 257/693 |
| 2011/0127668 A1 | 6/2011 | Lin et al. |
| 2012/0001328 A1* | 1/2012 | Chang ............... H01L 23/3128 257/738 |
| 2012/0187584 A1 | 7/2012 | Lin et al. |
| 2013/0037935 A1 | 2/2013 | Xue et al. |
| 2013/0280826 A1* | 10/2013 | Scanlan ............... H01L 23/544 438/15 |
| 2013/0341774 A1 | 12/2013 | Chang et al. |
| 2014/0091455 A1 | 4/2014 | Strothmann et al. |
| 2014/0091482 A1 | 4/2014 | Lin et al. |
| 2014/0117530 A1* | 5/2014 | Breymesser ........ H01L 23/3114 257/734 |
| 2014/0131896 A1 | 5/2014 | Yu et al. |
| 2014/0183718 A1 | 7/2014 | Han et al. |
| 2014/0183761 A1 | 7/2014 | Lin et al. |
| 2015/0145149 A1* | 5/2015 | Wachter ............... H01L 23/544 257/787 |
| 2015/0235902 A1* | 8/2015 | Tsai ............... H01L 21/78 438/464 |

OTHER PUBLICATIONS

Elenius, P., "The Ultra CSP Wafer Scale Package", IEEE, 1998 Electronics Packaging Technology Conference, pp. 83-88.

Prashant et al., Cost Effective 300mm Large Scale eWLB (embedded Wafer Level BGA) Technology, IEEE, 2011 13th Electronics Packaging Technology Conference, pp. 117-121.

M. Brunnbauer et al., "Embedded Wafer Level Ball Grid Array (eWLB)", IEEE, 2006 Electronics Packaging Technology Conference, pp. 1-5.

Seung Wook Yoon et al., Fanout Flipchp eWLB (embedded Wafer Level Ball Grid Array) Technology, IEEE, 2013 Electronic Components & Technology Conference, pp. 1855-1860.

Adwill LC-Series, Backside Coating Tape, Lintec Corporation, 21 pages, Apr. 7, 2011.

* cited by examiner

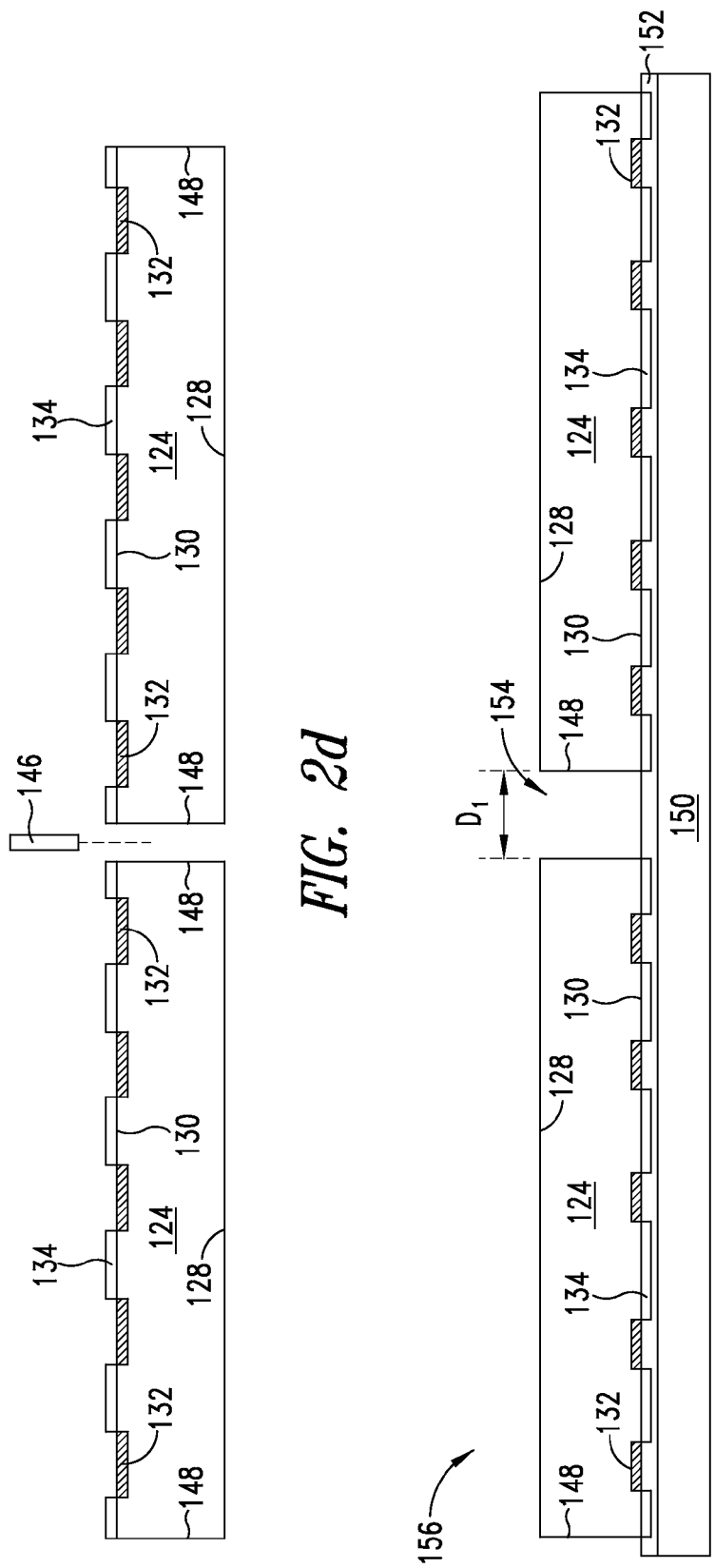

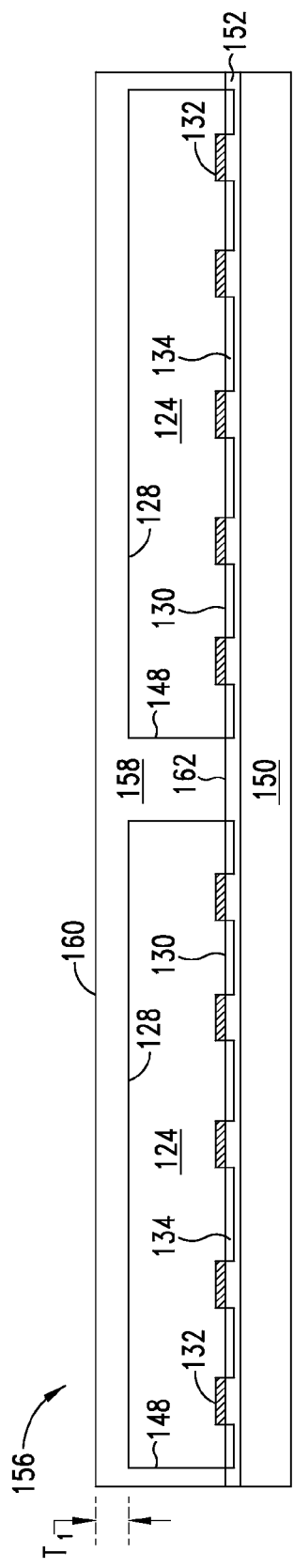
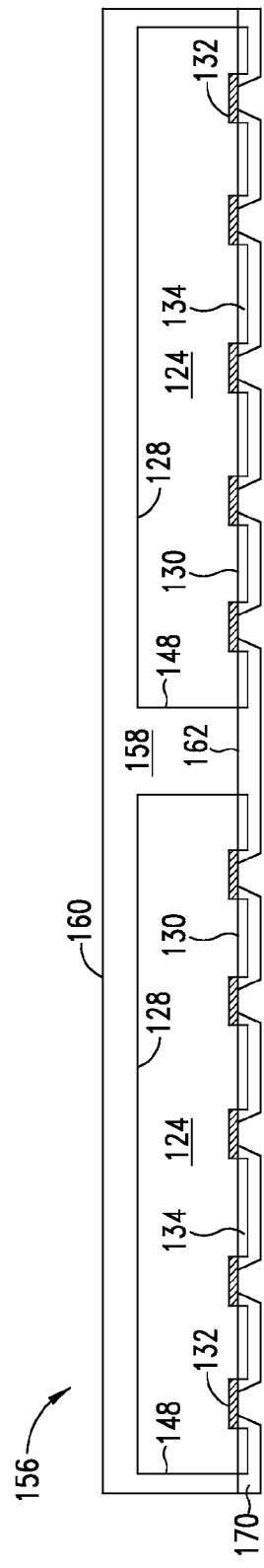

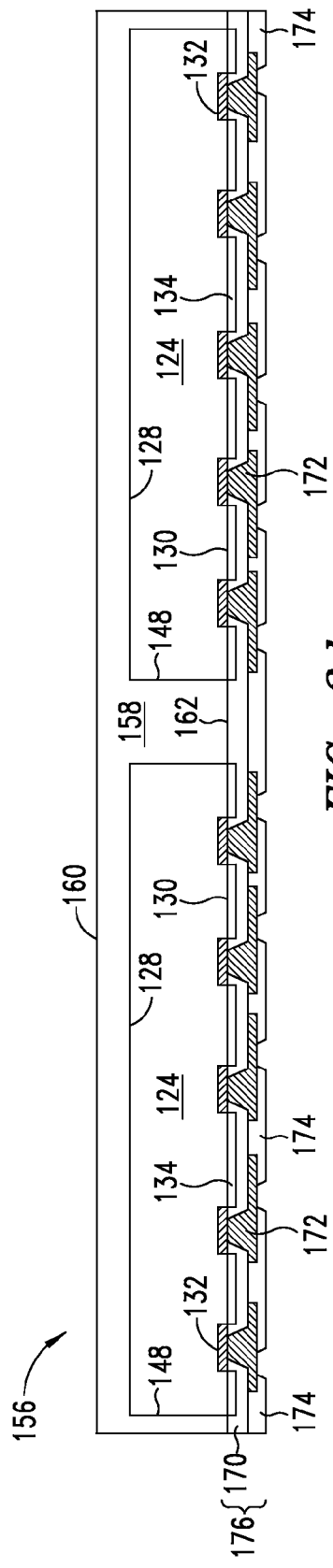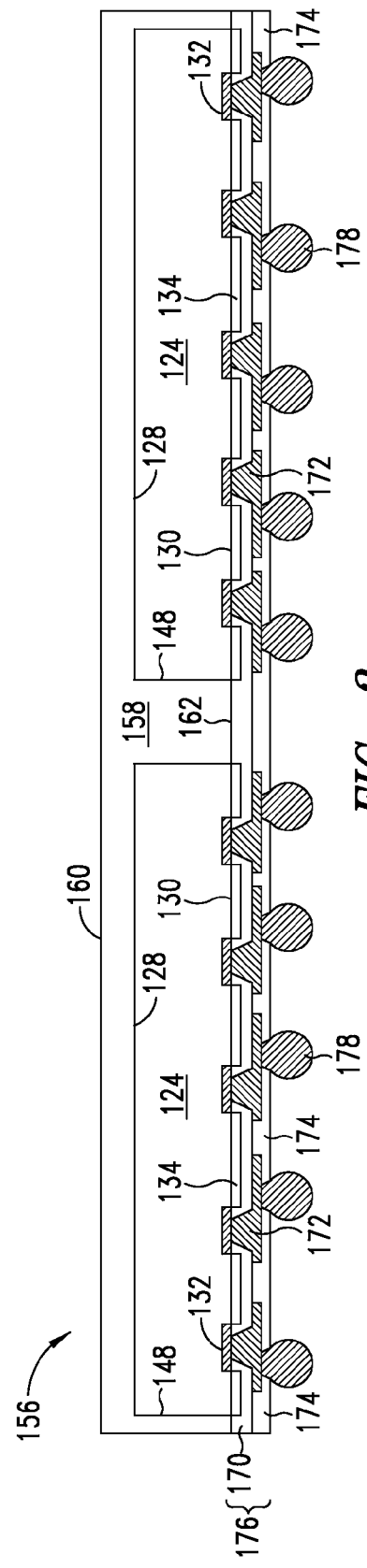

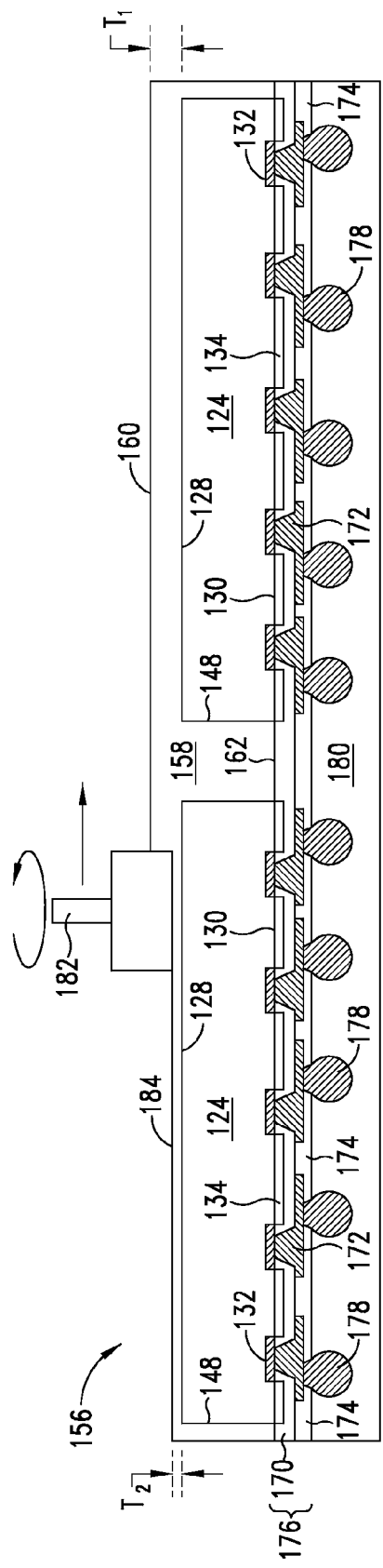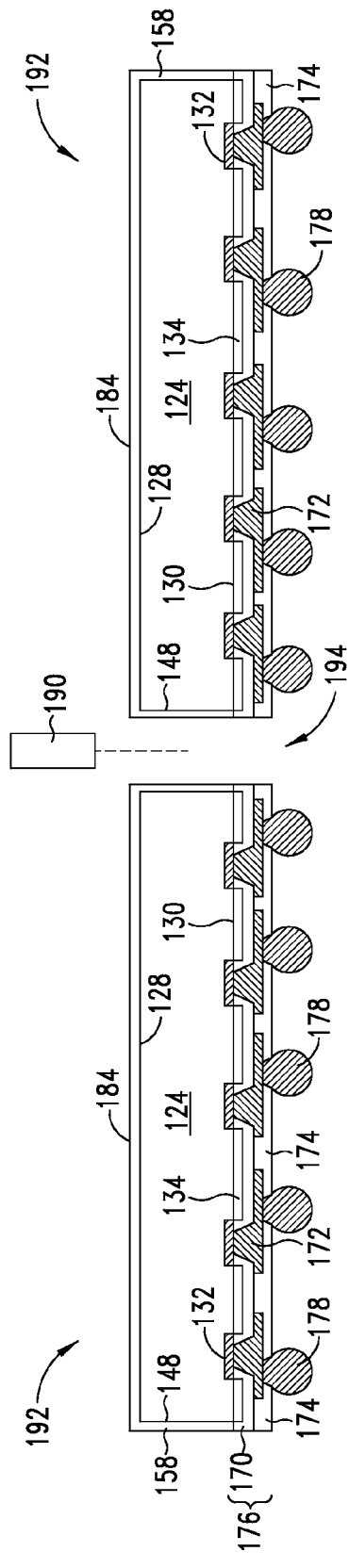

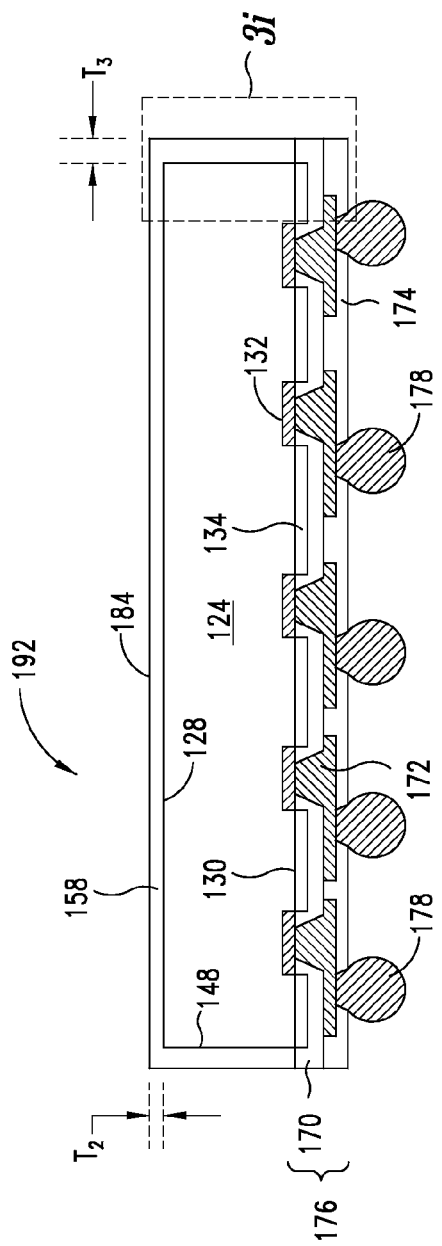
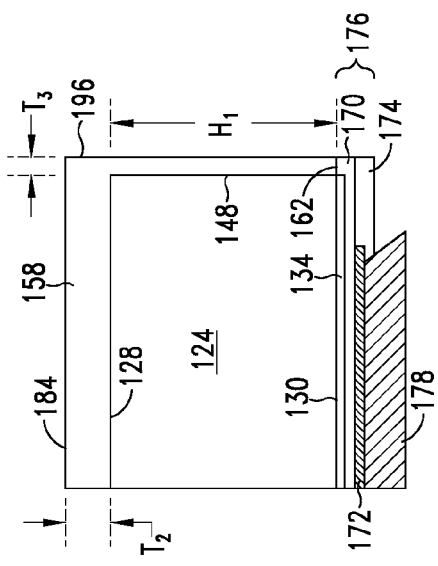
FIG. 3h
FIG. 3i

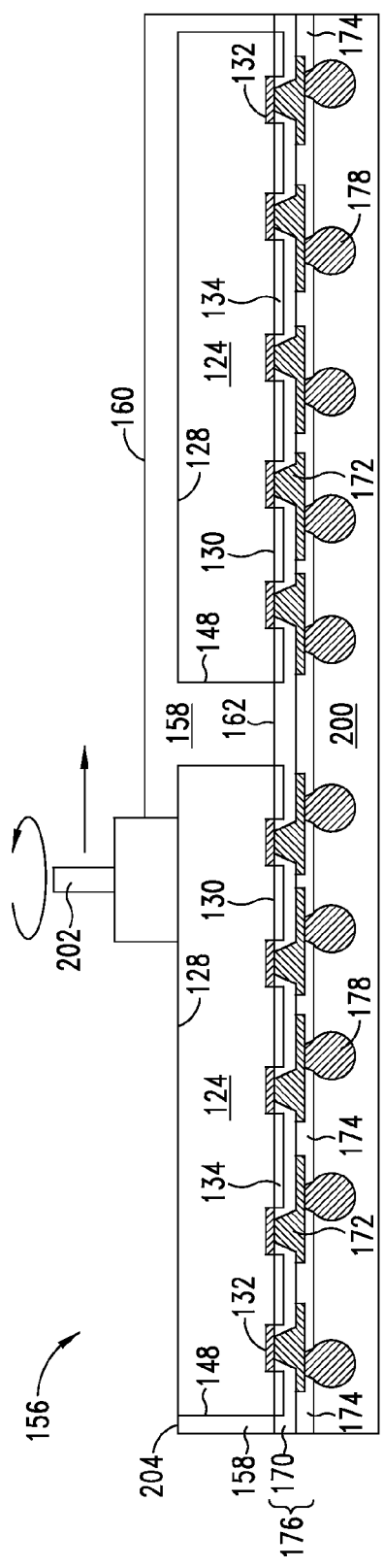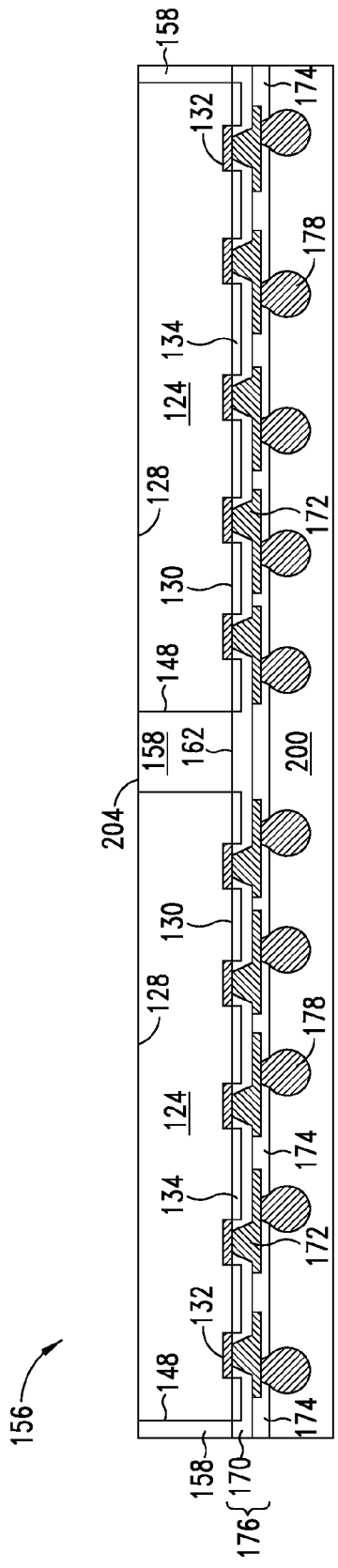
FIG. 5a
FIG. 5b

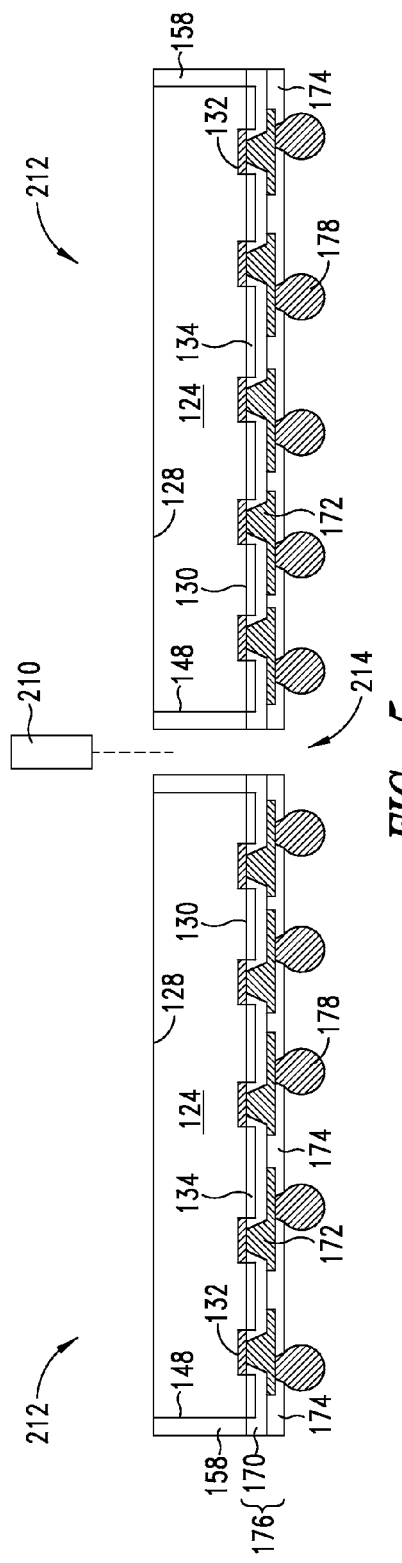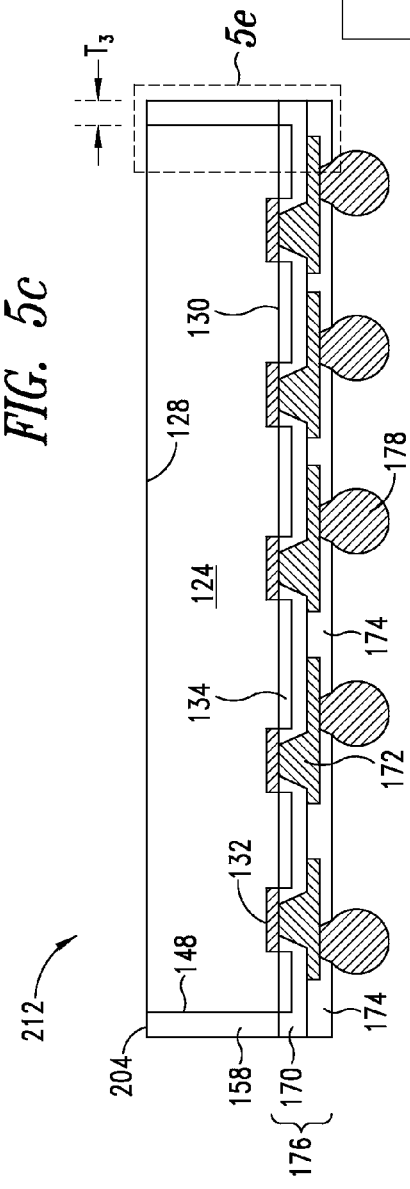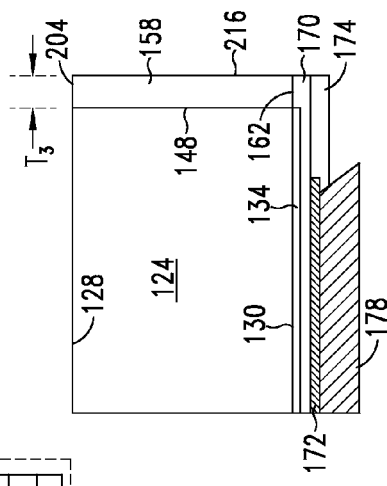

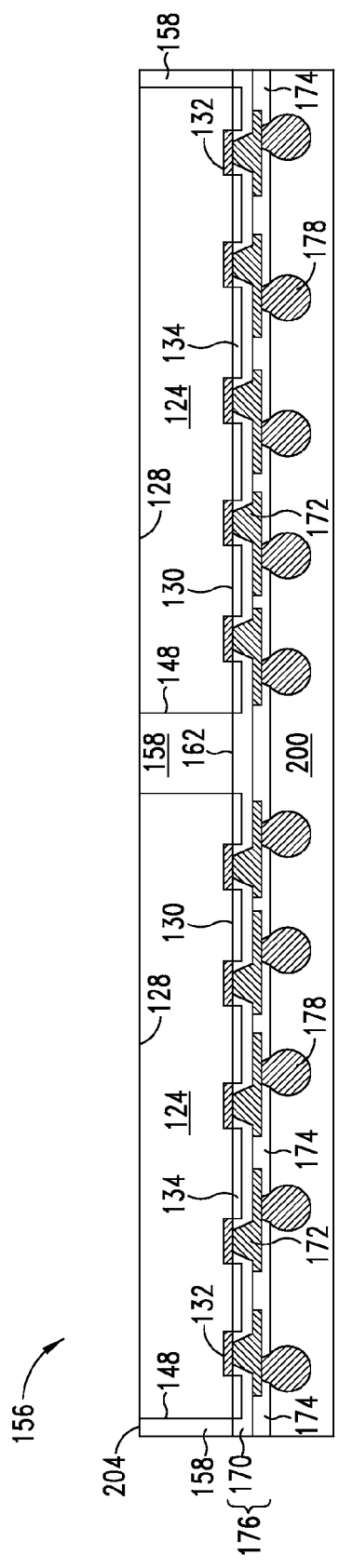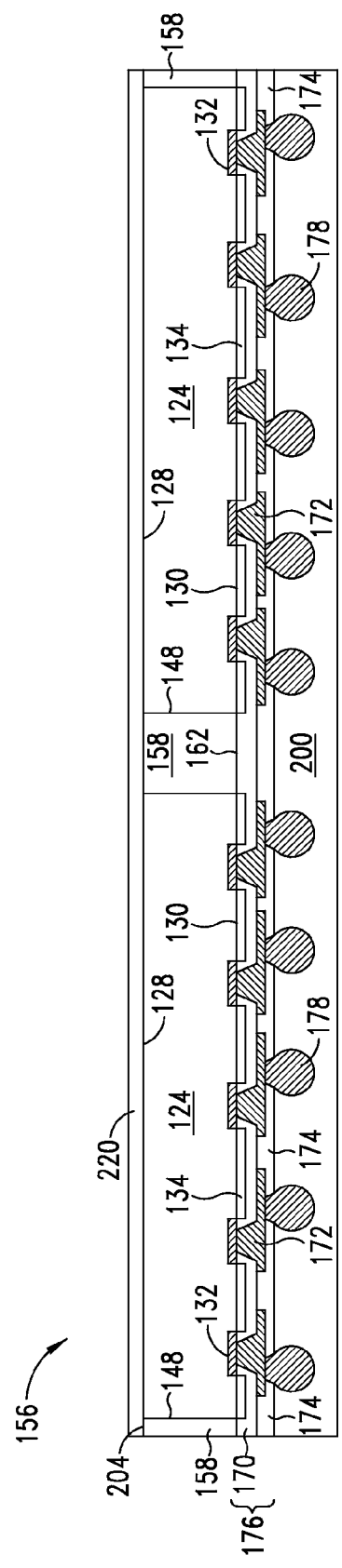

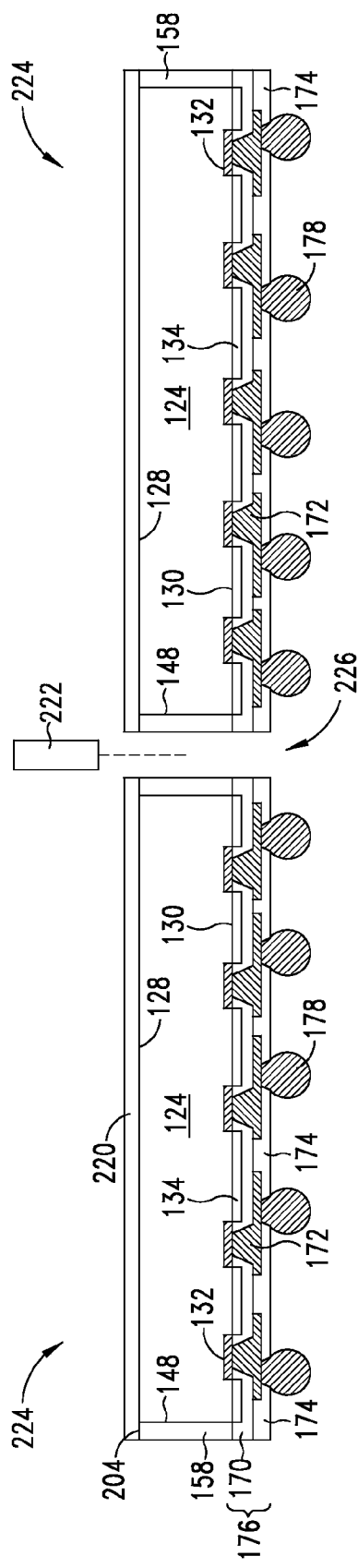
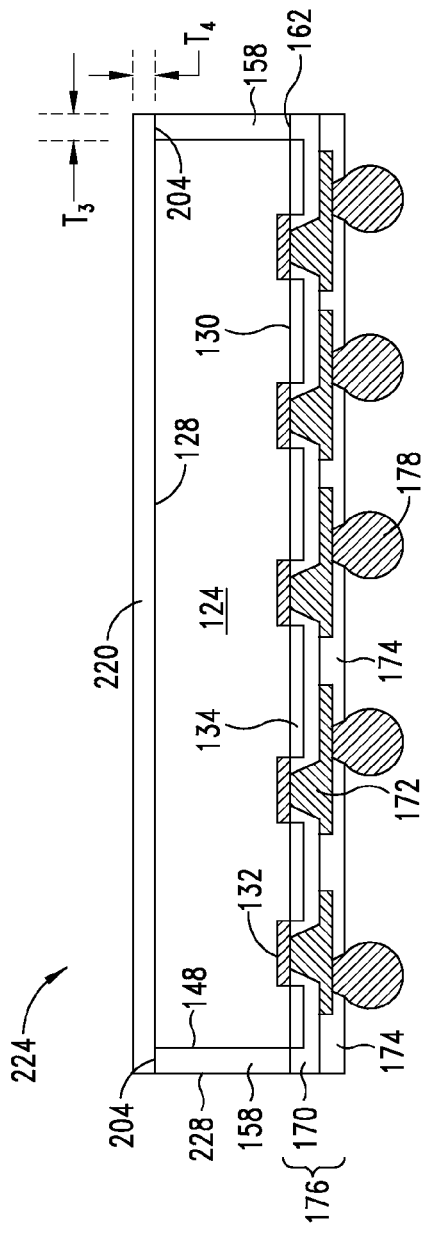
FIG. 6c
FIG. 6d

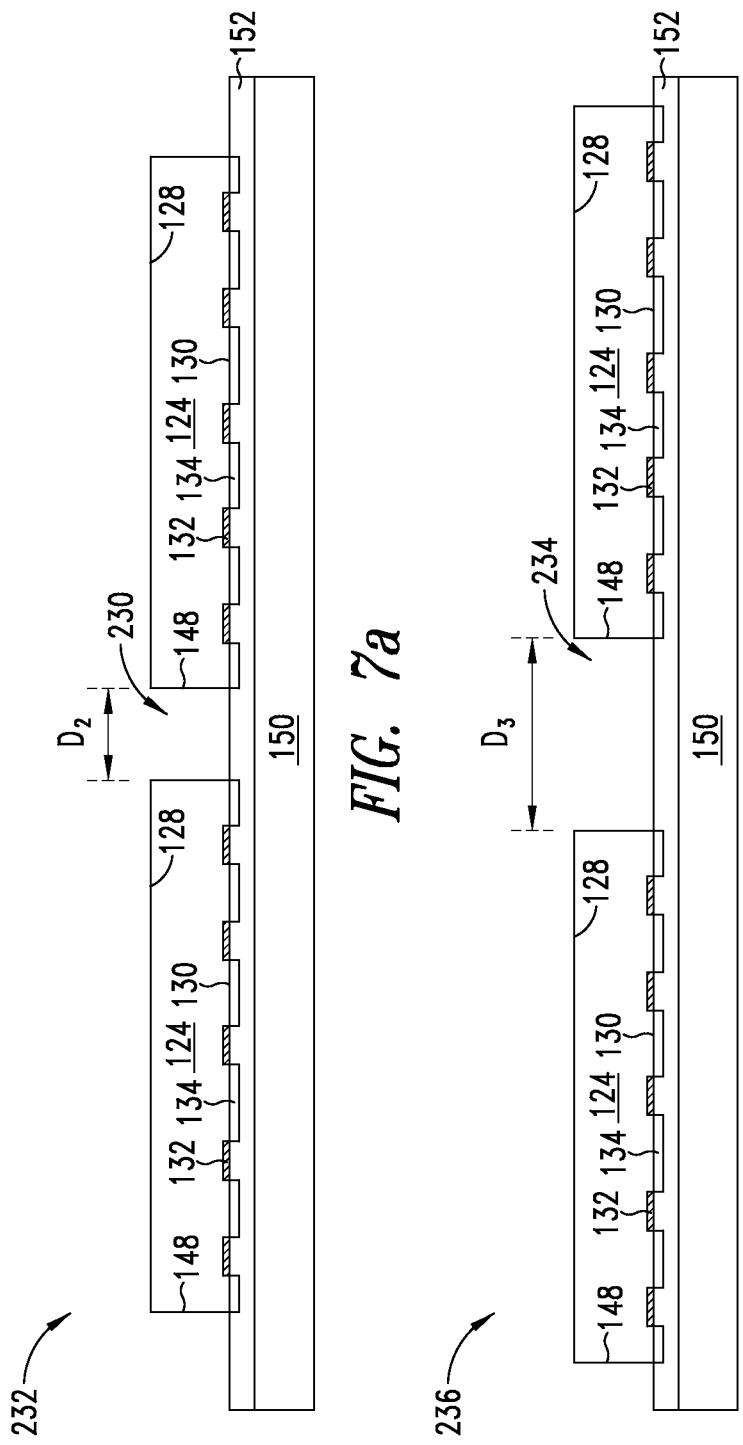

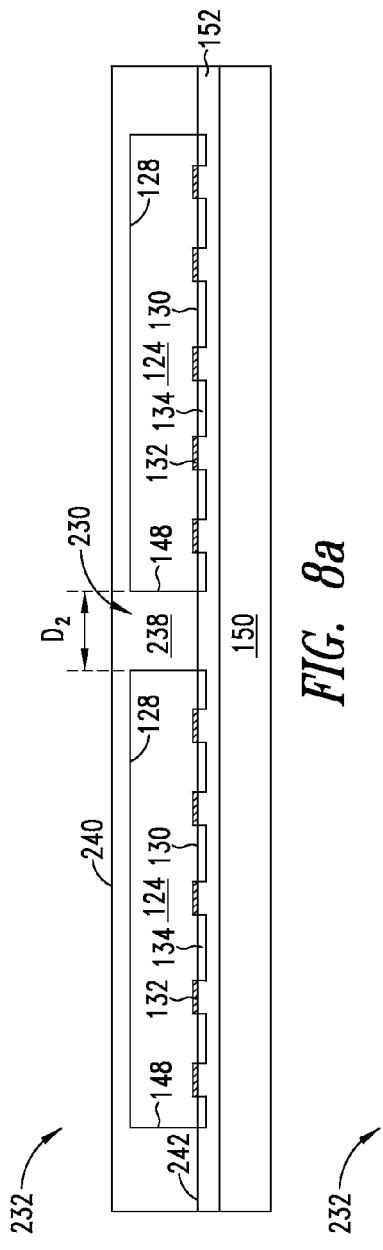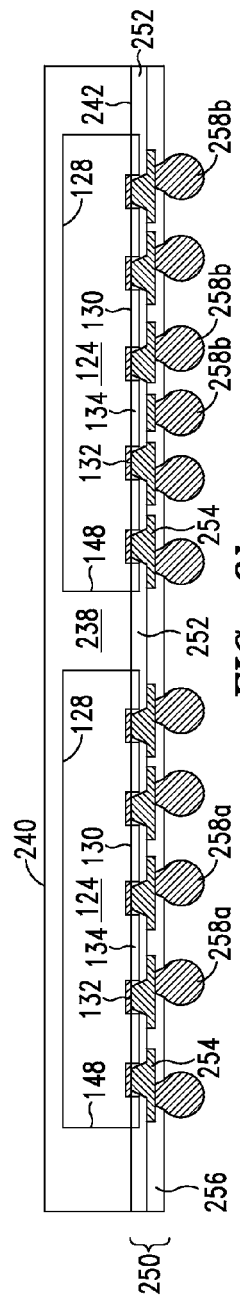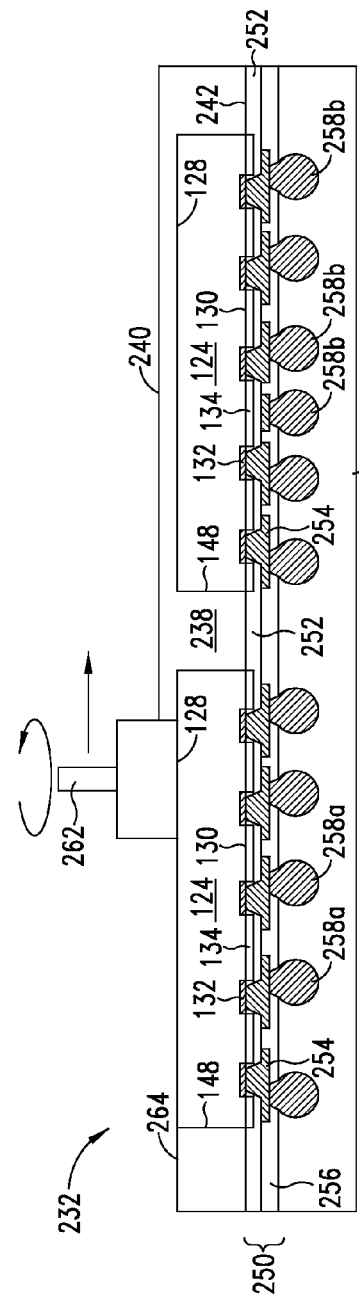

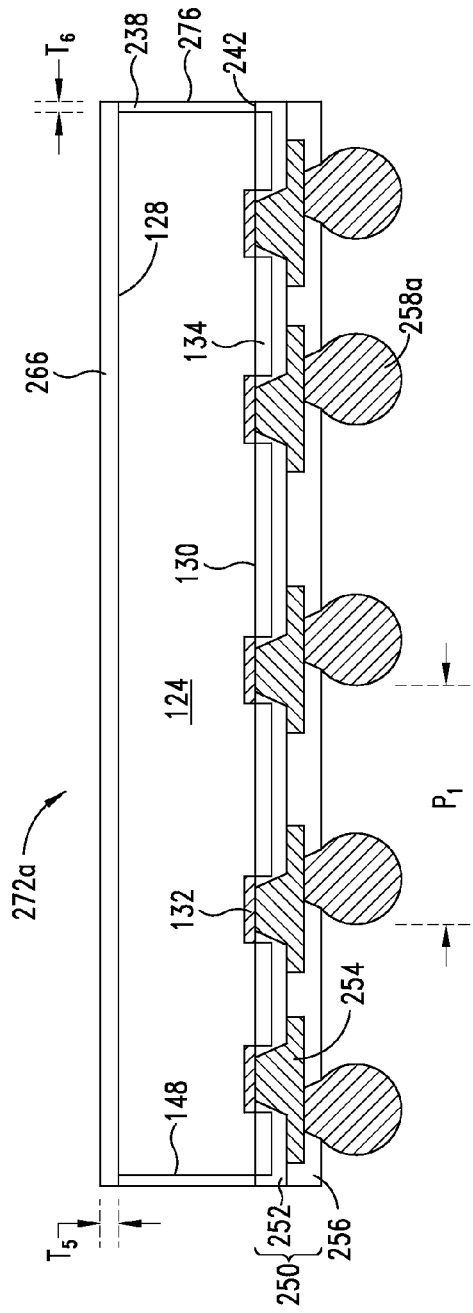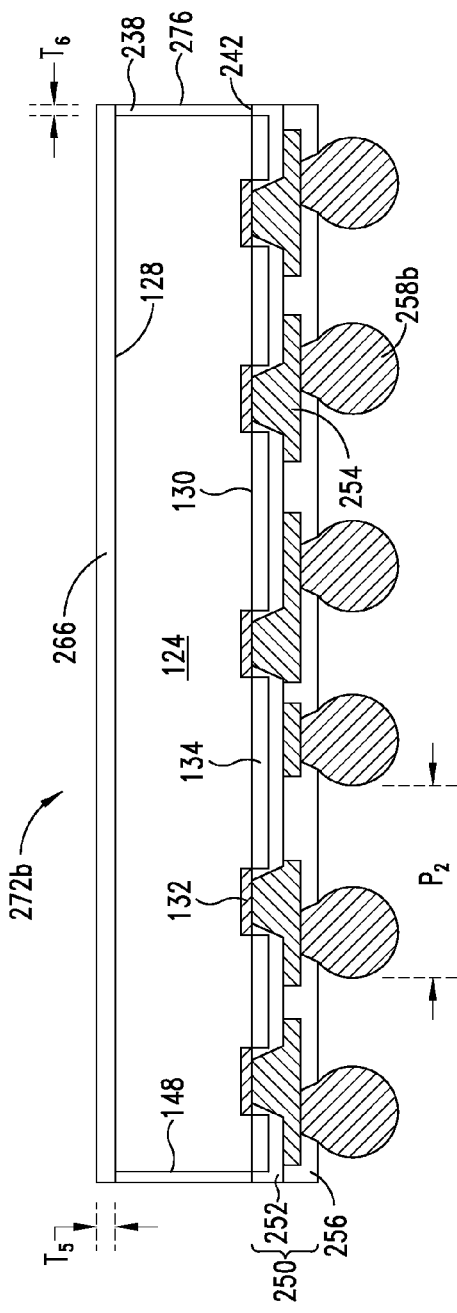
FIG. 8f
FIG. 8g

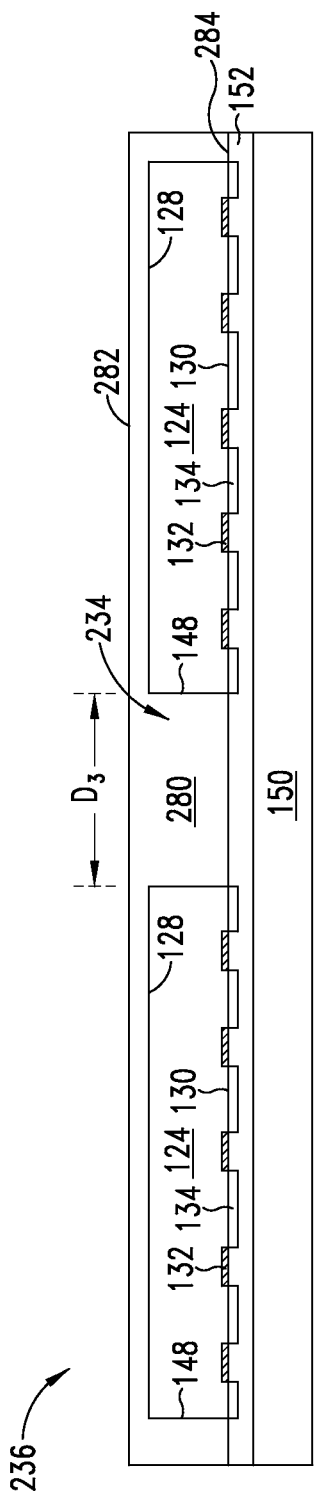
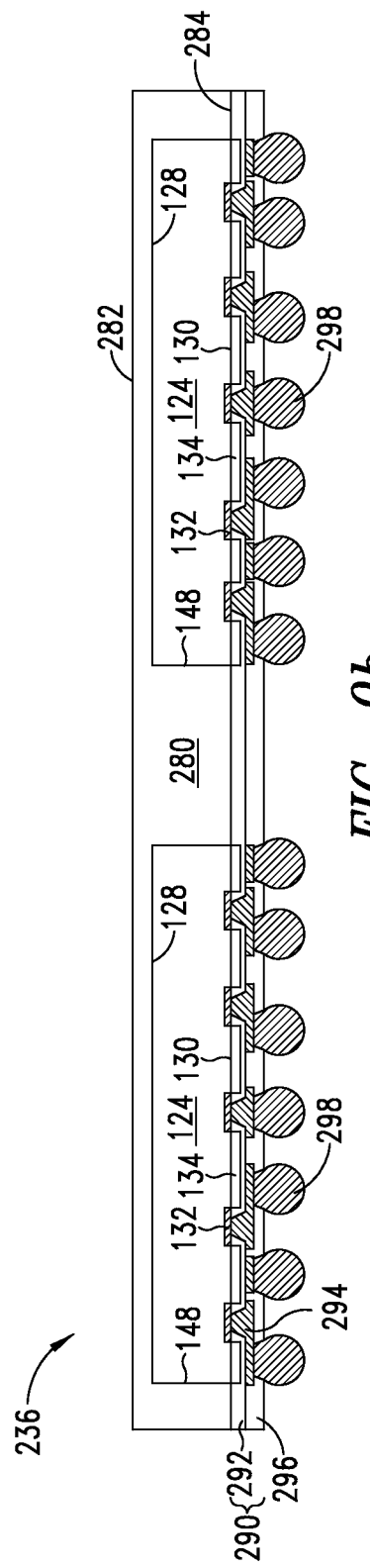

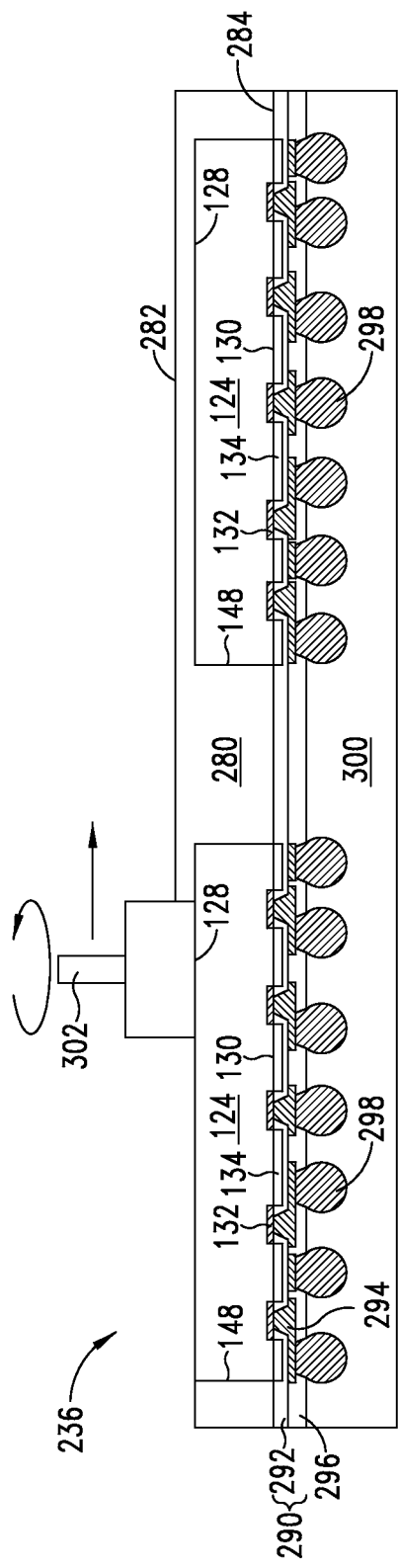
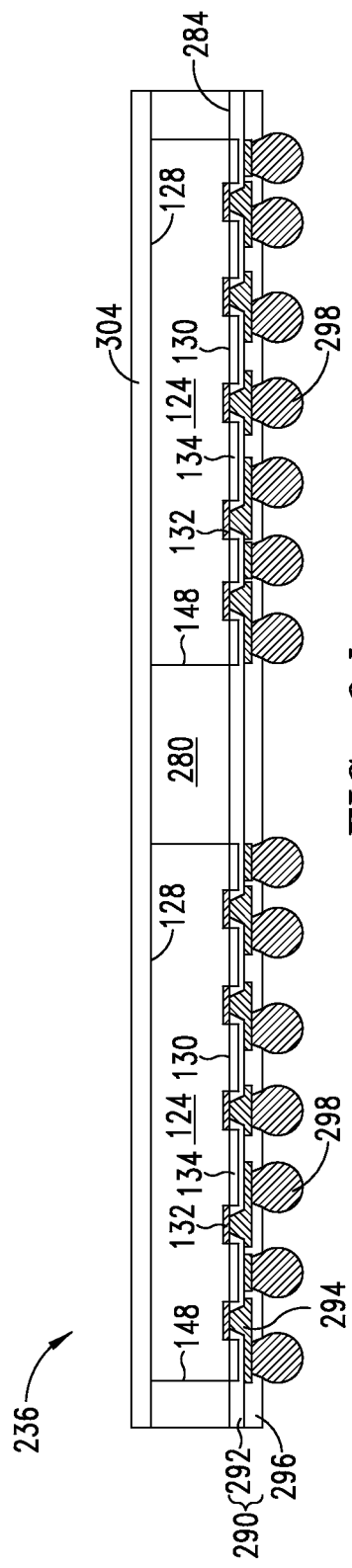

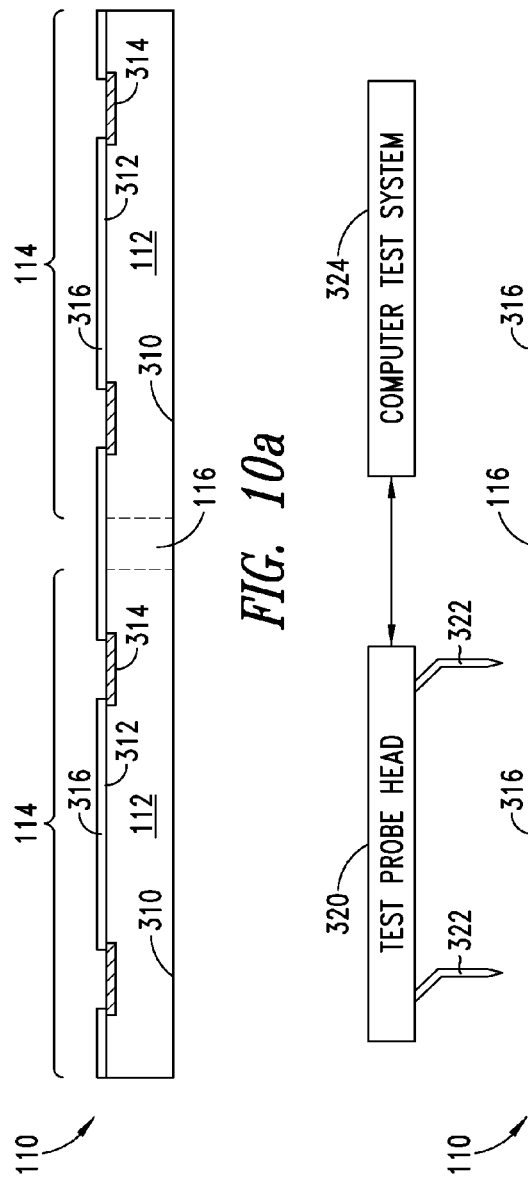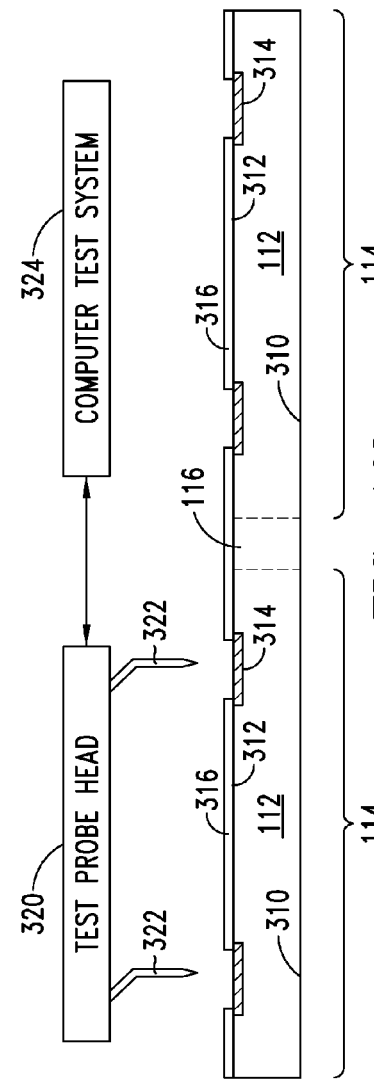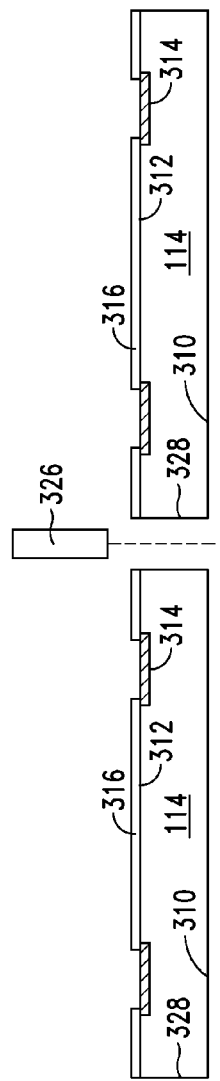

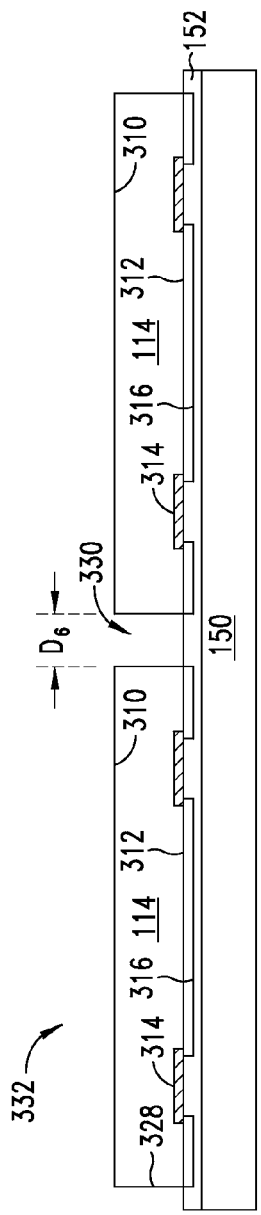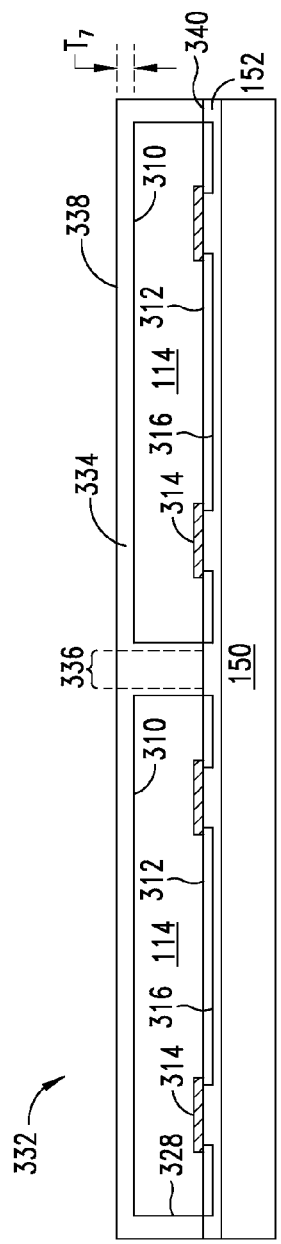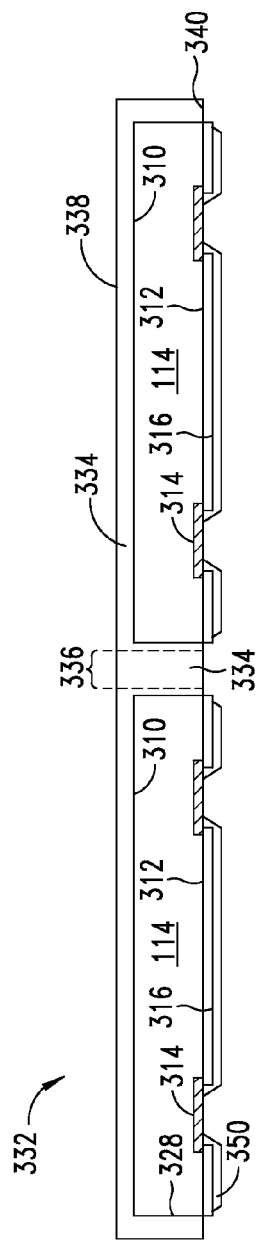

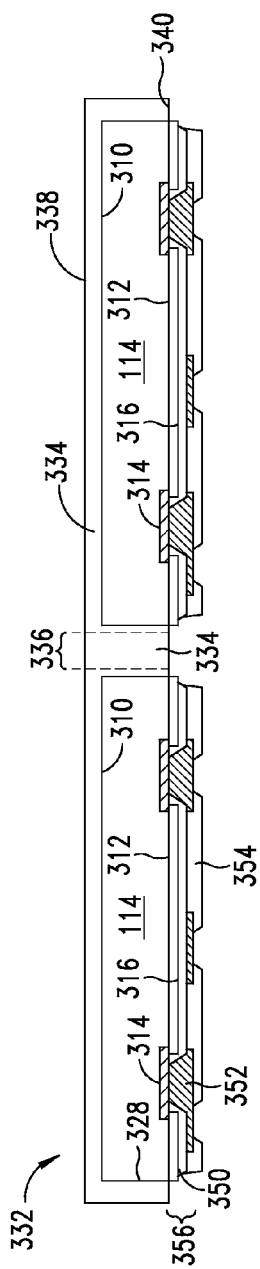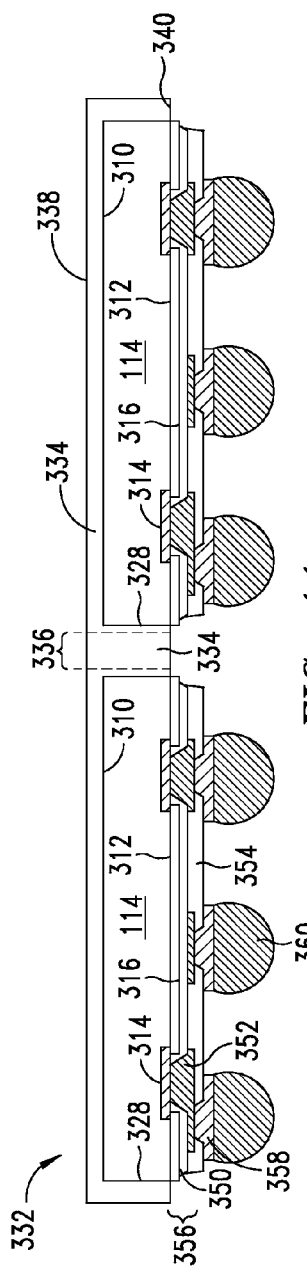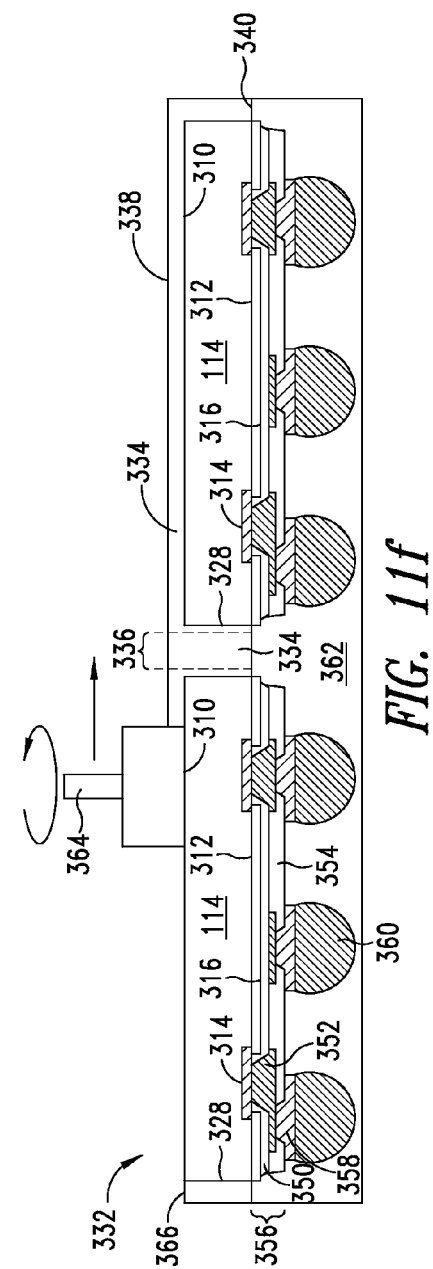

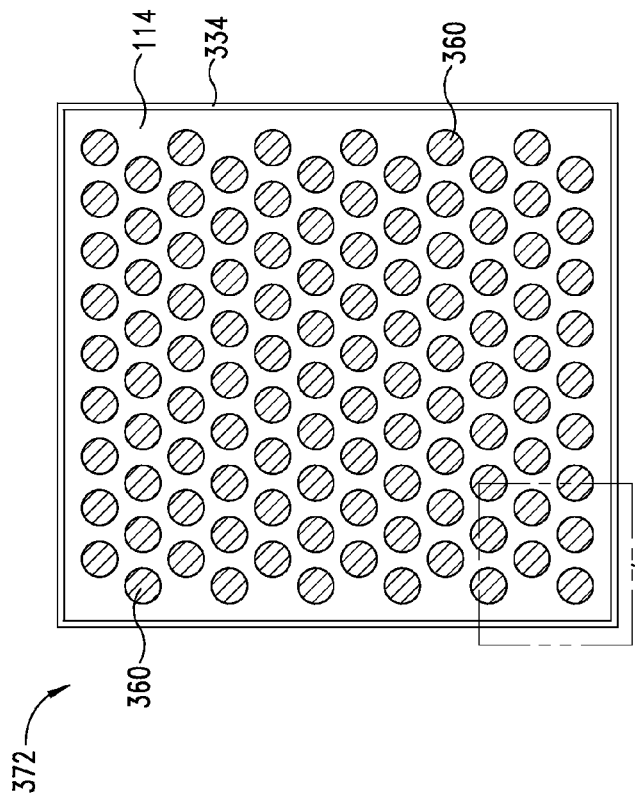
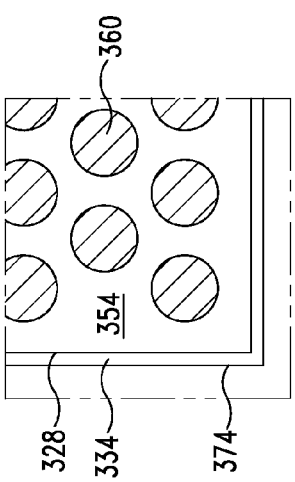
FIG. 12a
FIG. 12b

US 9,704,769 B2

SEMICONDUCTOR DEVICE AND METHOD OF FORMING ENCAPSULATED WAFER LEVEL CHIP SCALE PACKAGE (EWLCSP)

CLAIM OF DOMESTIC PRIORITY

The present application claims the benefit of U.S. Provisional Application No. 61/945,739, filed Feb. 27, 2014, which application is incorporated herein by reference.

FIELD OF THE INVENTION

The present invention relates in general to semiconductor devices and, more particularly, to a semiconductor device and method of forming embedded or encapsulated wafer level chip scale packages (eWLCSP).

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, and various signal processing circuits.

Semiconductor devices perform a wide range of functions such as signal processing, high-speed calculations, transmitting and receiving electromagnetic signals, controlling electronic devices, transforming sunlight to electricity, and creating visual images for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The structure of semiconductor material allows the material's electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed operations and other useful functions.

Semiconductor devices are generally manufactured using two complex manufacturing processes, i.e., front-end manufacturing and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support, electrical interconnect, and environmental isolation. The term "semiconductor die" as used herein refers to both the singular and plural form of the words, and accordingly, can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

One approach to achieving smaller semiconductor devices is the wafer level chip scale package (WLCSP). A conventional semiconductor wafer typically contains a plurality of semiconductor die separated by a saw street. An interconnect structure can be formed over the surface of the semiconductor wafer. The semiconductor wafer is processed by applying polymers, such as polyimide (PI) or polybenzoxazole (PBO), and redistribution layers to the wafer prior to singulation into WLCSP. PI has a typical curing temperature of 380 degrees Celsius (° C.) and PBO has a typical curing temperature of 300° C. PI and PBO are unsuitable for using in manufacturing processes with temperature tolerances lower than, for example, 300° C. After singulation of the semiconductor wafer into WLCSP, the bare silicon of the semiconductor die is exposed on the remaining sidewalls and back side. The fragile nature of exposed silicon in WLCSP devices is a concern in surface mount technology (SMT) assembly processes. The semiconductor die is subject to damage or degradation if a portion of the semiconductor die is exposed to external elements, particularly when surface mounting the die. For example, the semiconductor die can be damaged or degraded during handling or by exposure to light. Damage to the exposed silicon remains a problem for WLCSP and for advanced node products with fragile dielectric layers. Semiconductor die are also subject to damage during singulation of semiconductor wafers through the silicon or semiconductor material and into individual WLCSP. Singulation through semiconductor material can cause cracking or chipping of the semiconductor die. Testing of singulated WLCSP involves high cost and long testing time due to the handling of individual packages.

An important aspect of semiconductor manufacturing is high yield and corresponding low cost. The yield of a WLCSP process is limited by the nature of processing an incoming semiconductor wafer, which typically contains a number of semiconductor die having defects. In a WLCSP process, the defective semiconductor die are processed together with the functional semiconductor die on the semiconductor wafer. After processing and singulation into WLCSP, the WLCSP containing defective semiconductor die are discarded. Thus, the number of functional semiconductor die on the incoming semiconductor wafer limits the achievable yield from a WLCSP process. For example, an incoming wafer with 15% defective semiconductor die results in a maximum yield of 85% of functional WLCSP. Thus, the wafer-level processing of WLCSP inherently includes waste in processing defective semiconductor die, which increases the unit cost of manufacturing WLCSPs.

Semiconductor wafers are fabricated having various diameters and semiconductor die sizes and quantities. Semiconductor packaging equipment is typically developed according to each particular incoming semiconductor wafer size or semiconductor die quantity or size. For example, a 200 millimeter (mm) wafer is processed using 200 mm equipment, and a 300 mm wafer is processed using 300 mm equipment. Equipment for packaging semiconductor devices is limited in processing capability to the specific semiconductor wafer size or semiconductor die quantity and size for which the equipment is designed. As incoming semiconductor wafer sizes and semiconductor die sizes change, additional investment in manufacturing equipment is necessary. For example, smaller semiconductor die typically also have smaller, more advanced nodes. WLCSP processes are limited in the size of semiconductor die and node technology that can be processed into a WLCSP. In particular, advanced node semiconductor die may fall outside the design limits of WLCSP. When the design limits of WLCSP are exceeded, the design is conventionally changed over to a different package type, such as leadframe-based or substrate-based package types. A change to the fundamental design of the package may have a substantial impact on device footprint, form factor, and performance characteristics. Significant re-design of a package, such as changing to a different package type, also increases overall cost of manufacturing the semiconductor device. Investment in equipment for a specific size of semiconductor die, size of semiconductor wafer, or quantity of semiconductor die creates capital investment risk for semiconductor device manufacturers. As incoming semiconductor wafer sizes change, wafer-specific equipment becomes obsolete. Similarly, carriers and equipment designed for specific sizes and quantities of semiconductor die can become obsolete, because the carriers are limited in capability to handle different sizes and quantities of semiconductor die. Constant development and implementation of different equipment to accommodate changing wafer and die sizes increases the cost of manufacturing semiconductor devices.

SUMMARY OF THE INVENTION

A need exists for a method of manufacturing lower-cost WLCSP by reducing damage to the semiconductor die and increasing yield. Accordingly, in one embodiment, the present invention is a method of making a semiconductor device comprising the steps of providing semiconductor die, depositing an encapsulant around the semiconductor die, forming an interconnect structure over the semiconductor die while leaving the encapsulant devoid of the interconnect structure, and forming a protection layer over a non-active surface of the semiconductor die.

In another embodiment, the present invention is a method of making a semiconductor device comprising the steps of providing semiconductor die, depositing an encapsulant around the semiconductor die, forming a fan-in interconnect structure over the semiconductor die, and forming a protection layer over the semiconductor die.

In another embodiment, the present invention is a semiconductor device comprising a semiconductor die and an encapsulant deposited around the semiconductor die. A fan-in interconnect structure is formed over the semiconductor die. A protection layer formed over the encapsulant and semiconductor die.

In another embodiment, the present invention is a semiconductor device comprising a semiconductor die and an encapsulant deposited around the semiconductor die. An interconnect structure is formed over the semiconductor die. A protection layer is formed over the semiconductor die.

BRIEF DESCRIPTION OF THE DRAWINGS

FIGS. 2a-2d illustrate a semiconductor wafer with a plurality of semiconductor die separated by a saw street;

FIGS. 3a-3i illustrate a method of forming an eWLCSP with a thin backside encapsulant layer and thin sidewall encapsulation;

FIGS. 5a-5e illustrate a method of forming an eWLCSP with thin sidewall encapsulation and exposed back surface of a semiconductor die;

FIGS. 6a-6d illustrate a method of forming an eWLCSP with thin sidewall encapsulation and a backside protection layer;

FIGS. 7a-7b illustrate a method of forming high density reconstituted panels on a standardized carrier;

FIGS. 8a-8g illustrate a method of using a standardized carrier to form a plurality of eWLCSP on a high density reconstituted panel;

FIGS. 9a-9f illustrate another method of using a standardized carrier to form a plurality of eWLCSP on a high density reconstituted panel;

FIGS. 10a-10c illustrate an alternative semiconductor wafer with a plurality of semiconductor die separated by a saw street;

FIGS. 11a-11i illustrate a method of forming a fan-in eWLCSP with a backside protection layer;

FIG. 12a-12b illustrate a plan view of an eWLCSP;

DETAILED DESCRIPTION OF THE DRAWINGS

Figure 1:
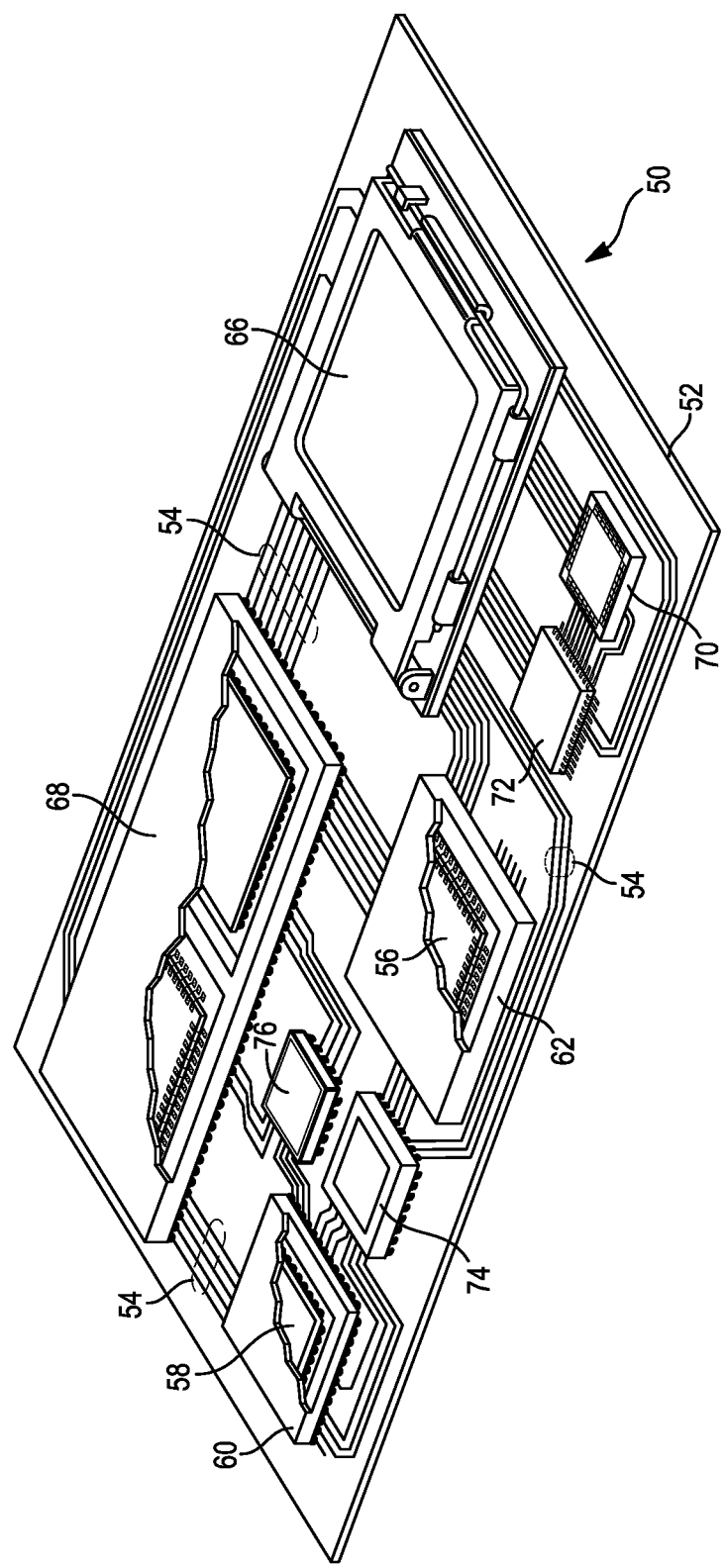
FIG. 1 illustrates a printed circuit board (PCB) with different types of packages mounted to a surface of the PCB.

The present invention is described in one or more embodiments in the following description with reference to the figures, in which like numerals represent the same or similar elements. While the invention is described in terms of the best mode for achieving objectives of the invention, those skilled in the art will appreciate that the disclosure is intended to cover alternatives, modifications, and equivalents as may be included within the spirit and scope of the invention as defined by the appended claims and claims equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices by dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or PCB 52 with a plurality of semiconductor packages mounted on a surface of PCB 52. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a tablet, cellular phone, digital camera, or other electronic device. Alternatively, electronic device 50 can be a graphics card, network interface card, or other signal processing card that can be inserted into a computer. The semiconductor package can include microprocessors, memories, application specific integrated circuits (ASIC), microelectromechanical systems (MEMS), logic circuits, analog circuits, radio frequency (RF) circuits, discrete devices, or other semiconductor die or electrical components. Miniaturization and weight reduction are essential for the products to be accepted by the market. The distance between semiconductor devices may be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, land grid array (LGA) 66, multi-chip module (MCM) 68, quad flat non-leaded package (QFN) 70, quad flat package 72, embedded wafer level ball grid array (eWLB) 74, and WLCSP 76 are shown mounted on PCB 52. In one embodiment, eWLB 74 is a fan-out wafer level package (Fo-WLP) and WLCSP 76 is a fan-in wafer level package (Fi-WLP). Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

Figure 2A:
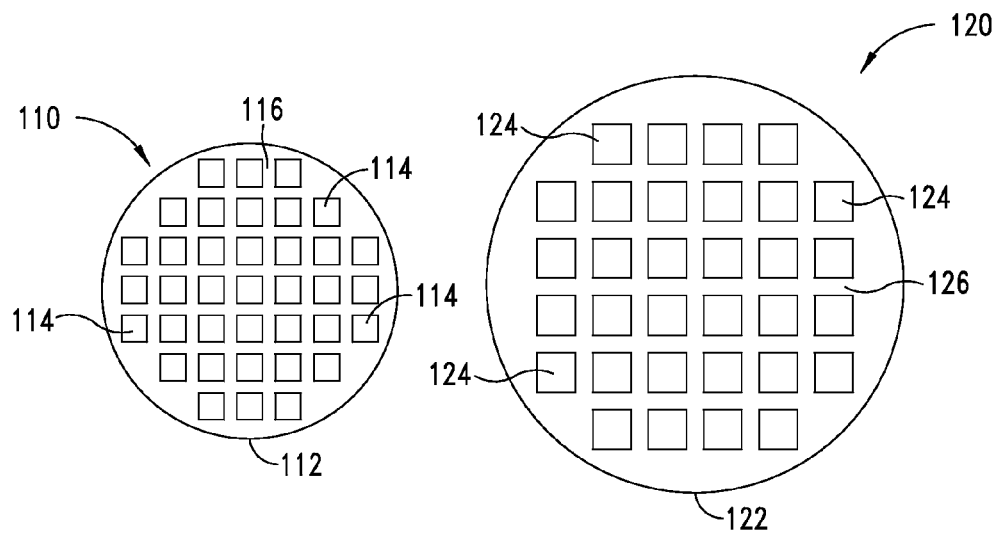

FIG. 2a shows a semiconductor wafer 110 with a base substrate material 112, such as silicon, germanium, aluminum phosphide, aluminum arsenide, gallium arsenide, gallium nitride, indium phosphide, silicon carbide, or other bulk semiconductor material for structural support. A plurality of semiconductor die or components 114 is formed on wafer 110 separated by a non-active, inter-die wafer area or saw street 116 as described above. Saw street 116 provides cutting areas to singulate semiconductor wafer 110 into individual semiconductor die 114. In one embodiment, semiconductor wafer 110 has a width or diameter of 100-450 mm. Semiconductor wafer 110 has any diameter prior to singulating semiconductor wafer into individual semiconductor die 114. Semiconductor die 114 may have any size, and in one embodiment, semiconductor die 114 includes dimensions of 2.5 mm by 2.5 mm. In another embodiment, semiconductor die 114 includes dimensions of 6 mm by 6 mm.

FIG. 2a further shows a semiconductor wafer 120 with a base substrate material 122, such as silicon, germanium, aluminum phosphide, aluminum arsenide, gallium arsenide, gallium nitride, indium phosphide, silicon carbide, or other bulk semiconductor material for structural support. A plurality of semiconductor die or components 124 is formed on wafer 120 separated by a non-active, inter-die wafer area or saw street 126 as described above. Saw street 126 provides cutting areas to singulate semiconductor wafer 120 into individual semiconductor die 124. Semiconductor wafer 120 may have the same diameter or a different diameter from semiconductor wafer 110. In one embodiment, semiconductor wafer 120 has a width or diameter of 100-450 mm. Semiconductor wafer 120 has any diameter prior to singulating semiconductor wafer into individual semiconductor die 124. Semiconductor die 124 have the same size or a different size from semiconductor die 114. Semiconductor die 124 may have any size, and in one embodiment, semiconductor die 124 include dimensions of 4.5 mm by 4.5 mm.

Figure 2B:
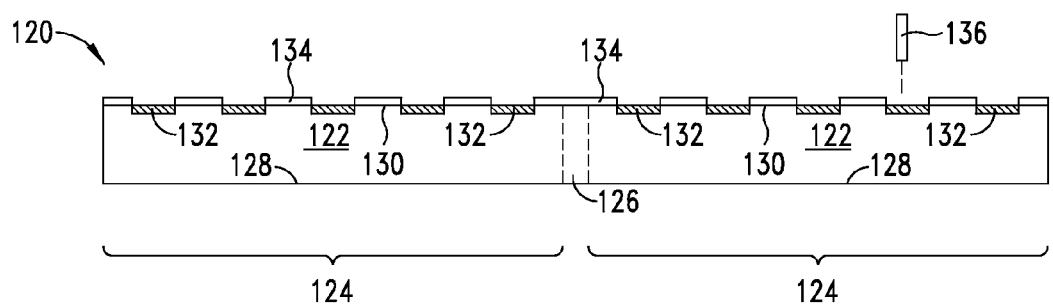

FIG. 2b shows a cross-sectional view of a portion of semiconductor wafer 120. Each semiconductor die 124 has a back or non-active surface 128 and an active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, MEMS, memory, or other signal processing circuit. In one embodiment, active surface 130 contains a MEMS, such as an accelerometer, strain gauge, microphone, or other sensor responsive to various external stimuli. Semiconductor die 124 may also contain integrated passive devices (IPDs), such as inductors, capacitors, and resistors, for RF signal processing. Back surface 128 of semiconductor wafer 120 may undergo an optional backgrinding operation with a mechanical grinding or etching process to remove a portion of base material 122 and reduce the thickness of semiconductor wafer 120 and semiconductor die 124.

An electrically conductive layer 132 is formed over active surface 130 using PVD, CVD, electrolytic plating, electroless plating process, or other suitable metal deposition process. Conductive layer 132 can be one or more layers of aluminum (Al), copper (Cu), tin (Sn), nickel (Ni), gold (Au), silver (Ag), titanium (Ti), or other suitable electrically conductive material. Conductive layer 132 operates as contact pads electrically connected to the circuits on active surface 130. Conductive layer 132 can be formed as contact pads disposed side-by-side a first distance from the edge of semiconductor die 124, as shown in FIG. 2b. Alternatively, conductive layer 132 can be formed as contact pads that are offset in multiple rows such that a first row of contact pads is disposed a first distance from the edge of the die, and a second row of contact pads alternating with the first row is disposed a second distance from the edge of the die.

A first insulating or passivation layer 134 is formed over semiconductor die 124 and conductive layer 132 using PVD, CVD, printing, spin coating, spray coating, sintering or thermal oxidation. Insulating layer 134 contains one or more layers of silicon dioxide (SiO2), silicon nitride (Si3N4), silicon oxynitride (SiON), tantalum pentoxide (Ta2O5), aluminum oxide (Al2O3), hafnium oxide (HfO2), benzocyclobutene (BCB), PI, PBO, or other polymer or dielectric material having similar structural and insulating properties. A portion of insulating layer 134 is removed by laser direct ablation (LDA) using laser 136 or an etching process through a patterned photoresist layer to expose conductive layer 132 and provide for subsequent electrical interconnect.

Semiconductor wafer 120 undergoes electrical testing and inspection as part of a quality control process. Manual visual inspection and automated optical systems are used to perform inspections on semiconductor wafer 120. Software can be used in the automated optical analysis of semiconductor wafer 120. Visual inspection methods may employ equipment such as a scanning electron microscope, high-intensity or ultra-violet light, or metallurgical microscope. Semiconductor wafer 120 is inspected for structural characteristics including warpage, thickness variation, surface particulates, irregularities, cracks, delamination, and discoloration.

Figure 2C:
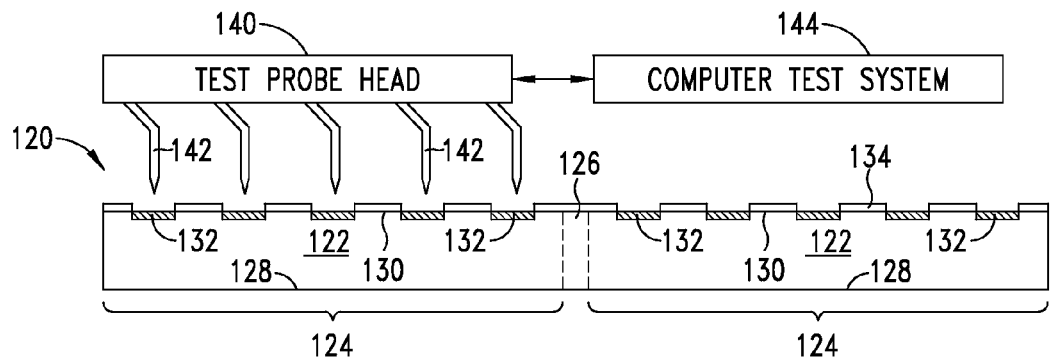

The active and passive components within semiconductor die 124 undergo testing at the wafer level for electrical performance and circuit function. Each semiconductor die 124 is tested for functionality and electrical parameters, as shown in FIG. 2c, using a test probe head 140 including a plurality of probes or test leads 142, or other testing device. Probes 142 are used to make electrical contact with nodes or conductive layer 132 on each semiconductor die 124 and provide electrical stimuli to contact pads 132. Semiconductor die 124 responds to the electrical stimuli, which is measured by computer test system 144 and compared to an expected response to test functionality of the semiconductor die. The electrical tests may include circuit functionality, lead integrity, resistivity, continuity, reliability, junction depth, electro-static discharge (ESD), RF performance, drive current, threshold current, leakage current, and operational parameters specific to the component type. The inspection and electrical testing of semiconductor wafer 120 enables semiconductor die 124 that pass to be designated as known good die (KGD) for use in a semiconductor package.

In FIG. 2d, semiconductor wafer 120 is singulated through saw street 126 using a saw blade or laser cutting tool 146 into individual semiconductor die 124. After singulation, side surfaces or sidewalls 148 of semiconductor die 124 are exposed. The individual semiconductor die 124 can be inspected and electrically tested for identification of KGD post singulation.

FIGS. 3a-3i illustrate, in relation to FIGS. 1 and 2a-2d, a process of forming a fan-in eWLCSP. FIG. 3a shows a cross-sectional view of a portion of a carrier or temporary substrate 150 containing sacrificial base material such as silicon, polymer, beryllium oxide, glass, metal, or other suitable low-cost, rigid material for structural support. An interface layer or double-sided tape 152 is formed over carrier 150 as a temporary adhesive bonding film, etch-stop layer, or thermal release layer. In one embodiment, carrier 150 includes a metal, and interface layer 152 includes an adhesive foil laminated onto carrier 150.

Carrier 150 can be a round or rectangular panel (300 mm or greater) with capacity for multiple semiconductor die 124. Carrier 150 may have a larger surface area than the surface area of semiconductor wafer 120. A larger carrier reduces the manufacturing cost of the semiconductor package as more semiconductor die can be processed on the larger carrier thereby reducing the cost per unit. Semiconductor packaging and processing equipment are designed and configured for the size of the wafer or carrier being processed.

To further reduce manufacturing costs, the size of carrier 150 is selected independent of the size of semiconductor die 124 or size of semiconductor wafer 120. That is, carrier 150 has a fixed or standardized size, which can accommodate various size semiconductor die 124 singulated from one or more semiconductor wafers 120. In one embodiment, carrier 150 is circular with a diameter of approximately 300 mm. In another embodiment, carrier 150 is rectangular with a width of 560 mm and length of 600 mm. The larger surface area of carrier 150 accommodates more semiconductor die 124 and lowers manufacturing cost as more semiconductor die 124 are processed per reconstituted panel 156. Semiconductor die 124 may have dimensions of 4.5 mm by 4.5 mm, which are placed on the standardized carrier 150. In another embodiment, semiconductor die 124 may have dimensions of 2.5 mm by 2.5 mm, which are placed on the same standardized carrier 150. Accordingly, standardized carrier 150 can handle any size semiconductor die 124, which allows subsequent semiconductor processing equipment to be standardized to a common carrier, i.e., independent of die size or incoming wafer size. Semiconductor packaging equipment can be designed and configured for a standard carrier using a common set of processing tools, equipment, and bill of materials to process any semiconductor die size from any incoming wafer size. The common or standardized carrier 150 lowers manufacturing costs and capital risk by reducing or eliminating the need for specialized semiconductor processing lines based on die size or incoming wafer size. By selecting a predetermined carrier size to use for any size semiconductor die from all semiconductor wafer sizes, a flexible manufacturing line can be implemented.

In FIG. 3a, semiconductor die 124 from FIG. 2d are mounted to interface layer 152 and over carrier 150 using, for example, a pick and place operation with active surface 130 oriented toward the carrier. Semiconductor die 124 are placed onto carrier 150 separated by a gap 154 with a distance $D_1$ between adjacent semiconductor die 124. Distance $D_1$ between semiconductor die 124 is selected based on the design and specifications of the semiconductor package to be processed. Gap 154 or distance $D_1$ between semiconductor die 124 allows for a thin protective layer of encapsulant to remain over sidewalls 148 after singulation. In one embodiment, distance $D_1$ is sufficient to provide sidewall coverage by an encapsulant plus a saw street area for singulation. For example, to produce 30 micrometers (μm) of sidewall coverage for each semiconductor die 124 and to provide an 80 μm saw street for singulation, the distance $D_1$ of gap 154 is selected to be approximately 140 μm. In another embodiment, distance $D_1$ between semiconductor die 124 is 100 μm or less. In yet another embodiment, distance $D_1$ between semiconductor die 124 is greater than approximately 100 μm. Distance $D_1$ of gap 154 between semiconductor die 124 on carrier 150 is optimized for manufacturing the semiconductor packages at the lowest unit cost.

FIG. 3a shows semiconductor die 124 disposed over interface layer 152 of carrier 150 as reconstituted panel or reconfigured wafer 156. Reconstituted wafer or panel 156 can be processed into many types of semiconductor packages, including eWLB, fan-in WLCSP, eWLCSP, fan-out WLCSP, flipchip packages, three dimensional (3D) packages, package-on-package (PoP), or other semiconductor packages. Semiconductor die 124 are selected from KGD, which are singulated from one or more semiconductor wafers 120 and mounted to carrier 150. The use of KGD in reconstituted wafer 156 improves the yield of the resulting semiconductor packages, thereby reducing the package cost.

Carrier 150 further reduces manufacturing costs because standardized processing equipment can be used to process any configuration of semiconductor die on carrier 150. Reconstituted panel 156 is configured according to the specifications of the resulting semiconductor package. The number of semiconductor die 124 disposed over carrier 150 depends on the size of semiconductor die 124 and distance $D_1$ between semiconductor die 124 within reconstituted wafer 156. In one embodiment, semiconductor die 124 are placed on carrier 150 in a high-density arrangement, i.e., a distance $D_1$ of 300 μm or less, for processing fan-in devices. The number of semiconductor die 124 mounted to carrier 150 can be greater than, less than, or equal to the number of semiconductor die 124 singulated from a semiconductor wafer 120. Carrier 150 accommodates different quantities and sizes of semiconductor die as well as different distances between semiconductor die. Accordingly, carrier 150 is independent of the size of semiconductor wafer 120, the size of semiconductor die 124, the quantity of semiconductor die 124 singulated from semiconductor wafer 120, and the final package type. Carrier 150 and reconstituted panel 156 provide the flexibility to manufacture many different types of semiconductor packages with different size semiconductor die 124 from different size semiconductor wafers 120 using standardized equipment.

In FIG. 3b, an encapsulant or molding compound 158 is deposited over semiconductor die 124 and carrier 150 as an insulating material using a paste printing, compressive molding, transfer molding, liquid encapsulant molding, vacuum lamination, spin coating, or other suitable applicator. Encapsulant 158 includes polymer composite material, such as epoxy resin with filler, epoxy acrylate with filler, or polymer with proper filler. Encapsulant 158 is non-conductive and environmentally protects the semiconductor device from external elements and contaminants. In one embodiment, encapsulant 158 includes an opaque material and is dark or black in color to provide protection of semiconductor die 124 from light and to prevent soft errors by attenuating photon injection.

Encapsulant 158 is deposited into gap 154 and covers sidewalls 148 of semiconductor die 124, while active surface 130 is oriented toward carrier 150 and remains protected. Encapsulant 158 is deposited over back surface 128 of semiconductor die 124 with a deposited thickness $T_1$, which is measured from back surface 128 of semiconductor die 124 to back surface 160 of encapsulant 158. In one embodiment, the deposited thickness $T_1$ of encapsulant 158 over back surface 128 of semiconductor die 124 is approximately 100 μm or greater. In another embodiment, deposited thickness $T_1$ of encapsulant 158 over back surface 128 of semiconductor die 124 is approximately 105 μm. Encapsulant 158 contacts interface layer 152 such that surface 162 of encapsulant 158, opposite back surface 160, is formed coplanar with active surface 130 of semiconductor die 124.

In FIG. 3c, temporary carrier 150 and interface layer 152 are removed by chemical etching, mechanical peel-off, chemical mechanical planarization (CMP), mechanical grinding, thermal bake, laser scanning, or wet stripping. Temporary carrier 150 and interface layer 152 are removed from over surface 162 of encapsulant 158 and active surface 130 of semiconductor die 124 to expose conductive layer 132, insulating layer 134, and surface 162 of encapsulant 158.

An insulating or passivation layer 170 is formed over insulating layer 134 and conductive layer 132 using PVD, CVD, printing, spin coating, spray coating, sintering or thermal oxidation. Insulating layer 170 can be one or more layers of $SiO_2$, $Si_3N_4$, SiON, $Ta_2O_5$, $Al_2O_3$, BCB, epoxy based photosensitive polymer dielectric, low temperature (≤200° C.) curable polymer, or other material having similar insulating and structural properties. In one embodiment, insulating layer 170 includes a low temperature curing photosensitive dielectric polymer with or without insulating fillers cured at less than 200° C. Insulating layer 170 is formed over active surface 130 of semiconductor die 124 and surface 162 of encapsulant 158. A portion of insulating layer 170 is removed by an etching process with a patterned photoresist layer or by LDA to expose conductive layer 132 with respect to insulating layer 170. In another embodiment, a portion of insulating layer 170 is also removed from over encapsulant 158 such that surface 162 of encapsulant 158 is exposed and devoid of insulating layer 170. In one embodiment, insulating layer 170 includes a thickness ranging from approximately 7-11 µm.

In FIG. 3d, an electrically conductive layer 172 is formed over insulating layer 170 and contact pads 132 using a patterning and metal deposition process such as PVD, CVD, sputtering, electrolytic plating, and electroless plating. Conductive layer 172 can be one or more layers of Al, Cu, Sn, Ni, Au, Ag, or other suitable electrically conductive material. Conductive layer 172 operates as a redistribution layer (RDL) to redistribute the electrical signals of semiconductor die 124. Conductive layer 172 is formed within a footprint of semiconductor die 124 and does not extend beyond the footprint of semiconductor die 124 or over surface 162 of encapsulant 158. In other words, a peripheral region of semiconductor die 124 adjacent to semiconductor die 124 is devoid of conductive layer 172. One portion of conductive layer 172 is electrically connected to contact pads 132 of semiconductor die 124. Other portions of conductive layer 172 can be electrically common or electrically isolated depending on the design and function of the semiconductor device. In one embodiment, conductive layer 172 includes a thickness ranging from approximately 7-10 µm.

An insulating or passivation layer 174 is formed over insulating layer 170 and conductive layer 172 using PVD, CVD, printing, spin coating, spray coating, sintering or thermal oxidation. Insulating layer 174 can be one or more layers of SiO2, Si3N4, SiON, Ta2O5, Al2O3, BCB, epoxy based photosensitive polymer dielectric, low temperature (≤200° C.) curable polymer, or other material having similar insulating and structural properties. In one embodiment, insulating layer 174 includes a low temperature curing photosensitive dielectric polymer with or without insulating fillers cured at less than 200° C. Insulating layer 174 is formed over active surface 130 of semiconductor die 124 and surface 162 of encapsulant 158. A portion of insulating layer 174 is removed by an etching process with a patterned photoresist layer or by LDA to expose conductive layer 172 with respect to insulating layer 174. In another embodiment, a portion of insulating layer 174 is also removed from over encapsulant 158 such that surface 162 of encapsulant 158 is exposed and devoid of insulating layer 174. In one embodiment, insulating layer 174 includes a thickness ranging from approximately 7-11 µm.

Insulating layers 170 and 174 together with conductive layer 172 constitute a build-up interconnect structure 176. Interconnect structure 176 is formed over active surface 130 of semiconductor die 124 and surface 162 of encapsulant 158 and directly on conductive layer 132 and insulating layer 134. Interconnect structure 176 may include fewer or additional conductive and insulating layers. In one embodiment, the electrical interconnection of interconnect structure 176 remains entirely within a footprint of semiconductor die 124. A peripheral region outside a footprint of semiconductor die 124 is devoid of electrical interconnect thereby resulting in a fan-in interconnect structure 176.

In FIG. 3e, an electrically conductive bump material is deposited over conductive layer 172 of interconnect structure 176 and is electrically connected to conductive layer 132 using an evaporation, electrolytic plating, electroless plating, ball drop, or screen printing process. The bump material can be Al, Sn, Ni, Au, Ag, lead (Pb), bismuth (Bi), Cu, solder, and combinations thereof, with an optional flux solution. For example, the bump material can be eutectic Sn/Pb, high-lead solder, or lead-free solder. The bump material is bonded to conductive layer 172 using a suitable attachment or bonding process. In one embodiment, the bump material is reflowed by heating the material above its melting point to form spherical balls or bumps 178. In some applications, bumps 178 are reflowed a second time to improve electrical contact to conductive layer 172. The bumps can also be compression bonded to conductive layer 172. Bumps 178 represent one type of interconnect structure that can be formed over conductive layer 172. The interconnect structure can also use bond wires, stud bump, micro bump, or other electrical interconnect.

In FIG. 3f, reconstituted panel 156 undergoes an optional backgrinding step. A backgrinding or support tape 180 is applied over interconnect structure 176 and in contact with insulating layer 174 and bumps 178. A portion of encapsulant 158 is removed in a grinding operation with grinder 182 to planarize the surface of encapsulant 158. A chemical etch or CMP process can also be used to planarize encapsulant 158 and to remove mechanical damage resulting from the grinding operation. In one embodiment, the backgrinding operation removes a portion of encapsulant 158 from surface 160 while leaving another portion of encapsulant 158 disposed over back surface 128 of semiconductor die 124. The removal of a portion of encapsulant 158 leaves new back surface 184 of encapsulant 158. The backgrinding operation reduces a thickness of encapsulant 158 from deposited thickness $T_1$ to a reduced thickness $T_2$, which is measured from back surface 128 of semiconductor die 124 to new back surface 184 of encapsulant 158. Encapsulant 158 remaining over back surface 128 of semiconductor die 124 includes a reduced thickness $T_2$ of approximately 105 µm or less. Alternatively, reduced thickness $T_2$ is greater than approximately 100 µm. In another embodiment, the backgrinding operation completely removes encapsulant 158 from over semiconductor die 124 to expose back surface 128 of semiconductor die 124. Removing a portion of encapsulant 158 reduces warpage of reconstituted panel 156. Laser marking is applied over encapsulant 158 or directly to back surface 128 of semiconductor die 124 for alignment and singulation. Laser marking of encapsulant 158 improves the visibility of the marking. Laser marking can be performed before or after bump formation, or before or after removal of carrier 150.

In FIG. 3g, reconstituted panel 156 is singulated with saw blade or laser cutting device 190 into individual semiconductor devices or eWLCSP 192. Reconstituted panel 156 is singulated through encapsulant 158 and through insulating layers 170 and 174 of interconnect structure 176. Singulating through encapsulant 158 removes a portion of encapsulant 158 from saw street 194 while a thin layer of encapsulant 158 remains disposed over sidewalls 148 of semiconductor die 124. eWLCSP 192 undergoes electrical testing before or after singulation. Because eWLCSP 192 are singulated through encapsulant 158, eWLCSP 192 are subject to less damage during singulation. With less risk of damage during singulation, testing can be performed prior to singulation and expensive inspection steps can be eliminated from the final testing of each eWLCSP 192. By testing prior to singulating reconstituted panel 156, eWLCSP 192 can be tested at the reconstituted wafer level. Wafer level testing reduces cost of testing by reducing the handling and testing time compared to pick and place handling and testing of singulated packages.

FIG. 3h shows a cross-sectional view of eWLCSP 192 after singulation. eWLCSP 192 includes encapsulant 158 formed over back surface 128 and sidewalls 148 of semiconductor die 124. Semiconductor die 124 is electrically connected through conductive layers 132 and 172 to bumps 178 for external interconnect through interconnect structure 176. Conductive layer 174 of interconnect structure 176 and bumps 178 remain within a footprint of semiconductor die 124 to form a fan-in package. Insulating layer 170 is formed over insulating layer 134 of semiconductor die 124 and over encapsulant 158 to cover the interface between semiconductor die 124 and encapsulant 158 and to protect the interface during processing and improve the reliability of eWLCSP 192. In another embodiment, interconnect structure 176 is formed completely within a footprint of semiconductor die 124.

Encapsulant 158 remains over sidewalls 148 and back surface 128 for mechanical protection of semiconductor die 124 and protection from light or other emissions. Encapsulant 158 is disposed over back surface 128 of semiconductor die 124 after an optional grinding operation. Encapsulant 158 operates as a backside protection layer for semiconductor die 124. A thin layer of encapsulant 158 remains disposed over sidewalls 148 of semiconductor die 124 after singulation. Encapsulant 158 over sidewalls 148 has a thickness $T_3$ of less than approximately 100 μm. Therefore, encapsulant 158 is disposed over five sides of semiconductor die 124, i.e., over four side surfaces 148 and over back surface 128.

FIG. 3i shows an enlarged cross-sectional view of a portion of eWLCSP 192 from FIG. 3h. Encapsulant 158 over back surface 128 of semiconductor die 124 includes a reduced thickness $T_2$ of approximately 105 μm or less. Semiconductor die 124 includes a height Hi, measured from active surface 130 to back surface 128. In one embodiment, a height Hi of semiconductor die 124 is approximately 350 μm or less. Encapsulant 158 over sidewalls 148 of semiconductor die 124 includes a thickness $T_3$, measured from a sidewall 148 of semiconductor die 124 to an edge 196 of eWLCSP 192. In one embodiment, encapsulant 158 over sidewalls 148 of semiconductor die 124 includes a thickness $T_3$ of approximately 70 μm or less. In another embodiment, a thickness $T_3$ of encapsulant 158 over sidewalls 148 ranges from approximately 30-50 μm. In one embodiment, thickness $T_2$ of encapsulant 158 over back surface 128 of semiconductor die 124 is greater than thickness $T_3$ of encapsulant 158 over sidewalls 148 of semiconductor die 124.

Encapsulant 158 disposed over sidewalls 148 and back surface 128 increases the strength of semiconductor die 124 by providing mechanical protection during package assembly and singulation operations and during surface mounting and end use of eWLCSP 192. Encapsulant 158 over sidewalls 148 mitigates cracking and chipping of semiconductor die 124 within eWLCSP 192. Encapsulant 158 further protects semiconductor die 124 from degradation due to exposure to light or other emissions. The small footprint of eWLCSP 192 is similar in size to a WLCSP without sidewall protection, because thickness $T_3$ of encapsulant 158 over sidewalls 148 results in a negligible increase in package size for eWLCSP 192. In one embodiment, the package footprint size of eWLCSP 192 is within 100 μm in the x- and y-directions of a WLCSP without sidewall encapsulant. Thus, eWLCSP 192 maintains a small package size while improving the reliability of the device. Additionally, eWLCSP 192 formed on reconstituted panel 156 has shorter testing time, a greater yield, and lower manufacturing cost than standard wafer-level devices.

Figure 4:
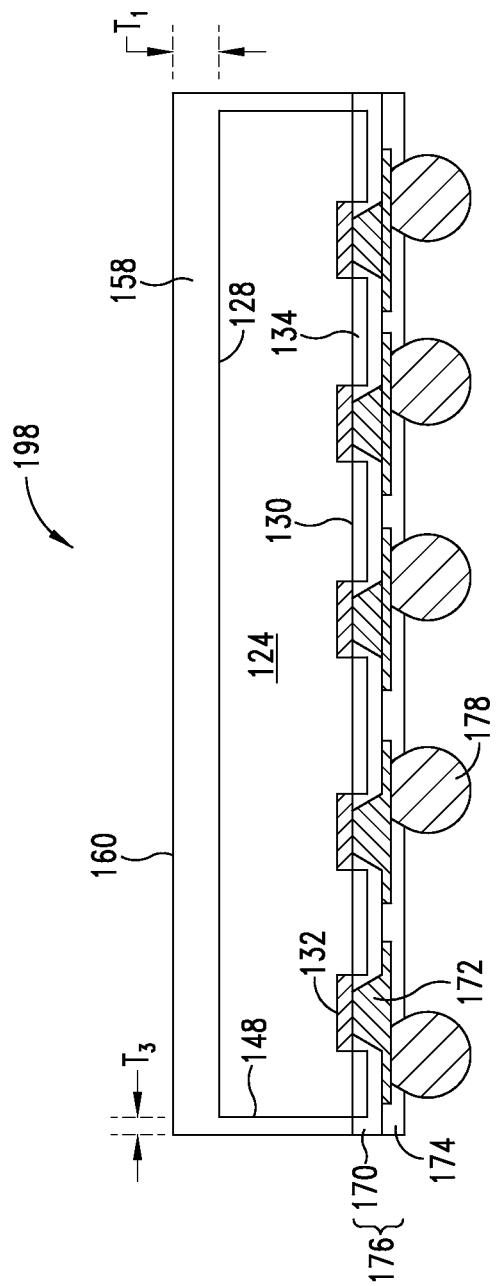
FIG. 4 illustrates an eWLCSP with a backside encapsulant layer and thin sidewall encapsulation.

FIG. 4 shows an alternative eWLCSP 198. Semiconductor die 124 includes conductive layer 132 and insulating layer 134 formed over active surface 130 with openings in insulating layer 134 formed over conductive layer 132. Encapsulant 158 is deposited over and around semiconductor die 124. Interconnect structure 176 includes conductive layer 172 and insulating layers 170 and 174 and is formed over active surface 130 of semiconductor die 124. Bumps 178 are formed over conductive layer 172 of interconnect structure 176. Semiconductor die 124 is electrically connected through conductive layers 132 and 172, to bumps 178 for external interconnect through interconnect structure 176. Conductive layer 174 of interconnect structure 176 and bumps 178 remain within a footprint of semiconductor die 124 to form a fan-in package.

Encapsulant 158 is deposited over back surface 128 of semiconductor die 124 with a deposited thickness $T_1$. Encapsulant 158 operates as a backside protection layer for semiconductor die 124. In one embodiment, a deposited thickness $T_1$ of encapsulant 158 over back surface 128 is approximately 170-230 μm or less. Where the optional backgrinding step is not used in the process of making eWLCSP 198, a deposited thickness $T_1$ of encapsulant 158 remains over back surface 128 of semiconductor die 124. Without a backgrinding step, the cost of manufacturing eWLCSP 198 is reduced. A thin layer of encapsulant 158 remains disposed over sidewalls 148 of semiconductor die 124 after singulation. Encapsulant 158 over sidewalls 148 has a thickness $T_3$ of less than approximately 100 μm. In one embodiment, encapsulant 158 over sidewalls 148 of semiconductor die 124 includes a thickness $T_3$ of approximately 70 μm or less. In another embodiment, a thickness $T_3$ of encapsulant 158 over sidewalls 148 ranges from approximately 30-50 μm. Therefore, encapsulant 158 is disposed over five sides of semiconductor die 124, i.e., over four side surfaces 148 and over back surface 128.

Encapsulant 158 disposed over sidewalls 148 and back surface 128 increases the strength of semiconductor die 124 by providing mechanical protection during the package assembly and singulation operations and during surface mounting and end use of eWLCSP 198. Encapsulant 158 over sidewalls 148 and back surface 128 mitigates cracking and chipping of semiconductor die 124 within eWLCSP 198. Encapsulant 158 further protects semiconductor die 124 from degradation due to exposure to light or other emissions. The small footprint of eWLCSP 198 is similar in size to a WLCSP without sidewall protection, because thickness $T_3$ of encapsulant 158 over sidewalls 148 results in a negligible increase in package size for eWLCSP 198. In one embodiment, the package footprint size of eWLCSP 198 is within 100 μm in the x- and y-directions of a WLCSP without sidewall encapsulant. Thus, eWLCSP 198 maintains a small package size while improving the reliability of the device. Additionally, eWLCSP 198 formed on reconstituted panel 156 has shorter testing time, a greater yield, and lower manufacturing cost than standard wafer-level devices.

FIGS. 5a-5e illustrate, in relation to FIGS. 1 and 2a-2d, an alternative process of making an eWLCSP with an exposed back surface of a semiconductor die. Continuing from FIG. 3e, FIG. 5a shows reconstituted panel 156 with semiconductor die 124 embedded in encapsulant 158 and with an interconnect structure 176 formed over active surface 130 of semiconductor die 124 and surface 162 of encapsulant 158.

In FIG. 5a, a backgrinding tape or support tape 200 is applied over interconnect structure 176 and in contact with insulating layer 174 and bumps 178. A portion of encapsulant 158 is removed in a grinding operation with grinder 202 to planarize the surface of encapsulant 158 and expose back surface 128 of semiconductor die 124. A chemical etch or CMP process can also be used to planarize encapsulant 158 and to remove mechanical damage resulting from the grinding operation. The removal of a portion of encapsulant 158 from surface 160 leaves new back surface 204 of encapsulant 158. Encapsulant 158 is completely removed from over back surface 128 of semiconductor die 124 to expose back surface 128 of semiconductor die 124. After backgrinding, a new back surface 204 of encapsulant 158 is substantially coplanar with back surface 128 of semiconductor die 124. Reconstituted panel 156 has a reduced thickness after the backgrinding operation. A thickness of semiconductor die 124 can also be reduced by the backgrinding operation. In one embodiment, a portion of back surface 128 of semiconductor die 124 is removed to thin semiconductor die 124 during the backgrinding operation. Removing a portion of encapsulant 158 reduces warpage of reconstituted panel 156. Laser marking can be applied directly to back surface 128 of semiconductor die 124 for alignment and singulation.

FIG. 5b shows reconstituted panel 156 after a backgrinding operation. Back surface 128 of semiconductor die 124 is exposed with respect to encapsulant 158. Surface 204 of encapsulant 158 is substantially coplanar with back surface 128 of semiconductor die 124.

In FIG. 5c, reconstituted panel 156 is singulated with saw blade or laser cutting device 210 into individual semiconductor devices or eWLCSP 212. Reconstituted panel 156 is singulated through encapsulant 158 and insulating layers 170 and 174 of interconnect structure 176. Singulating through encapsulant 158 removes a portion of encapsulant 158 from saw street 214 while a thin layer of encapsulant 158 remains disposed over sidewalls 148 of semiconductor die 124. eWLCSP 212 undergoes electrical testing before or after singulation. Because eWLCSP 212 are singulated through encapsulant 158, eWLCSP 212 are subject to less damage during singulation. With less risk of damage during singulation, testing can be performed prior to singulation and expensive inspection steps can be eliminated from the final testing of each eWLCSP 212. By testing prior to singulating reconstituted panel 156, eWLCSP 212 can be tested at the reconstituted wafer level. Wafer level testing reduces cost of testing by reducing the handling and testing time compared to pick and place handling and testing of singulated packages.

FIG. 5d shows a cross-sectional view of eWLCSP 212 after singulation. eWLCSP 212 includes encapsulant 158 formed over sidewalls 148 of semiconductor die 124. Semiconductor die 124 is electrically connected through conductive layers 132 and 172 to bumps 178 for external interconnect through interconnect structure 176. Conductive layer 174 of interconnect structure 176 and bumps 178 remain within a footprint of semiconductor die 124 to form a fan-in package. Insulating layer 170 is formed over insulating layer 134 of semiconductor die 124 and over encapsulant 158 to cover the interface between semiconductor die 124 and encapsulant 158 and to protect the interface during processing and improve the reliability of eWLCSP 212. In another embodiment, interconnect structure 176 is formed completely within a footprint of semiconductor die 124.

A thin layer of encapsulant 158 remains disposed over sidewalls 148 of semiconductor die 124 after singulation. Encapsulant 158 over sidewalls 148 has a thickness $T_3$ of less than approximately 100 μm. Encapsulant 158 is disposed over four sides of semiconductor die 124, i.e., over the four sidewalls 148. Encapsulant 158 remaining over sidewalls 148 provides mechanical protection for semiconductor die 124. eWLCSP 212 with an exposed back surface 128 of semiconductor die 124 has a reduced height or profile compared to devices with a backside protection layer.

FIG. 5e shows an enlarged cross-section view of a portion of eWLCSP 212 from FIG. 5d. Encapsulant 158 over sidewalls 148 of semiconductor die 124 includes a thickness $T_3$, measured from sidewall 148 of semiconductor die 124 to an edge 216 of eWLCSP 212. In one embodiment, encapsulant 158 over sidewalls 148 of semiconductor die 124 includes a thickness $T_3$ of approximately 70 μm or less. In another embodiment, a thickness $T_3$ of encapsulant 158 over sidewalls 148 ranges from approximately 30-50 μm. Encapsulant 158 disposed over sidewalls 148 increases the strength of semiconductor die 124 by providing mechanical protection during the package assembly and singulation operations and during surface mounting and end use of eWLCSP 212. Encapsulant 158 over sidewalls 148 mitigates cracking and chipping of semiconductor die 124 within eWLCSP 212. The small footprint of eWLCSP 212 is similar in size to a WLCSP without sidewall protection, because thickness $T_3$ of encapsulant 158 over sidewalls 148 results in a negligible increase in package size for eWLCSP 212. In one embodiment, the package footprint size of eWLCSP 212 is within 100 μm in the x- and y-directions of a WLCSP without sidewall encapsulant. Additionally, eWLCSP 212 formed on reconstituted panel 156 has shorter testing time, a greater yield, and lower manufacturing cost than standard wafer-level devices.

FIGS. 6a-6d illustrate, in relation to FIGS. 1 and 2a-2d, an alternative process of making an eWLCSP with a backside protection layer. Continuing from FIG. 5b, FIG. 6a shows reconstituted panel 156 after a backgrinding process. Semiconductor die 124 are embedded in encapsulant 158 and encapsulant 158 is removed from over back surface 128 of semiconductor die 124 to expose back surface 128. Reconstituted panel 156 is disposed over backgrinding tape 200 for support during the backgrinding operation. A thickness of semiconductor die 124 can also be reduced by the backgrinding operation.

In FIG. 6b, a backside protection layer 220 is formed over back surface 128 of semiconductor die 124 and surface 204 of encapsulant 158 for protection of semiconductor die 124. Backside protection layer 220 may contain one or more layers of photosensitive low curing temperature dielectric resist, photosensitive composite resist, laminate compound film, resin matrix composite sheet with filler or glass fiber cloth, resin matrix composite sheet with both filler and glass fiber cloth, insulation paste with filler, solder mask resist film, liquid molding compound, granular molding compound, polyimide, BCB, SiO2, Si3N4, SiON, Ta2O5, Al2O3, prepreg, or other dielectric material having similar insulating and structural properties. Backside protection layer 220 is deposited using spin coating, screen printing, spray coating, vacuum or pressure lamination with or without heat, transfer molding, or other suitable process. In one embodiment, backside protection layer 220 is a low temperature curing photosensitive dielectric polymer with or without insulating fillers cured at less than 200° C. In another embodiment, backside protection layer 220 is cured by ultraviolet light (UV). Alternatively, backside protection layer 220 is a metal layer, such as Cu foil, applied to a backside of reconstituted panel 156. Backside protection layer 220 contacts back surface 128 of semiconductor die 124 to transfer heat from semiconductor die 124 and improve the thermal performance of the device.

Backside protection layer 220 is formed after singulation of semiconductor wafer 120 and reconstitution of semiconductor die 124, and prior to singulation of reconstituted panel 156. In one embodiment, backside protection layer 220 includes an opaque material and is dark or black in color to provide protection of semiconductor die 124 from photons from light and other emissions to reduce soft errors. Backside protection layer 220 can be used for laser marking reconstituted panel 156 and improves visibility of marking on the back surface of the reconstituted panel 156. In another embodiment, backside protection layer 220 includes a transparent or translucent material.

For semiconductor die 124 with optical properties, such as an LED, a transparent backside protection 220 layer allows photon emission from back surface 128 of semiconductor die 124 through backside protection layer 220. In one embodiment, the base material 122 of semiconductor die 124 includes sapphire, and semiconductor die 124 includes active elements on active surface 130. In a flip-chip application, light may be emitted through backside protection layer 220 and through base material 122 of semiconductor die 124. Back surface 128 of semiconductor die 124 is coated with a translucent or transparent backside protection layer 220. The translucent or transparent backside protection layer 220 provides mechanical protection of semiconductor die 124, while allowing light transmission through backside protection layer 220.

In FIG. 6c, reconstituted panel 156 is singulated with saw blade or laser cutting device 222 into individual semiconductor devices or eWLCSP 224. Reconstituted panel 156 is singulated through encapsulant 158 and insulating layers 170 and 174 of interconnect structure 176. Singulating through encapsulant 158 removes a portion of encapsulant 158 from saw street 226 while a thin layer of encapsulant 158 remains disposed over sidewalls 148 of semiconductor die 124. eWLCSP 224 undergoes electrical testing before or after singulation. Because eWLCSP 224 are singulated through encapsulant 158, eWLCSP 224 are subject to less damage during singulation. With less risk of damage during singulation, testing can be performed prior to singulation and expensive inspection steps can be eliminated from the final testing of each eWLCSP 224. By testing prior to singulating reconstituted panel 156, eWLCSP 224 can be tested at the reconstituted wafer level. Wafer level testing reduces cost of testing by reducing the handling and testing time compared to pick and place handling and testing of singulated packages.

FIG. 6d shows a cross-sectional view of eWLCSP 224 after singulation. eWLCSP 224 includes encapsulant 158 formed over sidewalls 148 of semiconductor die 124. An interconnect structure 176 is formed over active surface 130 of semiconductor die 124 and surface 162 of encapsulant 158. Bumps 178 are formed over conductive layer 172 of interconnect structure 176. Semiconductor die 124 is electrically connected through conductive layers 132 and 172 to bumps 178 for external interconnect through interconnect structure 176. Conductive layer 174 of interconnect structure 176 and bumps 178 remain within a footprint of semiconductor die 124 to form a fan-in package. Insulating layer 170 is formed over insulating layer 134 of semiconductor die 124 and over encapsulant 158 to cover the interface between semiconductor die 124 and encapsulant 158 and to protect the interface during processing and improve the reliability of eWLCSP 224. In another embodiment, interconnect structure 176 is formed completely within a footprint of semiconductor die 124.

A thin layer of encapsulant 158 remains disposed over sidewalls 148 after singulation. Encapsulant 158 is disposed over four sides of semiconductor die 124, i.e., over the four sidewalls 148, and backside protection layer 220 is disposed over back surface 128 resulting in five-sided protection of semiconductor die 124. Encapsulant 158 over sidewalls 148 of semiconductor die 124 includes a thickness $T_3$, measured from a sidewall 148 of semiconductor die 124 to an edge 228 of eWLCSP 224. In one embodiment, a thickness $T_3$ of encapsulant 158 over sidewalls 148 is less than approximately 100 μm. In another embodiment, encapsulant 158 over sidewalls 148 of semiconductor die 124 includes a thickness $T_3$ of approximately 70 μm or less. In yet another embodiment, a thickness $T_3$ of encapsulant 158 over sidewalls 148 ranges from approximately 30-50 μm. Backside protection layer 220 is disposed over back surface 128 and provides mechanical protection for semiconductor die 124. Backside protection layer 220 may protect semiconductor die 124 from light. Backside protection layer 220 includes a thickness $T_4$ over back surface 128 of semiconductor die 124 and over encapsulant 158. In one embodiment, backside protection layer 220 has a thickness $T_4$ ranging from approximately 5-150 μm. In another embodiment, backside protection layer 220 has a thickness $T_4$ of greater than approximately 30 μm. In yet another embodiment, backside protection layer 220 has a thickness $T_4$ of approximately 120 μm or less. Backside protection layer 220 improves the strength and reduces chipping of semiconductor die 124. eWLCSP 224 with backside protection layer 220 may be formed with a reduced height or profile compared to devices with a backside encapsulant.

Encapsulant 158 and backside protection layer 220 increase the strength of semiconductor die 124 by providing mechanical protection during the package assembly and singulation operations and during surface mounting and end use of eWLCSP 224. Encapsulant 158 over sidewalls 148 mitigates cracking and chipping of semiconductor die 124 within eWLCSP 224. An opaque encapsulant 158 and backside protection layer 220 further protect semiconductor die 124 from degradation due to exposure to light or other emissions. Alternatively, a transparent or translucent encapsulant 158 and backside protection layer 220 provide light transmission for semiconductor die 124 having optical properties. The small footprint of eWLCSP 224 is similar in size to a WLCSP without sidewall protection, because thickness $T_3$ of encapsulant 158 over sidewalls 148 results in a negligible increase in package size for eWLCSP 224. In one embodiment, the package footprint size of eWLCSP 224 is within 100 μm in the x- and y-directions of a WLCSP without sidewall encapsulant. Additionally, eWLCSP 224 formed on reconstituted panel 156 has shorter testing time, a greater yield, and lower manufacturing cost than standard wafer-level devices.

FIGS. 7a-7b illustrate, in relation to FIGS. 1 and 2a-2d, a process of forming high density reconstituted panels on a standardized carrier. In FIG. 7a, semiconductor die 124 from FIG. 2d are mounted to interface layer 152 and over carrier 150 using, for example, a pick and place operation with active surface 130 oriented toward the carrier. Semiconductor die 124 are placed onto carrier 150 separated by a gap 230 with distance $D_2$ between semiconductor die 124. Distance $D_2$ between semiconductor die 124 is selected based on the design and specifications of the semiconductor package to be processed. Gap 230 or distance $D_2$ between semiconductor die 124 allows for a thin protective layer of encapsulant to remain over sidewalls 148 after singulation. In one embodiment, distance $D_2$ is sufficient to provide sidewall coverage by an encapsulant plus a saw street area for singulation. For example, to produce 30 μm of sidewall coverage for each semiconductor die 124 and to provide an 80 μm saw street for singulation, the distance $D_2$ of gap 230 is selected to be approximately 140 μm. In another embodiment, distance $D_2$ between semiconductor die 124 is 100 μm or less. In yet another embodiment, distance $D_2$ between semiconductor die 124 is greater than approximately 100 μm. Distance $D_2$ of gap 230 between semiconductor die 124 on carrier 150 is optimized for manufacturing the semiconductor packages at the lowest unit cost. Semiconductor die 124 mounted to carrier 150 form a reconstituted panel or reconfigured wafer 232.

FIG. 7b shows an alternative arrangement of semiconductor die 124 form FIG. 2d mounted to interface layer 152 and over carrier 150 using, for example, a pick and place operation with active surface 130 oriented toward the carrier. Semiconductor die 124 are placed onto carrier 150 separated by a gap 234 with distance $D_3$ between semiconductor die 124. In one embodiment, distance $D_3$ is sufficient to provide sidewall coverage by an encapsulant plus a saw street area for singulation. $D_3$ is increased to provide a greater thickness of sidewall encapsulant, to accommodate advanced node semiconductor die, or to accommodate a greater quantity or a higher density of input/output (I/O) connections. In one embodiment, distance $D_3$ between semiconductor die 124 is greater than approximately 100 μm. In another embodiment, distance $D_3$ between semiconductor die 124 is 100 μm or less. Distance $D_3$ of gap 234 between semiconductor die 124 on carrier 150 is optimized for manufacturing the semiconductor packages at the lowest unit cost. Semiconductor die 124 mounted to carrier 150 form a reconstituted panel or reconfigured wafer 236.

Reconstituted panels 232 and 236 can be processed into many types of semiconductor packages, including eWLB, fan-in WLCSP, eWLCSP, fan-out WLCSP, flipchip packages, 3D packages, PoP, or other semiconductor packages. Reconstituted panels 232 and 236 are configured according to the specifications of the resulting semiconductor package. In one embodiment, semiconductor die 124 are placed on carrier 150 in a high-density arrangement, i.e., 300 μm apart or less, for processing fan-in devices. The larger surface area of carrier 150 accommodates more semiconductor die 124 and lowers manufacturing cost as more semiconductor die 124 are processed per reconstituted panel. The number of semiconductor die 124 mounted to carrier 150 can be greater than the number of semiconductor die 124 singulated from semiconductor wafer 120. Carrier 150 and reconstituted panels 232 and 236 provide the flexibility to manufacture many different types of semiconductor packages using different size semiconductor die 124 from different sized semiconductor wafers 120.

Figure 8D:
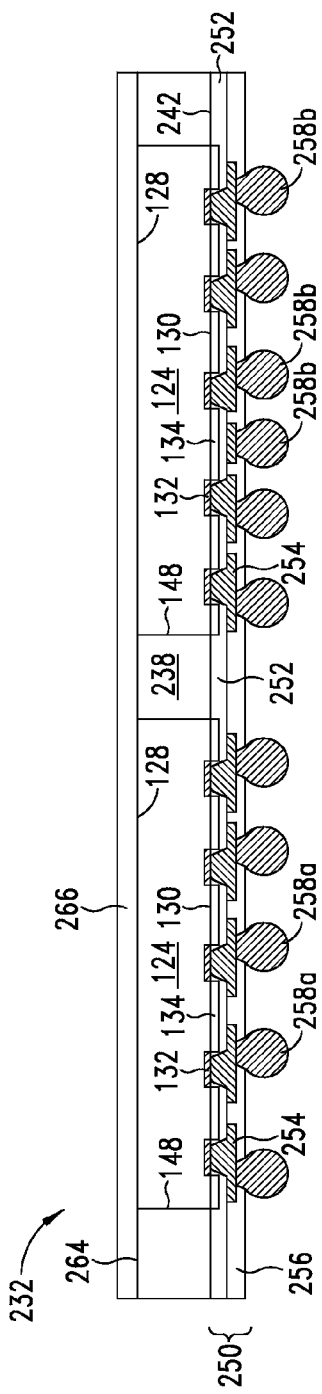

FIGS. 8a-8g illustrate, in relation to FIGS. 1 and 2a-2d, a process of forming an eWLCSP with fine pitch interconnects. Continuing from FIG. 7a, FIG. 8a shows reconstituted panel 232 with semiconductor die 124 disposed over interface layer 152 and carrier 150 with a distance $D_2$ between adjacent semiconductor die 124.

In FIG. 8a, an encapsulant or molding compound 238 is deposited over semiconductor die 124 and carrier 150 as an insulating material using a paste printing, compressive molding, transfer molding, liquid encapsulant molding, vacuum lamination, spin coating, or other suitable applicator. Encapsulant 238 includes polymer composite material, such as epoxy resin with filler, epoxy acrylate with filler, or polymer with proper filler. Encapsulant 238 is non-conductive and environmentally protects the semiconductor device from external elements and contaminants. In one embodiment, encapsulant 238 includes an opaque material and is dark or black in color to provide protection of semiconductor die 124 from light and to prevent soft errors by attenuating photon injection. Encapsulant 238 is deposited into gap 230 and covers sidewalls 148 of semiconductor die 124, while active surface 130 is oriented toward carrier 150 and remains protected. Encapsulant 238 is formed with a back surface 240 over reconstituted panel 232 and covers back surface 128 of semiconductor die 124. Encapsulant 238 contacts interface layer 152 such that surface 242 of encapsulant 238, opposite back surface 240, is formed coplanar with active surface 130 of semiconductor die 124.

In FIG. 8b, temporary carrier 150 and interface layer 152 are removed by chemical etching, mechanical peel-off, CMP, mechanical grinding, thermal bake, laser scanning, or wet stripping. Temporary carrier 150 and interface layer 152 are removed from over surface 242 of encapsulant 238 and active surface 130 of semiconductor die 124 to expose conductive layer 132, insulating layer 134, and surface 242 of encapsulant 238.

A build-up interconnect structure 250 is formed over semiconductor die 124 and encapsulant 238. An insulating or passivation layer 252 is formed over insulating layer 134 and conductive layer 132 using PVD, CVD, printing, spin coating, spray coating, sintering or thermal oxidation. Insulating layer 252 can be one or more layers of SiO2, Si3N4, SiON, Ta2O5, Al2O3, BCB, epoxy based photosensitive polymer dielectric, low temperature (≤200° C.) curable polymer, or other material having similar insulating and structural properties. In one embodiment, insulating layer 252 includes a low temperature curing photosensitive dielectric polymer with or without insulating fillers cured at less than 200° C. Insulating layer 252 is formed over active surface 130 of semiconductor die 124 and surface 242 of encapsulant 238. A portion of insulating layer 252 is removed by an etching process with a patterned photoresist layer or by LDA to expose conductive layer 132 with respect to insulating layer 252. In another embodiment, a portion of insulating layer 252 is also removed from over encapsulant 238 such that surface 242 of encapsulant 238 is exposed and devoid of insulating layer 252. In one embodiment, insulating layer 252 includes a thickness ranging from approximately 7-11 μm.

An electrically conductive layer 254 is formed over insulating layer 252 and contact pads 132 using a patterning and metal deposition process such as PVD, CVD, sputtering, electrolytic plating, and electroless plating. Conductive layer 254 can be one or more layers of Al, Cu, Sn, Ni, Au, Ag, or other suitable electrically conductive material. Conductive layer 254 operates as an RDL to redistribute the electrical signals of semiconductor die 124. Conductive layer 254 is formed within a footprint of semiconductor die 124 and does not extend beyond the footprint of semiconductor die 124 or over surface 242 of encapsulant 238. In other words, a peripheral region of semiconductor die 124 adjacent to semiconductor die 124 is devoid of conductive layer 254. One portion of conductive layer 254 is electrically connected to contact pads 132 of semiconductor die 124. Other portions of conductive layer 254 can be electrically common or electrically isolated depending on the design and function of the semiconductor device. In one embodiment, conductive layer 254 includes a thickness ranging from approximately 7-10 μm.

An insulating or passivation layer 256 is formed over insulating layer 252 and conductive layer 254 using PVD, CVD, printing, spin coating, spray coating, sintering or thermal oxidation. Insulating layer 256 can be one or more layers of SiO2, Si3N4, SiON, Ta2O5, Al2O3, BCB, epoxy based photosensitive polymer dielectric, low temperature (≤200° C.) curable polymer, or other material having similar insulating and structural properties. In one embodiment, insulating layer 256 includes a low temperature curing photosensitive dielectric polymer with or without insulating fillers cured at less than 200° C. Insulating layer 256 is formed over active surface 130 of semiconductor die 124 and surface 242 of encapsulant 238. A portion of insulating layer 256 is removed by an etching process with a patterned photoresist layer or by LDA to expose conductive layer 254 with respect to insulating layer 256. In another embodiment, a portion of insulating layer 256 is also removed from over encapsulant 238 such that surface 242 of encapsulant 238 is exposed and devoid of insulating layer 256. In one embodiment, insulating layer 256 includes a thickness ranging from approximately 7-11 μm.

An electrically conductive bump material is deposited over conductive layer 254 of interconnect structure 250 and is electrically connected to conductive layer 132 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 254 using a suitable attachment or bonding process. In one embodiment, the bump material is reflowed by heating the material above its melting point to form spherical balls or bumps 258a-258b. In some applications, bumps 258a-258b are reflowed a second time to improve electrical contact to conductive layer 254. The bumps can also be compression bonded to conductive layer 254. Bumps 258a-258b represent one type of interconnect structure that can be formed over conductive layer 254. The interconnect structure can also use bond wires, stud bump, micro bump, or other electrical interconnect.

In FIG. 8c, reconstituted panel 232 undergoes an optional backgrinding step. A backgrinding tape or support tape 260 is applied over interconnect structure 250 and in contact with insulating layer 256 and bumps 258a-258b. A portion of encapsulant 238 is removed in a grinding operation with grinder 262 to planarize the surface of encapsulant 238 and expose back surface 128 of semiconductor die 124. A chemical etch or CMP process can also be used to planarize encapsulant 238 and to remove mechanical damage resulting from the grinding operation. The removal of a portion of encapsulant 238 leaves new back surface 264 of encapsulant 238. Encapsulant 238 is completely removed from over back surface 128 of semiconductor die 124 to expose back surface 128 of semiconductor die 124. After backgrinding, a new back surface 264 of encapsulant 238 is coplanar with back surface 128 of semiconductor die 124. Reconstituted panel 232 has a reduced thickness after the backgrinding operation. A thickness of semiconductor die 124 can also be reduced by the backgrinding operation. In one embodiment, a portion of back surface 128 of semiconductor die 124 is removed to thin semiconductor die 124 during the backgrinding operation. Removing a portion of encapsulant 238 reduces warpage of reconstituted panel 232. Laser marking can be applied directly to back surface 128 of semiconductor die 124 for alignment and singulation.

In FIG. 8d, a backside protection layer 266 is formed over back surface 128 of semiconductor die 124 and surface 264 of encapsulant 238 for protection of semiconductor die 124. Backside protection layer 266 may contain one or more layers of photosensitive low curing temperature dielectric resist, photosensitive composite resist, laminate compound film, resin matrix composite sheet with filler or glass fiber cloth, resin matrix composite sheet with both filler and glass fiber cloth, insulation paste with filler, solder mask resist film, liquid molding compound, granular molding compound, polyimide, BCB, $SiO_2$, $Si_3N_4$, SiON, $Ta_2O_5$, $Al_2O_3$, prepreg, or other dielectric material having similar insulating and structural properties. Backside protection layer 266 is deposited using spin coating, screen printing, spray coating, vacuum or pressure lamination with or without heat, transfer molding, or other suitable process. In one embodiment, backside protection layer 266 is a low temperature curing photosensitive dielectric polymer with or without insulating fillers cured at less than 200° C. In another embodiment, backside protection layer 266 is cured by UV. Alternatively, backside protection layer 266 is a metal layer, such as Cu foil, applied to a backside of reconstituted panel 232. Backside protection layer 266 contacts back surface 128 of semiconductor die 124 to transfer heat from semiconductor die 124 and improve the thermal performance of the device.

Backside protection layer 266 is formed after singulation of semiconductor wafer 120 and reconstitution of semiconductor die 124, and prior to singulation of reconstituted panel 232. In one embodiment, backside protection layer 266 includes an opaque material and is dark or black in color to provide protection of semiconductor die 124 from photons from light and other emissions to reduce soft errors. Backside protection layer 266 can be used for laser marking reconstituted panel 232 and improves visibility of marking on the back surface of the reconstituted panel 232. In another embodiment, backside protection layer 266 includes a transparent or translucent material.

For semiconductor die 124 with optical properties, such as an LED, a transparent backside protection 266 layer allows photon emission from back surface 128 of semiconductor die 124 through backside protection layer 266. In one embodiment, the base material 122 of semiconductor die 124 includes sapphire, and semiconductor die 124 includes active elements on active surface 130. In a flip-chip application, light may be emitted through backside protection layer 266 and through base material 122 of semiconductor die 124. Back surface 128 of semiconductor die 124 is coated with a translucent or transparent backside protection layer 266. The translucent or transparent backside protection layer 266 provides mechanical protection of semiconductor die 124, while allowing light transmission through backside protection layer 266.

Figure 8E:
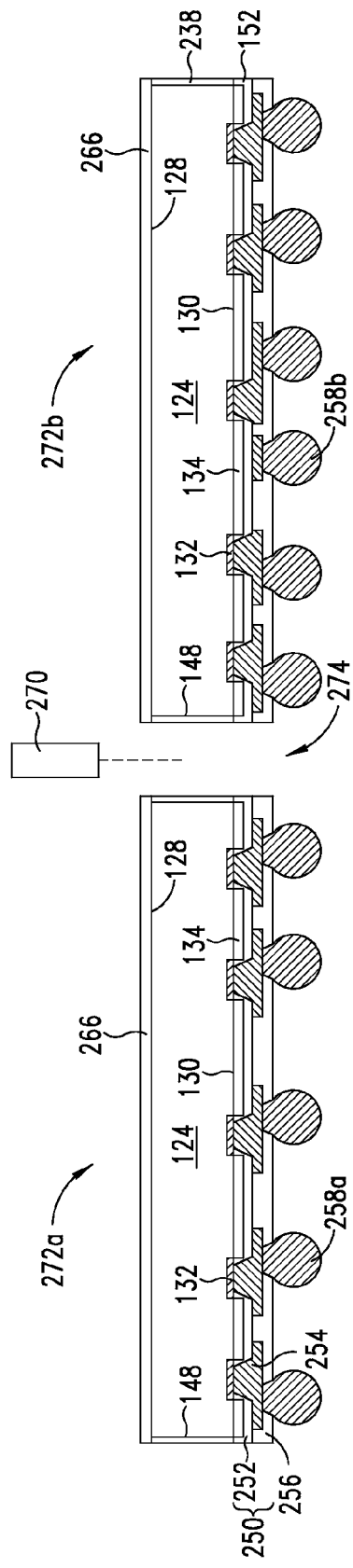

In FIG. 8e, reconstituted panel 232 is singulated with saw blade or laser cutting device 270 into individual semiconductor devices or eWLCSP 272a-272b. Reconstituted panel 232 is singulated through encapsulant 238, insulating layers 252 and 256 of interconnect structure 250, and backside protection layer 266. Singulating through encapsulant 238 removes a portion of encapsulant 238 from saw street 274 while a thin layer of encapsulant 238 remains disposed over sidewalls 148 of semiconductor die 124. eWLCSP 272a-272b undergo electrical testing before or after singulation.

The process of forming eWLCSP 272a-272b on reconstituted panel 232 allows a variety of semiconductor die 124 to be processed using carrier 150, including advanced node semiconductor die with nodes down to 22 nanometer (nm). For example, eWLCSP 272a-272b may be formed with a greater I/O densities and smaller I/O pitches that are outside the design limits for conventional WLCSP. The process of forming eWLCSP 272a-272b accommodates transitions to different I/O densities and pitches within the same or similar packaging process using a standardized carrier, such as carrier 150. Additionally, because eWLCSP 272a-272b are singulated through encapsulant 238, eWLCSP 272a-272b are subject to less damage during singulation. With less risk of damage during singulation, expensive inspection steps can be eliminated from the final testing of each eWLCSP 272a-272b. By testing prior to singulating reconstituted panel 232, eWLCSP 272a-272b can be tested at the reconstituted wafer level. Wafer level testing reduces cost of testing by reducing the handling and testing time compared to pick and place handling and testing of singulated packages.

FIG. 8f shows a cross-sectional view of eWLCSP 272a after singulation. eWLCSP 272a includes encapsulant 238 formed over sidewalls 148 of semiconductor die 124. An interconnect structure 250 is formed over active surface 130 of semiconductor die 124 and surface 242 of encapsulant 238. Bumps 258a are formed over conductive layer 254 of interconnect structure 250. Semiconductor die 124 is electrically connected through conductive layers 132 and 254 to bumps 258a for external interconnect through interconnect structure 250. Conductive layer 254 of interconnect structure 250 and bumps 258a remain within a footprint of semiconductor die 124 to form a fan-in package. Insulating layer 252 is formed over insulating layer 134 of semiconductor die 124 and over encapsulant 238 to cover the interface between semiconductor die 124 and encapsulant 238 and to protect the interface during processing and improve the reliability of eWLCSP 272a. In another embodiment, interconnect structure 250 is formed completely within a footprint of semiconductor die 124. eWLCSP 272a accommodates high density I/O and fine pitch I/O. In one embodiment, bumps 258a have a pitch $P_1$ of approximately 0.4 mm or less and a density of approximately 6 I/O per square millimeter ($mm^2$) or greater. In another embodiment, bumps 258a have a pitch $P_1$ of approximately 0.5 mm or less and a density of approximately 4 I/O/$mm^2$ or greater.

A thin layer of encapsulant 238 remains disposed over sidewalls 148 after singulation. Encapsulant 238 is disposed over four sides of semiconductor die 124, i.e., over the four sidewalls 148, and backside protection layer 266 is disposed over back surface 128 resulting in five-sided protection of semiconductor die 124. Backside protection layer 266 is disposed over back surface 128 and provides mechanical protection for semiconductor die 124. Backside protection layer 266 may protect semiconductor die 124 from light. Backside protection layer 266 includes a thickness $T_5$ over back surface 128 of semiconductor die 124 and over encapsulant 238. In one embodiment, backside protection layer 266 has a thickness $T_5$ ranging from approximately 5-150 µm. In another embodiment, backside protection layer 266 has a thickness $T_5$ of greater than approximately 30 µm. In yet another embodiment, backside protection layer 266 has a thickness $T_5$ of approximately 120 µm or less. Encapsulant 238 over sidewalls 148 of semiconductor die 124 includes a thickness $T_6$, measured from a sidewall 148 of semiconductor die 124 to an edge 276 of eWLCSP 272a. In one embodiment, a thickness $T_6$ of encapsulant 238 over sidewalls 148 is less than approximately 100 µm. In another embodiment, encapsulant 238 over sidewalls 148 of semiconductor die 124 includes a thickness $T_6$ of approximately 70 µm or less. In yet another embodiment, a thickness $T_6$ of encapsulant 238 over sidewalls 148 ranges from approximately 30-50 µm. Backside protection layer 266 and sidewall encapsulant 238 improve the strength and reduce chipping of semiconductor die 124. eWLCSP 272a with backside protection layer 266 may be formed with a reduced height or profile compared to devices with a backside encapsulant.

Encapsulant 238 and backside protection layer 266 increase the strength of semiconductor die 124 by providing mechanical protection during the package assembly and singulation operations and during surface mounting and end use of eWLCSP 272a. Encapsulant 238 over sidewalls 148 mitigates cracking and chipping of semiconductor die 124 within eWLCSP 272a. An opaque encapsulant 238 and backside protection layer 266 further protect semiconductor die 124 from degradation due to exposure to light or other emissions. Alternatively, a transparent or translucent encapsulant 238 and backside protection layer 266 provide light transmission for semiconductor die 124 having optical properties. The small footprint of eWLCSP 272a is similar in size to a WLCSP without sidewall protection, because thickness $T_6$ of encapsulant 238 over sidewalls 148 results in a negligible increase in package size for eWLCSP 272a. In one embodiment, the package footprint size of eWLCSP 272a is within 100 µm in the x- and y-directions of a WLCSP without sidewall encapsulant. Additionally, eWLCSP 272a formed on reconstituted panel 232 has shorter testing time, a greater yield, and lower manufacturing cost than standard wafer-level devices.

FIG. 8g shows a cross-sectional view of eWLCSP 272b after singulation. eWLCSP 272b includes encapsulant 238 formed over sidewalls 148 of semiconductor die 124. An interconnect structure 250 is formed over active surface 130 of semiconductor die 124 and surface 242 of encapsulant 238. Bumps 258b are formed over conductive layer 254 of interconnect structure 250. Semiconductor die 124 is electrically connected through conductive layers 132 and 254 to bumps 258b for external interconnect through interconnect structure 250. Conductive layer 254 of interconnect structure 250 and bumps 258b remain within a footprint of semiconductor die 124 to form a fan-in package. Insulating layer 252 is formed over insulating layer 134 of semiconductor die 124 and over encapsulant 238 to cover the interface between semiconductor die 124 and encapsulant 238 and to protect the interface during processing and improve the reliability of eWLCSP 272b. In another embodiment, interconnect structure 250 is formed completely within a footprint of semiconductor die 124. eWLCSP 272b accommodates high density I/O and fine pitch I/O. In one embodiment, bumps 258b have a pitch $P_2$ of approximately 0.4 mm or less and a density of approximately 6 I/O $mm^2$ or greater. In another embodiment, bumps 258b have a pitch $P_2$ of approximately 0.5 mm or less and a density of approximately 4 I/O/$mm^2$ or greater. eWLCSP 272b may include a greater quantity of bumps 258b or a smaller pitch $P_2$ of bumps 258b than other packages, such as eWLCSP 272a from FIG. 8f, processed on the same carrier 150. Interconnect structure 250 and bumps 258b are formed closer to edge 148 of semiconductor die 124 to increase the density of bumps 258b. Encapsulant 238 formed over sidewalls 148 results in less damage to the device during singulation and allows for finer pitch I/O.

A thin layer of encapsulant 238 remains disposed over sidewalls 148 after singulation. Encapsulant 238 is disposed over four sides of semiconductor die 124, i.e., over the four sidewalls 148, and backside protection layer 266 is disposed over back surface 128 resulting in five-sided protection of semiconductor die 124. Backside protection layer 266 is disposed over back surface 128 and provides mechanical protection for semiconductor die 124. Backside protection layer 266 may protect semiconductor die 124 from light.

Backside protection layer 266 includes a thickness $T_5$ over back surface 128 of semiconductor die 124 and over encapsulant 238. In one embodiment, backside protection layer 266 has a thickness $T_5$ ranging from approximately 5-150 µm. In another embodiment, backside protection layer 266 has a thickness $T_5$ of greater than approximately 30 µm. In yet another embodiment, backside protection layer 266 has a thickness $T_5$ of approximately 120 µm or less. Encapsulant 238 over sidewalls 148 of semiconductor die 124 includes a thickness $T_6$, measured from a sidewall 148 of semiconductor die 124 to an edge 276 of eWLCSP 272b. In one embodiment, a thickness $T_6$ of encapsulant 238 over sidewalls 148 is less than approximately 100 µm. In another embodiment, encapsulant 238 over sidewalls 148 of semiconductor die 124 includes a thickness $T_6$ of approximately 70 µm or less. In yet another embodiment, a thickness $T_6$ of encapsulant 238 over sidewalls 148 ranges from approximately 30-50 µm. Backside protection layer 266 and sidewall encapsulant 238 improve the strength and reduce chipping of semiconductor die 124. eWLCSP 272b with backside protection layer 266 may be formed with a reduced height or profile compared to devices with a backside encapsulant.

Encapsulant 238 and backside protection layer 266 increase the strength of semiconductor die 124 by providing mechanical protection during the package assembly and singulation operations and during surface mounting and end use of eWLCSP 272b. Encapsulant 238 over sidewalls 148 mitigates cracking and chipping of semiconductor die 124 within eWLCSP 272b. An opaque encapsulant 238 and backside protection layer 266 further protect semiconductor die 124 from degradation due to exposure to light or other emissions. Alternatively, a transparent or translucent encapsulant 238 and backside protection layer 266 provide light transmission for semiconductor die 124 having optical properties. The small footprint of eWLCSP 272b is similar in size to a WLCSP without sidewall protection, because thickness $T_6$ of encapsulant 238 over sidewalls 148 results in a negligible increase in package size for eWLCSP 272b. In one embodiment, the package footprint size of eWLCSP 272b is within 100 µm in the x- and y-directions of a WLCSP without sidewall encapsulant. Additionally, eWLCSP 272b formed on reconstituted panel 232 has shorter testing time, a greater yield, and lower manufacturing cost than standard wafer-level devices.

Figure 9E:
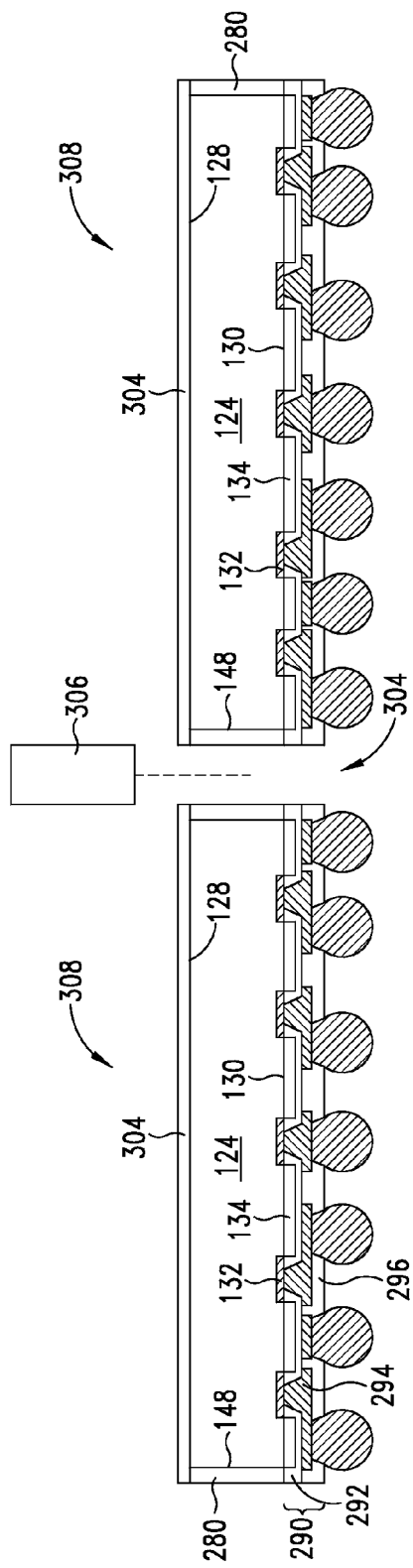

FIGS. 9a-9f illustrate, in relation to FIGS. 1 and 2a-2d, a process of forming an eWLCSP with an additional row of interconnects. Continuing from FIG. 7b, FIG. 9a shows reconstituted panel 236 with semiconductor die 124 disposed over interface layer 152 and carrier 150 with a distance $D_3$ between adjacent semiconductor die 124.

In FIG. 9a, an encapsulant or molding compound 280 is deposited over semiconductor die 124 and carrier 150 as an insulating material using a paste printing, compressive molding, transfer molding, liquid encapsulant molding, vacuum lamination, spin coating, or other suitable applicator. Encapsulant 280 includes polymer composite material, such as epoxy resin with filler, epoxy acrylate with filler, or polymer with proper filler. Encapsulant 280 is non-conductive and environmentally protects the semiconductor device from external elements and contaminants. In one embodiment, encapsulant 280 includes an opaque material and is dark or black in color to provide protection of semiconductor die 124 from light and to prevent soft errors by attenuating photon injection. Encapsulant 280 is deposited into gap 234 and covers sidewalls 148 of semiconductor die 124, while active surface 130 is oriented toward carrier 150 and remains protected. Encapsulant 280 is formed with a back surface 282 over reconstituted panel 236 and covers back surface 128 of semiconductor die 124. Encapsulant 280 contacts interface layer 152 such that surface 284 of encapsulant 280, opposite back surface 282, is formed coplanar with active surface 130 of semiconductor die 124.

In FIG. 9b, temporary carrier 150 and interface layer 152 are removed by chemical etching, mechanical peel-off, CMP, mechanical grinding, thermal bake, laser scanning, or wet stripping. Temporary carrier 150 and interface layer 152 are removed from over surface 284 of encapsulant 280 and active surface 130 of semiconductor die 124 to expose conductive layer 132, insulating layer 134, and surface 284 of encapsulant 280.

A build-up interconnect structure 290 is formed over semiconductor die 124 and encapsulant 280. An insulating or passivation layer 292 is formed over insulating layer 134 and conductive layer 132 using PVD, CVD, printing, spin coating, spray coating, sintering or thermal oxidation. Insulating layer 292 can be one or more layers of $SiO_2$, $Si_3N_4$, SiON, $Ta_2O_5$, $Al_2O_3$, BCB, epoxy based photosensitive polymer dielectric, low temperature (≤200° C.) curable polymer, or other material having similar insulating and structural properties. In one embodiment, insulating layer 292 includes a low temperature curing photosensitive dielectric polymer with or without insulating fillers cured at less than 200° C. Insulating layer 292 is formed over active surface 130 of semiconductor die 124 and surface 284 of encapsulant 280. A portion of insulating layer 292 is removed by an etching process with a patterned photoresist layer or by LDA to expose conductive layer 132 with respect to insulating layer 292. In another embodiment, a portion of insulating layer 292 is also removed from over encapsulant 280 such that surface 284 of encapsulant 280 is exposed and devoid of insulating layer 292. In one embodiment, insulating layer 292 includes a thickness ranging from approximately 7-11 µm.

An electrically conductive layer 294 is formed over insulating layer 292 and contact pads 132 using a patterning and metal deposition process such as PVD, CVD, sputtering, electrolytic plating, and electroless plating. Conductive layer 294 can be one or more layers of Al, Cu, Sn, Ni, Au, Ag, or other suitable electrically conductive material. Conductive layer 294 operates as an RDL to redistribute the electrical signals of semiconductor die 124. Conductive layer 294 is formed within a footprint of semiconductor die 124 and does not extend beyond the footprint of semiconductor die 124 or over surface 284 of encapsulant 280. In other words, a peripheral region of semiconductor die 124 adjacent to semiconductor die 124 is devoid of conductive layer 294. One portion of conductive layer 294 is electrically connected to contact pads 132 of semiconductor die 124. Other portions of conductive layer 294 can be electrically common or electrically isolated depending on the design and function of the semiconductor device. In one embodiment, conductive layer 294 includes a thickness ranging from approximately 7-10 µm.

An insulating or passivation layer 296 is formed over insulating layer 292 and conductive layer 294 using PVD, CVD, printing, spin coating, spray coating, sintering or thermal oxidation. Insulating layer 296 can be one or more layers of $SiO_2$, $Si_3N_4$, SiON, $Ta_2O_5$, $Al_2O_3$, BCB, epoxy based photosensitive polymer dielectric, low temperature (≤200° C.) curable polymer, or other material having similar insulating and structural properties. In one embodiment, insulating layer 296 includes a low temperature curing photosensitive dielectric polymer with or without insulating fillers cured at less than 200° C. Insulating layer 296 is formed over active surface 130 of semiconductor die 124 and surface 284 of encapsulant 280. A portion of insulating layer 296 is removed by an etching process with a patterned photoresist layer or by LDA to expose conductive layer 294 with respect to insulating layer 296. In another embodiment, a portion of insulating layer 296 is also removed from over encapsulant 280 such that surface 284 of encapsulant 280 is exposed and devoid of insulating layer 296. In one embodiment, insulating layer 296 includes a thickness ranging from approximately 7-11 µm.

An electrically conductive bump material is deposited over conductive layer 294 of interconnect structure 290 and is electrically connected to conductive layer 132 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 294 using a suitable attachment or bonding process. In one embodiment, the bump material is reflowed by heating the material above its melting point to form spherical balls or bumps 298. In some applications, bumps 298 are reflowed a second time to improve electrical contact to conductive layer 294. The bumps can also be compression bonded to conductive layer 294. Bumps 298 represent one type of interconnect structure that can be formed over conductive layer 294. The interconnect structure can also use bond wires, stud bump, micro bump, or other electrical interconnect.

In FIG. 9c, reconstituted panel 236 undergoes an optional backgrinding step. A backgrinding tape or support tape 300 is applied over interconnect structure 290 and in contact with insulating layer 296 and bumps 298. A portion of encapsulant 280 is removed in a grinding operation with grinder 302 to planarize the surface of encapsulant 280 and expose back surface 128 of semiconductor die 124. A chemical etch or CMP process can also be used to planarize encapsulant 280 and to remove mechanical damage resulting from the grinding operation. Encapsulant 280 is completely removed from over back surface 128 of semiconductor die 124 to expose back surface 128 of semiconductor die 124. After backgrinding, encapsulant 280 is coplanar with back surface 128 of semiconductor die 124. Reconstituted panel 236 has a reduced thickness after the backgrinding operation. A thickness of semiconductor die 124 can also be reduced by the backgrinding operation. In one embodiment, a portion of back surface 128 of semiconductor die 124 is removed to thin semiconductor die 124 during the backgrinding operation. Removing a portion of encapsulant 280 reduces warpage of reconstituted panel 236. Laser marking can be applied directly to back surface 128 of semiconductor die 124 for alignment and singulation.

In FIG. 9d, a backside protection layer 304 is formed over back surface 128 of semiconductor die 124 and a back surface of encapsulant 280 for protection of semiconductor die 124. Backside protection layer 304 may contain one or more layers of photosensitive low curing temperature dielectric resist, photosensitive composite resist, laminate compound film, resin matrix composite sheet with filler or glass fiber cloth, resin matrix composite sheet with both filler and glass fiber cloth, insulation paste with filler, solder mask resist film, liquid molding compound, granular molding compound, polyimide, BCB, SiO2, Si3N4, SiON, Ta2O5, Al2O3, prepreg, or other dielectric material having similar insulating and structural properties. Backside protection layer 304 is deposited using spin coating, screen printing, spray coating, vacuum or pressure lamination with or without heat, transfer molding, or other suitable process. In one embodiment, backside protection layer 304 is a low temperature curing photosensitive dielectric polymer with or without insulating fillers cured at less than 200° C. In another embodiment, backside protection layer 304 is cured by UV. Alternatively, backside protection layer 304 is a metal layer, such as Cu foil, applied to a backside of reconstituted panel 236. Backside protection layer 304 contacts back surface 128 of semiconductor die 124 to transfer heat from semiconductor die 124 and improve the thermal performance of the device.

Backside protection layer 304 is formed after singulation of semiconductor wafer 120 and reconstitution of semiconductor die 124, and prior to singulation of reconstituted panel 236. In one embodiment, backside protection layer 304 includes an opaque material and is dark or black in color to provide protection of semiconductor die 124 from photons from light and other emissions to reduce soft errors. Backside protection layer 304 can be used for laser marking reconstituted panel 236 and improves visibility of marking on the back surface of the reconstituted panel 236. In another embodiment, backside protection layer 304 includes a transparent or translucent material.

For semiconductor die 124 with optical properties, such as an LED, a transparent backside protection 304 layer allows photon emission from back surface 128 of semiconductor die 124 through backside protection layer 304. In one embodiment, the base material 122 of semiconductor die 124 includes sapphire, and semiconductor die 124 includes active elements on active surface 130. In a flip-chip application, light may be emitted through backside protection layer 304 and through base material 122 of semiconductor die 124. Back surface 128 of semiconductor die 124 is coated with a translucent or transparent backside protection layer 304. The translucent or transparent backside protection layer 304 provides mechanical protection of semiconductor die 124, while allowing light transmission through backside protection layer 304.

In FIG. 9e, reconstituted panel 236 is singulated with saw blade or laser cutting device 306 into individual semiconductor devices or eWLCSP 308. Reconstituted panel 236 is singulated through encapsulant 280, insulating layers 292 and 296 of interconnect structure 290, and backside protection layer 304. Singulating through encapsulant 280 removes a portion of encapsulant 280 from a saw street while a thin layer of encapsulant 280 remains disposed over sidewalls 148 of semiconductor die 124. eWLCSP 308 undergoes electrical testing before or after singulation. Because eWLCSP 308 are singulated through encapsulant 280, eWLCSP 308 are subject to less damage during singulation. With less risk of damage during singulation, testing can be performed prior to singulation and expensive inspection steps can be eliminated from the final testing of each eWLCSP 308. By testing prior to singulating reconstituted panel 236, eWLCSP 308 can be tested at the reconstituted wafer level. Wafer level testing reduces cost of testing by reducing the handling and testing time compared to pick and place handling and testing of singulated packages.

The process of forming eWLCSP 308 on reconstituted panel 236 allows a variety of semiconductor die 124 to be processed using carrier 150, including advanced node semiconductor die with nodes down to 22 nm. For example, eWLCSP 308 may be formed with a greater I/O density and smaller I/O pitch that is outside the design limits for conventional WLCSP. The process of forming eWLCSP 308 accommodates transitions to different I/O densities and pitches within the same or similar packaging process using a standardized carrier, such as carrier 150. Additionally, because eWLCSP 308 are singulated through encapsulant 280, eWLCSP 308 are subject to less damage during singulation. With less risk of damage during singulation, expensive inspection steps can be eliminated from the final testing of each eWLCSP 308. By testing prior to singulating reconstituted panel 236, eWLCSP 308 can be tested at the reconstituted wafer level. Wafer level testing reduces cost of testing by reducing the handling and testing time compared to pick and place handling and testing of singulated packages.

Figure 9F:
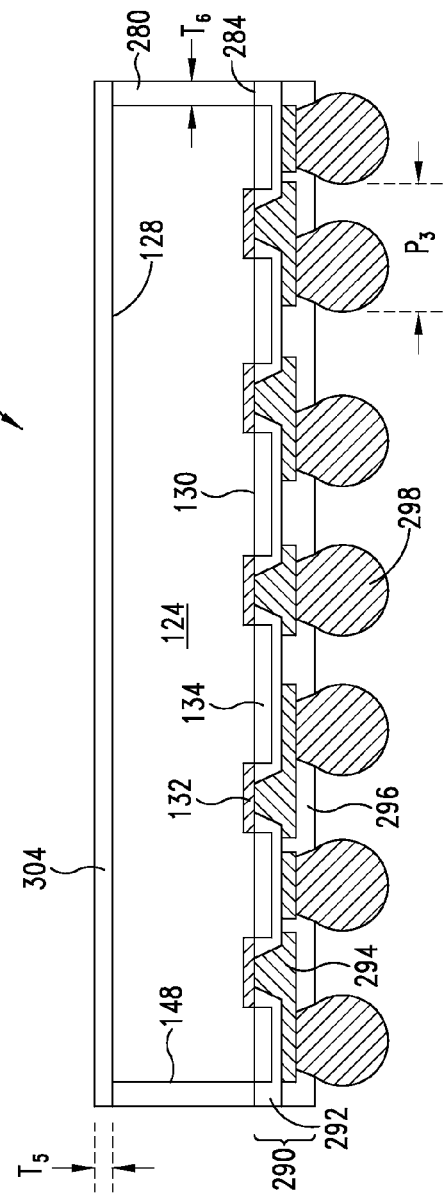

FIG. 9f shows a cross-sectional view of eWLCSP 308 after singulation. eWLCSP 308 includes encapsulant 280 formed over sidewalls 148 of semiconductor die 124. An interconnect structure 290 is formed over active surface 130 of semiconductor die 124 and surface 284 of encapsulant 280. Bumps 298 are formed over conductive layer 294 of interconnect structure 290. Semiconductor die 124 is electrically connected through conductive layers 132 and 294 to bumps 298 for external interconnect through interconnect structure 290. Conductive layer 294 of interconnect structure 290 and bumps 298 remain within a footprint of semiconductor die 124 to form a fan-in package. Insulating layer 292 is formed over insulating layer 134 of semiconductor die 124 and over encapsulant 280 to cover the interface between semiconductor die 124 and encapsulant 280 and to protect the interface during processing and improve the reliability of eWLCSP 308. In another embodiment, interconnect structure 290 is formed completely within a footprint of semiconductor die 124. eWLCSP 308 accommodates high density I/O and fine pitch I/O. In one embodiment, bumps 298 have a pitch $P_3$ of approximately 0.4 mm or less and a density of approximately 6 I/O mm² or greater. In another embodiment, bumps 298 have a pitch $P_3$ of approximately 0.5 mm or less and a density of approximately 4 I/O/mm² or greater. eWLCSP 308 may include a greater quantity of bumps 298 or a smaller pitch $P_3$ of bumps 298 than other packages, such as eWLCSP 272b from FIG. 8g, processed on the same carrier 150. Interconnect structure 290 and bumps 298 are formed closer to edge 148 of semiconductor die 124 to increase the density of bumps 298. Encapsulant 280 formed over sidewalls 148 results in less damage to the device during singulation and allows for finer pitch I/O. eWLCSP 308 may include an additional row of bumps 298, while the package structure remains similar to other eWLCSP disclosed herein, such that similar processing materials and equipment may be used to manufacture the various eWLCSP. For example, thickness $T_6$ of encapsulant 280 may be increased to accommodate more interconnections or higher density interconnections while maintaining a fan-in package design for eWLCSP 308.

A thin layer of encapsulant 280 remains disposed over sidewalls 148 after singulation. Encapsulant 280 is disposed over four sides of semiconductor die 124, i.e., over the four sidewalls 148, and backside protection layer 304 is disposed over back surface 128 resulting in five-sided protection of semiconductor die 124. Backside protection layer 304 is disposed over back surface 128 and provides mechanical protection for semiconductor die 124. Backside protection layer 304 may protect semiconductor die 124 from light. Backside protection layer 304 includes a thickness $T_5$ over back surface 128 of semiconductor die 124 and over encapsulant 280. In one embodiment, backside protection layer 304 has a thickness $T_5$ ranging from approximately 5-150 µm. In another embodiment, backside protection layer 304 has a thickness $T_5$ of greater than approximately 30 µm. In yet another embodiment, backside protection layer 304 has a thickness $T_5$ of approximately 120 µm or less. Encapsulant 280 over sidewalls 148 of semiconductor die 124 includes a thickness $T_6$, measured from a sidewall 148 of semiconductor die 124 to an edge of eWLCSP 308. In one embodiment, a thickness $T_6$ of encapsulant 280 over sidewalls 148 is less than approximately 100 µm. In another embodiment, encapsulant 280 over sidewalls 148 of semiconductor die 124 includes a thickness $T_6$ of approximately 70 µm or less. In yet another embodiment, a thickness $T_6$ of encapsulant 280 over sidewalls 148 ranges from approximately 30-50 µm. Backside protection layer 304 and sidewall encapsulant 280 improve the strength and reduce chipping of semiconductor die 124. eWLCSP 308 with backside protection layer 304 may be formed with a reduced height or profile compared to devices with a backside encapsulant.

Encapsulant 280 and backside protection layer 304 increase the strength of semiconductor die 124 by providing mechanical protection during the package assembly and singulation operations and during surface mounting and end use of eWLCSP 308. Encapsulant 280 over sidewalls 148 mitigates cracking and chipping of semiconductor die 124 within eWLCSP 308. An opaque encapsulant 280 and backside protection layer 304 further protect semiconductor die 124 from degradation due to exposure to light or other emissions. Alternatively, a transparent or translucent encapsulant 280 and backside protection layer 304 provide light transmission for semiconductor die 124 having optical properties. The small footprint of eWLCSP 308 is similar in size to a WLCSP without sidewall protection, because thickness $T_6$ of encapsulant 280 over sidewalls 148 results in a negligible increase in package size for eWLCSP 308. In one embodiment, the package footprint size of eWLCSP 308 is within 100 µm in the x- and y-directions of a WLCSP without sidewall encapsulant. Additionally, eWLCSP 308 formed on reconstituted panel 236 has shorter testing time, a greater yield, and lower manufacturing cost than standard wafer-level devices.

FIGS. 10a-10c show a cross-sectional view of a portion of semiconductor wafer 110 from FIG. 2a. Each semiconductor die 114 from FIG. 2b and shown in FIG. 10a has a back or non-active surface 310 and an active surface 312 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 312 to implement analog circuits or digital circuits, such as DSP, ASIC, MEMS, memory, or other signal processing circuit. In one embodiment, active surface 312 contains a MEMS, such as an accelerometer, strain gauge, microphone, or other sensor responsive to various external stimuli. Semiconductor die 114 may also contain IPDs, such as inductors, capacitors, and resistors, for RF signal processing. Back surface 310 of semiconductor wafer 110 may undergo an optional backgrinding operation with a mechanical grinding or etching process to remove a portion of base material 112 and reduce the thickness of semiconductor wafer 110 and semiconductor die 114.

An electrically conductive layer 314 is formed over active surface 312 using PVD, CVD, electrolytic plating, electroless plating process, or other suitable metal deposition process. Conductive layer 314 can be one or more layers of Al, Cu, Sn, Ni, Au, Ag, Ti, or other suitable electrically conductive material. Conductive layer 314 operates as contact pads electrically connected to the circuits on active surface 312. Conductive layer 314 can be formed as contact pads disposed side-by-side a first distance from the edge of semiconductor die 114, as shown in FIG. 10a. Alternatively, conductive layer 314 can be formed as contact pads that are offset in multiple rows such that a first row of contact pads is disposed a first distance from the edge of the die, and a second row of contact pads alternating with the first row is disposed a second distance from the edge of the die.

A first insulating or passivation layer 316 is formed over semiconductor die 114 and conductive layer 314 using PVD, CVD, printing, spin coating, spray coating, sintering or thermal oxidation. Insulating layer 316 contains one or more layers of SiO2, Si3N4, SiON, Ta2O5, Al2O3, HfO2, BCB, PI, PBO, or other polymer or dielectric material having similar structural and insulating properties. A portion of insulating layer 316 is removed by LDA using a laser or an etching process through a patterned photoresist layer to expose conductive layer 314 and provide for subsequent electrical interconnect.

Semiconductor wafer 110 undergoes electrical testing and inspection as part of a quality control process. Manual visual inspection and automated optical systems are used to perform inspections on semiconductor wafer 110. Software can be used in the automated optical analysis of semiconductor wafer 110. Visual inspection methods may employ equipment such as a scanning electron microscope, high-intensity or ultra-violet light, or metallurgical microscope. Semiconductor wafer 110 is inspected for structural characteristics including warpage, thickness variation, surface particulates, irregularities, cracks, delamination, and discoloration.

The active and passive components within semiconductor die 114 undergo testing at the wafer level for electrical performance and circuit function. Each semiconductor die 114 is tested for functionality and electrical parameters, as shown in FIG. 10b, using a test probe head 320 including a plurality of probes or test leads 322, or other testing device. Probes 322 are used to make electrical contact with nodes or conductive layer 314 on each semiconductor die 114 and provide electrical stimuli to contact pads 314. Semiconductor die 114 responds to the electrical stimuli, which is measured by computer test system 324 and compared to an expected response to test functionality of the semiconductor die. The electrical tests may include circuit functionality, lead integrity, resistivity, continuity, reliability, junction depth, ESD, RF performance, drive current, threshold current, leakage current, and operational parameters specific to the component type. The inspection and electrical testing of semiconductor wafer 110 enables semiconductor die 114 that pass to be designated as a KGD for use in a semiconductor package.

In FIG. 10c, semiconductor wafer 110 is singulated through saw street 116 using a saw blade or laser cutting tool 326 into individual semiconductor die 114. After singulation, side surfaces 328 of semiconductor die 114 are exposed. The individual semiconductor die 114 can be inspected and electrically tested for identification of KGD post singulation.

Figure 11G:
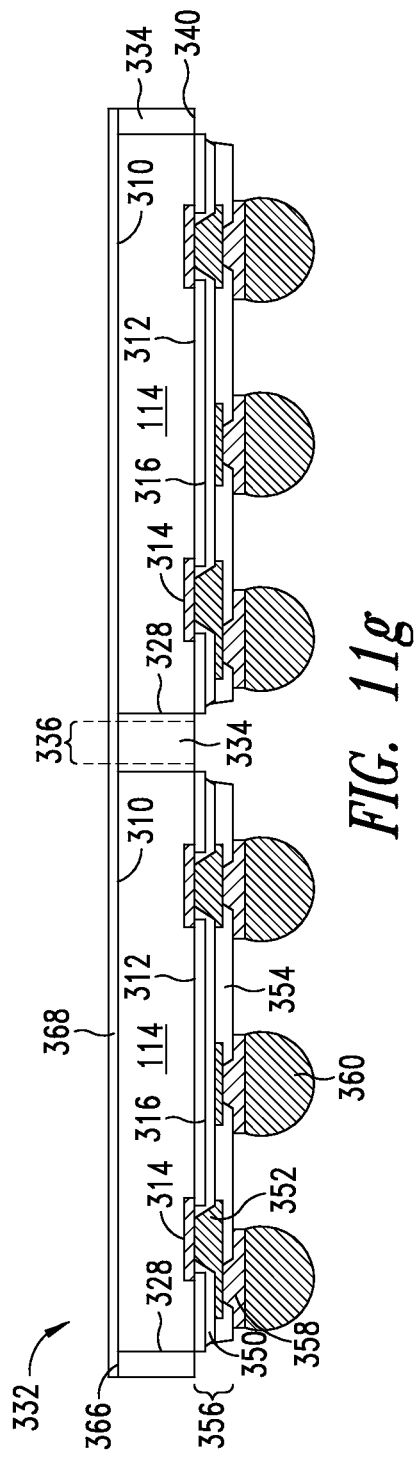

FIGS. 11a-11i show, in relation to FIGS. 1, 2a, and 10a-10c, a process of forming a fan-in eWLCSP. In FIG. 11a, semiconductor die 114 from FIG. 10c are mounted to interface layer 152 and over carrier 150 using, for example, a pick and place operation with active surface 312 oriented toward the carrier. Semiconductor die 114 are placed onto carrier 150 separated by a gap 330 with distance $D_6$ between semiconductor die 114. Distance $D_6$ between semiconductor die 114 is selected based on the design and specifications of the semiconductor package to be processed. Distance $D_6$ between semiconductor die 114 allows for a thin protective layer of an encapsulant to remain over sidewalls 328 after singulation. In one embodiment, distance $D_6$ is sufficient to provide sidewall coverage by an encapsulant plus a saw street area 336 for singulation. For example, to produce 30 μm of sidewall coverage for each semiconductor die 114 and an 80 μm saw street 336 for singulation, the distance $D_6$ of gap 330 is approximately 140 μm. In another embodiment, distance $D_6$ between semiconductor die 114 is 100 μm or less. In yet another embodiment, distance $D_6$ between semiconductor die 114 is greater than approximately 100 μm. Distance $D_6$ of gap 330 between semiconductor die 114 on carrier 150 is optimized for manufacturing the semiconductor packages at the lowest unit cost.

FIG. 11a shows semiconductor die 114 mounted to interface layer 152 of carrier 150 as reconstituted panel or reconfigured wafer 332. Reconstituted wafer or panel 332 can be processed into many types of semiconductor packages, including eWLB, fan-in WLCSP, eWLCSP, fan-out WLCSP, flipchip packages, 3D packages, PoP, or other semiconductor packages. Semiconductor die 114 are selected from KGD for mounting to carrier 150. The use of KGD for semiconductor die 114 in reconstituted panel 332 improves the yield of the resulting semiconductor packages.

Reconstituted panel 332 is configured according to the specifications of the resulting semiconductor package. In one embodiment, semiconductor die 114 are placed on carrier 150 in a high-density arrangement, i.e., 300 μm apart or less, for processing fan-in devices. The larger surface area of carrier 150 accommodates more semiconductor die 114 and lowers manufacturing cost as more semiconductor die 114 are processed per reconstituted panel 332. The number of semiconductor die 114 mounted to carrier 150 can be greater than the number of semiconductor die 114 singulated from semiconductor wafer 110. Carrier 150 and reconstituted panel 332 provide the flexibility to manufacture many different types of semiconductor packages using different size semiconductor die 114 from different sized semiconductor wafers 110.

In FIG. 11b, an encapsulant or molding compound 334 is deposited over semiconductor die 114 and carrier 150 as an insulating material using a paste printing, compressive molding, transfer molding, liquid encapsulant molding, vacuum lamination, spin coating, or other suitable applicator. Encapsulant 334 includes polymer composite material, such as epoxy resin with filler, epoxy acrylate with filler, or polymer with proper filler. Encapsulant 334 is non-conductive and environmentally protects the semiconductor device from external elements and contaminants. In one embodiment, encapsulant 334 includes an opaque material and is dark or black in color to provide protection of semiconductor die 114 from light and to prevent soft errors by attenuating photon injection. Encapsulant 334 is deposited into gap 330 and covers side surfaces 328 of semiconductor die 114, while active surface 312 is oriented toward carrier 150 and remains protected. Encapsulant 334 is formed with a back surface 338 over reconstituted panel 332 and covers back surface 310 of semiconductor die 114. Encapsulant 334 contacts interface layer 152 such that surface 340 of encapsulant 334, opposite back surface 338, is formed coplanar with active surface 312 of semiconductor die 114.

In FIG. 11c, temporary carrier 150 and interface layer 152 are removed by chemical etching, mechanical peel-off, CMP, mechanical grinding, thermal bake, laser scanning, or wet stripping. Temporary carrier 150 and interface layer 152 are removed from over surface 340 of encapsulant 334 and active surface 312 of semiconductor die 114 to expose conductive layer 314, insulating layer 316, and surface 340 of encapsulant 334.

An insulating or passivation layer 350 is formed over insulating layer 316 and conductive layer 314 using PVD, CVD, printing, spin coating, spray coating, sintering or thermal oxidation. Insulating layer 350 can be one or more layers of SiO2, Si3N4, SiON, Ta2O5, Al2O3, BCB, epoxy based photosensitive polymer dielectric, low temperature (≤200° C.) curable polymer, or other material having similar insulating and structural properties. In one embodiment, insulating layer 350 includes a low temperature curing photosensitive dielectric polymer with or without insulating fillers cured at less than 200° C. Insulating layer 350 is formed over active surface 312 of semiconductor die 114 and surface 340 of encapsulant 334. A portion of insulating layer 350 is removed by an etching process with a patterned photoresist layer or by LDA to expose conductive layer 314 with respect to insulating layer 350. In another embodiment, a portion of insulating layer 350 is also removed from over encapsulant 334 such that surface 340 of encapsulant 334 is exposed with respect to insulating layer 350. In yet another embodiment, insulating layer 350 is formed entirely within a footprint of semiconductor die 114 and does not extend beyond the footprint of semiconductor die 114 and over surface 340 of encapsulant 334. In other words, a peripheral region of semiconductor die 114 adjacent to semiconductor die 114 is devoid of insulating layer 350. In one embodiment, insulating layer 252 includes a thickness ranging from approximately 7-11 μm.

In FIG. 11d, an electrically conductive layer 352 is formed over insulating layer 350 and contact pads 314 using a patterning and metal deposition process such as PVD, CVD, sputtering, electrolytic plating, and electroless plating. Conductive layer 352 can be one or more layers of Al, Cu, Sn, Ni, Au, Ag, or other suitable electrically conductive material. Conductive layer 352 operates as an RDL to redistribute the electrical signals of semiconductor die 114. Conductive layer 352 is formed within a footprint of semiconductor die 114 and does not extend beyond the footprint of semiconductor die 114 or over surface 340 of encapsulant 334. In other words, a peripheral region of semiconductor die 114 adjacent to semiconductor die 114 is devoid of conductive layer 352. One portion of conductive layer 352 is electrically connected to contact pads 314 of semiconductor die 114. Other portions of conductive layer 352 can be electrically common or electrically isolated depending on the design and function of the semiconductor device. In one embodiment, conductive layer 352 includes a thickness ranging from approximately 7-10 μm.

An insulating or passivation layer 354 is formed over insulating layer 350 and conductive layer 352 using PVD, CVD, printing, spin coating, spray coating, sintering or thermal oxidation. Insulating layer 354 can be one or more layers of SiO2, Si3N4, SiON, Ta2O5, Al2O3, BCB, epoxy based photosensitive polymer dielectric, low temperature (≤200° C.) curable polymer, or other material having similar insulating and structural properties. In one embodiment, insulating layer 354 includes a low temperature curing photosensitive dielectric polymer with or without insulating fillers cured at less than 200° C. Insulating layer 354 is formed over active surface 312 of semiconductor die 114 and surface 340 of encapsulant 334. A portion of insulating layer 354 is removed by an etching process with a patterned photoresist layer or by LDA to expose conductive layer 352 with respect to insulating layer 354. In another embodiment, a portion of insulating layer 350 is also removed from over encapsulant 334 such that surface 340 of encapsulant 334 is exposed with respect to insulating layer 354. In yet another embodiment, insulating layer 354 is formed entirely within a footprint of semiconductor die 114 and does not extend beyond the footprint of semiconductor die 114 and over surface 340 of encapsulant 334. In other words, a peripheral region of semiconductor die 114 adjacent to semiconductor die 114 is devoid of insulating layer 354. In one embodiment, insulating layer 354 includes a thickness ranging from approximately 7-11 μm.

Insulating layers 350 and 354 together with conductive layer 352 constitute a build-up interconnect structure 356. Interconnect structure 356 is formed over active surface 312 of semiconductor die 114 and directly on conductive layer 312 and insulating layer 316. Interconnect structure 356 may include fewer or additional conductive and insulating layers. In one embodiment, the electrical interconnection of interconnect structure 356 remains entirely within a footprint of semiconductor die 114. A peripheral region outside a footprint of semiconductor die 114 is devoid of electrical interconnect thereby resulting in a fan-in interconnect structure 356.

In FIG. 11e, an electrically conductive layer 358 is optionally formed over the exposed portion of conductive layer 352 and over insulating layer 354 after final repassivation using PVD, CVD, evaporation, electrolytic plating, electroless plating, or other suitable metal deposition process. Conductive layer 358 can be Al, Ti, titanium tungsten (TiW), Cu, Sn, Ni, Au, Ag, W, or other suitable electrically conductive material. Conductive layer 358 operates as an under bump metallization (UBM) layer electrically connected to conductive layer 352. UBM layer 358 can be a multi-metal stack with adhesion layer, barrier layer, and seed or wetting layer. The adhesion layer is formed over conductive layer 358 and can be titanium nitride (TiN), Ti, TiW, Al, or chromium (Cr). The barrier layer is formed over the adhesion layer and can be tantalum nitride (TaN), nickel vanadium (NiV), platinum (Pt), palladium (Pd), Ni, TiW, Ti, or chromium copper (CrCu). The barrier layer inhibits the diffusion of Cu into the active area of semiconductor die 114. The seed layer is formed over the barrier layer and can be Cu, Ni, NiV, Au, or Al. UBM layer 358 provides a low resistive interconnect to conductive layer 352, as well as a barrier to solder diffusion and seed layer for solder wettability. UBM layer 358 further constitutes a portion of interconnect structure 356.

An electrically conductive bump material is deposited over conductive layer 358 of interconnect structure 356 and is electrically connected to conductive layer 314 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 358 using a suitable attachment or bonding process. In one embodiment, the bump material is reflowed by heating the material above its melting point to form spherical balls or bumps 360. In some applications, bumps 360 are reflowed a second time to improve electrical contact to UBM layer 358. The bumps can also be compression bonded to UBM layer 358. Bumps 360 represent one type of interconnect structure that can be formed over UBM layer 358. The interconnect structure can also use bond wires, stud bump, micro bump, or other electrical interconnect.

In FIG. 11f, reconstituted panel 332 undergoes an optional backgrinding step. A backgrinding tape or support tape 362 is applied over interconnect structure 356 and in contact with insulating layer 354 and bumps 360. A portion of encapsulant 334 is removed in a grinding operation with grinder 364 to planarize the surface of encapsulant 334 and expose back surface 310 of semiconductor die 114. A chemical etch or CMP process can also be used to planarize encapsulant 334 and to remove mechanical damage resulting from the grinding operation. The removal of a portion of encapsulant 334 leaves new back surface 366 of encapsulant 334. Encapsulant 334 is completely removed from over back surface 310 of semiconductor die 114 to expose back surface 310 of semiconductor die 114. After backgrinding, a new back surface 366 of encapsulant 334 is coplanar with back surface 310 of semiconductor die 114. Reconstituted panel 332 has a reduced thickness after the backgrinding operation. A thickness of semiconductor die 114 can also be reduced by the backgrinding operation. In one embodiment, a portion of back surface 310 of semiconductor die 114 is removed to thin semiconductor die 114 during the backgrinding operation. Removing a portion of encapsulant 334 reduces warpage of reconstituted panel 332. Laser marking can be applied directly to back surface 310 of semiconductor die 114 for alignment and singulation.

In FIG. 11g, a backside protection layer 368 is formed over back surface 310 of semiconductor die 114 and surface 366 of encapsulant 334 for protection of semiconductor die 114. Backside protection layer 368 may contain one or more layers of photosensitive low curing temperature dielectric resist, photosensitive composite resist, laminate compound film, resin matrix composite sheet with filler or glass fiber cloth, resin matrix composite sheet with both filler and glass fiber cloth, insulation paste with filler, solder mask resist film, liquid molding compound, granular molding compound, polyimide, BCB, SiO2, Si3N4, SiON, Ta2O5, Al2O3, prepreg, or other dielectric material having similar insulating and structural properties. Backside protection layer 368 is deposited using spin coating, screen printing, spray coating, vacuum or pressure lamination with or without heat, transfer molding, or other suitable process. In one embodiment, backside protection layer 368 is a low temperature curing photosensitive dielectric polymer with or without insulating fillers cured at less than 200° C. In another embodiment, backside protection layer 368 is cured by UV. Alternatively, backside protection layer 368 is a metal layer, such as Cu foil, applied to a backside of reconstituted panel 332. Backside protection layer 368 contacts back surface 310 of semiconductor die 114 to transfer heat from semiconductor die 114 and improve the thermal performance of the device.

Backside protection layer 368 is formed after singulation of semiconductor wafer 110 and reconstitution of semiconductor die 114, and prior to singulation of reconstituted panel 332. In one embodiment, backside protection layer 368 includes an opaque material and is dark or black in color to provide protection of semiconductor die 114 from photons from light and other emissions to reduce soft errors. Backside protection layer 368 can be used for laser marking reconstituted panel 332 and improves visibility of marking on the back surface of the reconstituted panel 332. In another embodiment, backside protection layer 368 includes a transparent or translucent material.

For semiconductor die 114 with optical properties, such as an LED, a transparent backside protection 368 layer allows photon emission from back surface 310 of semiconductor die 114 through backside protection layer 368. In one embodiment, the base material 112 of semiconductor die 114 includes sapphire, and semiconductor die 114 includes active elements on active surface 312. In a flip-chip application, light may be emitted through backside protection layer 368 and through base material 112 of semiconductor die 114. Back surface 310 of semiconductor die 114 is coated with a translucent or transparent backside protection layer 368. The translucent or transparent backside protection layer 368 provides mechanical protection of semiconductor die 114, while allowing light transmission through backside protection layer 368.

Figure 11H:
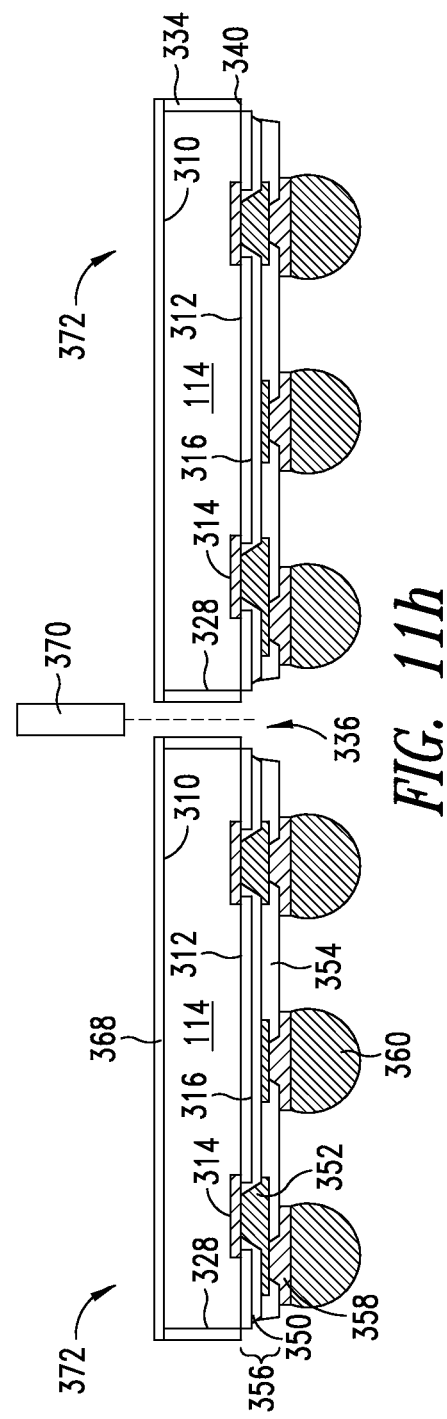

In FIG. 11h, reconstituted panel 332 is singulated with saw blade or laser cutting device 370 into individual semiconductor devices or eWLCSP 372. Reconstituted wafer 332 is singulated through encapsulant 334 and build-up interconnect structure 356. Singulating through encapsulant 334 removes a portion of encapsulant 334 from saw street 336 while a thin layer of encapsulant 334 remains over sidewalls 328 of semiconductor die 114. eWLCSP 372 undergoes electrical testing before or after singulation. Because eWLCSP 372 are singulated through encapsulant 334, eWLCSP 372 are subject to less damage during singulation. With less risk of damage during singulation, testing can be performed prior to singulation and expensive inspection steps can be eliminated from the final testing of each eWLCSP 372. By testing prior to singulating reconstituted panel 332, eWLCSP 372 can be tested at the reconstituted wafer level. Wafer level testing reduces cost of testing by reducing the handling and testing time compared to pick and place handling and testing of singulated packages.

Figure 11I:
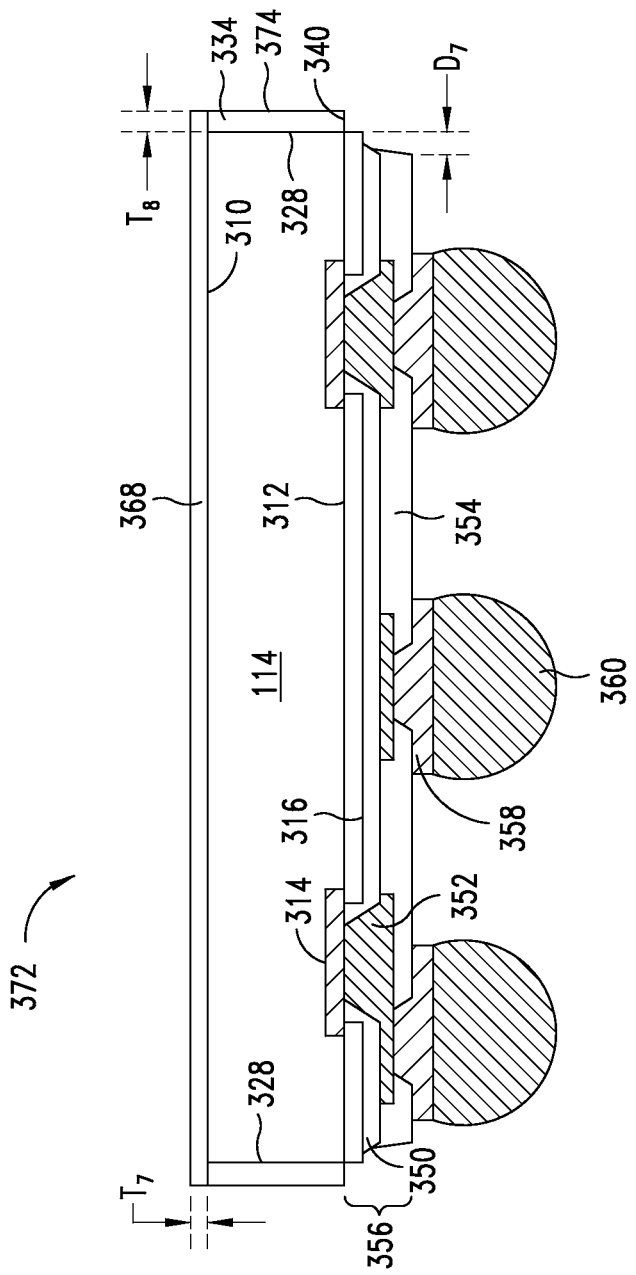

FIG. 11i shows a cross-sectional view of eWLCSP 372 after singulation. Interconnect structure 356 is formed over active surface 312 of semiconductor die 114 and surface 340 of encapsulant 334. Bumps 360 are formed over conductive layer 358 of interconnect structure 356. Semiconductor die 114 is electrically connected through conductive layers 314 and 352 and UBM layer 358 to bumps 360 for external interconnect through interconnect structure 356. Interconnect structure 356 and bumps 360 remain within a footprint of semiconductor die 114 to form a fan-in package. In one embodiment, interconnect structure 356 is formed a distance $D_7$ from sidewall 328 of semiconductor die 114, and distance $D_7$ is at least 1 µm.

A thin layer of encapsulant 334 remains disposed over sidewalls 328 after singulation. Encapsulant 334 is disposed over four sides of semiconductor die 114, i.e., over the four sidewalls 328, and backside protection layer 368 is disposed over back surface 310 resulting in five-sided protection of semiconductor die 114. Backside protection layer 368 is disposed over back surface 310 and provides mechanical protection for semiconductor die 114. Backside protection layer 368 may protect semiconductor die 114 from light. Backside protection layer 368 includes a thickness $T_7$ over back surface 310 of semiconductor die 114 and over encapsulant 334. In one embodiment, backside protection layer 368 has a thickness $T_7$ ranging from approximately 5-150 µm. In another embodiment, backside protection layer 368 has a thickness $T_7$ of greater than approximately 30 µm. In yet another embodiment, backside protection layer 368 has a thickness $T_7$ of approximately 120 µm or less. Backside protection layer 368 and sidewall encapsulant 334 improve the strength and reduce chipping of semiconductor die 114. eWLCSP 372 with backside protection layer 368 may be formed with a reduced height or profile compared to devices with a backside encapsulant.

Encapsulant 334 and backside protection layer 368 increase the strength of semiconductor die 114 by providing mechanical protection during the package assembly and singulation operations and during surface mounting and end use of eWLCSP 372. Encapsulant 334 over sidewalls 328 mitigates cracking and chipping of semiconductor die 114 within eWLCSP 372. An opaque encapsulant 334 and backside protection layer 368 further protect semiconductor die 114 from degradation due to exposure to light or other emissions. Alternatively, a transparent or translucent encapsulant 334 and backside protection layer 368 provide light transmission for semiconductor die 114 having optical properties.

FIGS. 12a-12b show another view of fan-in eWLCSP 372. FIG. 12a shows a plan view of the interconnect side of eWLCSP 372. Encapsulant 334 is formed over each sidewall 328 to form a thin peripheral ring of encapsulant 334 around semiconductor die 114. The small footprint of eWLCSP 372 is similar in size to a WLCSP without sidewall protection, because thickness $T_8$ of encapsulant 334 over sidewalls 328 results in a negligible increase in package size for eWLCSP 372. In one embodiment, the package footprint size of eWLCSP 372 is within 100 μm in the x- and y-directions of a WLCSP without sidewall encapsulant. Additionally, eWLCSP 372 formed on reconstituted panel 332 has shorter testing time, a greater yield, and lower manufacturing cost than standard wafer-level devices.

FIG. 12b shows additional detail of eWLCSP 372 from FIG. 12a. Encapsulant 334 over sidewalls 328 of semiconductor die 114 includes a thickness $T_8$, measured from a sidewall 328 of semiconductor die 114 to an edge 374 of eWLCSP 372. In one embodiment, a thickness $T_8$ of encapsulant 334 over sidewalls 328 is less than approximately 100 μm. In another embodiment, encapsulant 334 over sidewalls 328 of semiconductor die 114 includes a thickness $T_8$ of approximately 70 μm or less. In yet another embodiment, a thickness $T_8$ of encapsulant 334 over sidewalls 328 ranges from approximately 30-50 μm.

eWLCSP 372 accommodates high density I/O and fine pitch I/O. In one embodiment, bumps 360 may include a size or diameter of approximately 250 μm. Bumps 360 have a pitch of approximately 0.4 mm or less and a density of approximately 6 I/O/mm2 or greater. In another embodiment, bumps 360 have a pitch of approximately 0.5 mm or less and a density of approximately 4 I/O/mm2 or greater.

Figure 13:
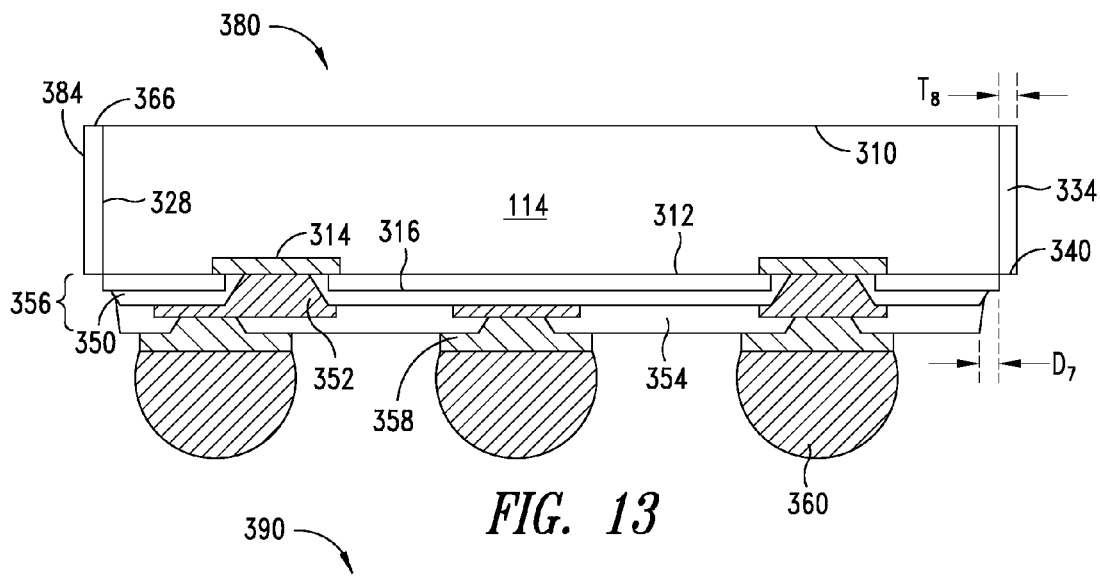
FIG. 13 illustrates an eWLCSP with an exposed back surface of a semiconductor die.

FIG. 13 shows an eWLCSP 380 with an exposed back surface 310 of semiconductor die 114. Semiconductor die 114 includes conductive layer 314 and insulating layer 316 formed over active surface 312 with openings in insulating layer 316 formed over conductive layer 314. Encapsulant 334 is deposited over and around semiconductor die 114, and encapsulant 334 is removed from over back surface 310 of semiconductor die 114. Interconnect structure 356 includes conductive layers 352 and 358 and insulating layers 350 and 354 and is formed over active surface 312 of semiconductor die 114. Bumps 360 are formed over UBM layer 358 of interconnect structure 356. Semiconductor die 114 is electrically connected through conductive layers 314 and 352 and UBM layer 358 to bumps 360 for external interconnect through interconnect structure 356. Interconnect structure 356 and bumps 360 remain within a footprint of semiconductor die 114 to form a fan-in package. In one embodiment, interconnect structure 356 is formed a distance $D_7$ from sidewall 328 of semiconductor die 114, and distance $D_7$ is at least 1 μm.

A thin layer of encapsulant 334 remains disposed over sidewalls 328 of semiconductor die 114 after singulation. Encapsulant 334 over sidewalls 328 of semiconductor die 114 includes a thickness $T_8$, measured from sidewall 328 of semiconductor die 114 to an edge 384 of eWLCSP 380. Encapsulant 334 over sidewalls 328 has a thickness $T_8$ of less than approximately 100 μm. Encapsulant 334 is disposed over four sides of semiconductor die 114, i.e., over the four sidewalls 328. Encapsulant 334 disposed over sidewalls 328 increases the strength of semiconductor die 114 by providing mechanical protection during the package assembly and singulation operations and during surface mounting and end use of eWLCSP 380. Encapsulant 334 over sidewalls 328 mitigates cracking and chipping of semiconductor die 114 within eWLCSP 380. eWLCSP 380 with an exposed back surface 310 of semiconductor die 114 has a reduced height or profile compared to devices with a backside protection layer. The small footprint of eWLCSP 380 is similar in size to a WLCSP without sidewall protection, because thickness $T_8$ of encapsulant 334 over sidewalls 328 results in a negligible increase in package size for eWLCSP 380. In one embodiment, the package footprint size of eWLCSP 380 is within 100 μm in the x- and y-directions of a WLCSP without sidewall encapsulant. Additionally, eWLCSP 380 formed on a reconstituted panel has shorter testing time, a greater yield, and lower manufacturing cost than standard wafer-level devices.

Figure 14:
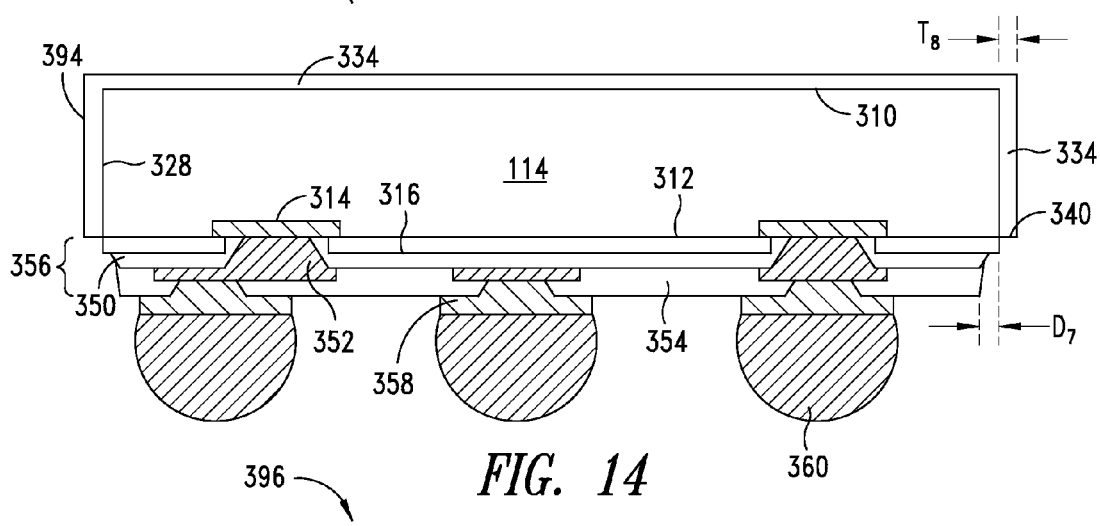
FIG. 14 illustrates an eWLCSP with backside encapsulant.

FIG. 14 shows an eWLCSP 390 with backside encapsulant. Semiconductor die 114 includes conductive layer 314 and insulating layer 316 formed over active surface 312 with openings in insulating layer 316 formed over conductive layer 314. Encapsulant 334 is deposited over and around semiconductor die 114. Interconnect structure 356 includes conductive layers 352 and 358 and insulating layers 350 and 354 and is formed over active surface 312 of semiconductor die 114. Bumps 360 are formed over UBM layer 358 of interconnect structure 356. Semiconductor die 114 is electrically connected through conductive layers 314 and 352 and UBM layer 358 to bumps 360 for external interconnect through interconnect structure 356. Interconnect structure 356 and bumps 360 remain within a footprint of semiconductor die 114 to form a fan-in package. In one embodiment, interconnect structure 356 is formed a distance $D_7$ from sidewall 328 of semiconductor die 114, and distance $D_7$ is at least 1 μm.

Encapsulant 334 is deposited over back surface 310 of semiconductor die 114. Encapsulant 334 operates as a backside protection layer for semiconductor die 114. An optional backgrinding step is used to thin encapsulant 334 over back surface 310 of semiconductor die 114. Without a backgrinding step, the cost of manufacturing eWLCSP 390 is reduced. A thin layer of encapsulant 334 remains disposed over sidewalls 328 of semiconductor die 114 after singulation. Encapsulant 334 over sidewalls 328 of semiconductor die 114 includes a thickness $T_8$, measured from sidewall 328 of semiconductor die 114 to an edge 394 of eWLCSP 390. Encapsulant 334 over sidewalls 328 has a thickness $T_8$ of less than approximately 100 μm. Therefore, encapsulant 334 is disposed over five sides of semiconductor die 114, i.e., over four side surfaces 328 and over back surface 310.

Encapsulant 334 disposed over sidewalls 328 and back surface 310 increases the strength of semiconductor die 114 by providing mechanical protection during the package assembly and singulation operations and during surface mounting and end use of eWLCSP 390. Encapsulant 334 over sidewalls 328 and back surface 310 mitigates cracking and chipping of semiconductor die 114 within eWLCSP 390. Encapsulant 334 further protects semiconductor die 114 from degradation due to exposure to light or other emissions. The small footprint of eWLCSP 390 is similar in size to a WLCSP without sidewall protection, because thickness $T_8$ of encapsulant 334 over sidewalls 328 results in a negligible increase in package size for eWLCSP 390. In one embodiment, the package footprint size of eWLCSP 390 is within 100 µm in the x- and y-directions of a WLCSP without sidewall encapsulant. Thus, eWLCSP 390 maintains a small package size while improving the reliability of the device. Additionally, eWLCSP 390 formed on a reconstituted panel has shorter testing time, a greater yield, and lower manufacturing cost than standard wafer-level devices.

Figure 15:
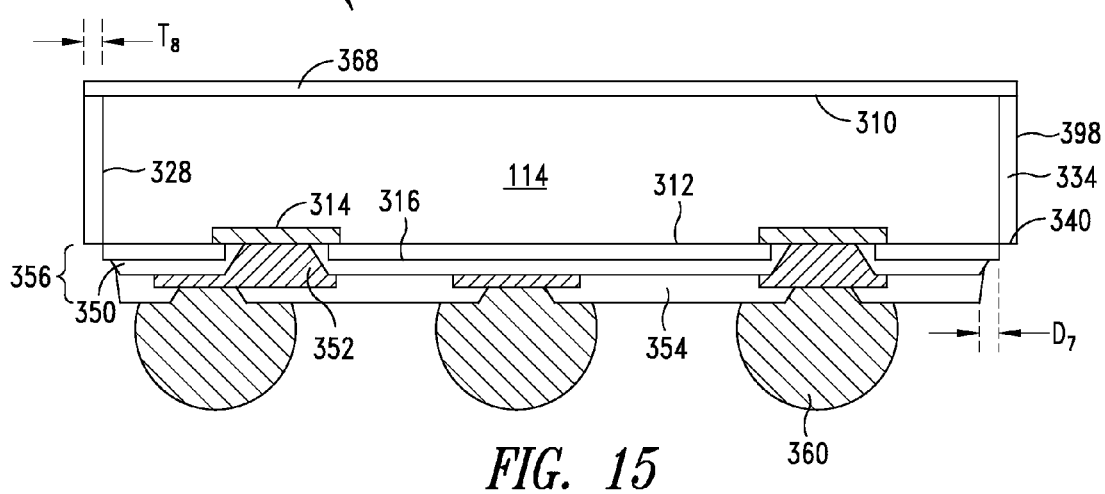
FIG. 15 illustrates another fan-in eWLCSP with a backside protection layer.

FIG. 15 shows another eWLCSP 396 with a backside protection layer 368. eWLCSP 396 is similar to eWLCSP 372 and includes bumps 360 formed directly on conductive layer or RDL 352, without a UBM layer. eWLCSP 396 processed without a UBM layer further reduces the cost of manufacturing the devices. A thin layer of encapsulant 334 remains disposed over sidewalls 328 of semiconductor die 114 after singulation. Encapsulant 334 over sidewalls 328 of semiconductor die 114 includes a thickness $T_8$, measured from sidewall 328 of semiconductor die 114 to an edge 398 of eWLCSP 396. Encapsulant 334 over sidewalls 328 has a thickness $T_8$ of less than approximately 100 µm. Encapsulant 334 is disposed over four sides of semiconductor die 114, i.e., over the four sidewalls 328, and backside protection layer 368 is disposed over back surface 310 resulting in five-sided protection of semiconductor die 114. Backside protection layer 368 and sidewall encapsulant 334 improve the strength and reduce chipping of semiconductor die 114. An opaque encapsulant 334 and backside protection layer 368 further protect semiconductor die 114 from degradation due to exposure to light or other emissions. Alternatively, a transparent or translucent encapsulant 334 and backside protection layer 368 provide light transmission for semiconductor die 114 having optical properties. eWLCSP 396 with backside protection layer 368 may be formed with a reduced height or profile compared to devices with a backside encapsulant.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a plurality of semiconductor die;
   depositing an encapsulant around and over the semiconductor die;
   forming a first insulating layer over an active surface of the semiconductor die and in contact with the encapsulant;
   forming an interconnect structure over the first insulating layer and semiconductor die by,
      (a) forming a conductive layer, and
      (b) forming a bump over the conductive layer, wherein the entire interconnect structure is disposed within a footprint of the semiconductor die as a fan-in interconnect structure;
   forming a protection layer over a top surface of the encapsulant and over a second surface of the semiconductor die opposite the active surface; and
   singulating the plurality of semiconductor die through the protective layer, encapsulant, and first insulating layer to leave a thickness of the encapsulant disposed over a side surface of the semiconductor die less than 100 micrometers and the first insulating layer and protection layer terminating at an outside surface of the encapsulant.

2. The method of claim 1, further including removing a portion of the encapsulant to leave the top surface of the encapsulant coplanar with the second surface of the semiconductor die.

3. The method of claim 1, further including forming a second insulating layer over the conductive layer, wherein the second insulating layer terminates at the outside surface of the encapsulant.

4. The method of claim 1, wherein the protective material includes a transparent material or translucent material.

5. The method of claim 1, wherein the protective material includes an opaque material.

6. The method of claim 1, wherein the thickness of the encapsulant disposed over the side surface of the semiconductor die ranges from 30 to 50 micrometers.

7. A method of making a semiconductor device, comprising:
   providing a semiconductor die;
   depositing an encapsulant around and over the semiconductor die;
   forming a first insulating layer over the encapsulant and a first surface of the semiconductor die;
   forming an interconnect structure over the first insulating layer and semiconductor die by,
      (a) forming a conductive layer, and
      (b) forming a bump over the conductive layer, wherein the entire interconnect structure is disposed within a footprint of the semiconductor die; and
   forming a protection layer over a top surface of the encapsulant and over a second surface of the semiconductor die opposite the first surface of the semiconductor die, wherein a thickness of the encapsulant disposed over a side surface of the semiconductor die is less than 100 micrometers and the first insulating layer and protection layer terminate at an outside surface of the encapsulant.

8. The method of claim 7, further including removing a portion of the encapsulant to leave the top surface of the encapsulant coplanar with the second surface of the semiconductor die.

9. The method of claim 7, further including forming a second insulating layer over the conductive layer, wherein the second insulating layer terminates at the outside surface of the encapsulant.

10. The method of claim 7, wherein the protective material includes a transparent material or translucent material.

11. The method of claim 7, wherein the protective material includes an opaque material.

12. The method of claim 7, wherein the thickness of the encapsulant disposed over the side surface of the semiconductor die ranges from 30 to 50 micrometers.

13. A method of making a semiconductor device, comprising:
   providing a semiconductor die;
   depositing an encapsulant around and over the semiconductor die;
   forming a first insulating layer over the encapsulant and a first surface of the semiconductor die;
   forming an interconnect structure over the first insulating layer and semiconductor die by,
      (a) forming a conductive layer, and
      (b) forming a bump over the conductive layer, wherein the interconnect structure is disposed within a footprint of the semiconductor die; and
   forming a protection layer over a surface of the encapsulant and over a second surface of the semiconductor die opposite the first surface of the semiconductor die, wherein a thickness of the encapsulant disposed over a side surface of the semiconductor die is less than 100 micrometers.

14. The method of claim 13, further including removing a portion of the encapsulant to leave the surface of the encapsulant coplanar with the second surface of the semiconductor die.

15. The method of claim 13, wherein the first insulating layer and protection layer terminate at an outside surface of the encapsulant.

16. The method of claim 13, further including forming a second insulating layer over the conductive layer, wherein the second insulating layer terminates at an outside surface of the encapsulant.

17. The method of claim 13, wherein the protective material includes a transparent material or translucent material.

18. The method of claim 13, wherein the protective material includes an opaque material.

19. The method of claim 13, wherein the thickness of the encapsulant disposed over the side surface of the semiconductor die ranges from 30 to 50 micrometers.

20. A method of making a semiconductor device, comprising:

providing a semiconductor die;

depositing an encapsulant around and over the semiconductor die;

forming a first insulating layer over the encapsulant and a first surface of the semiconductor die; and forming an interconnect structure over the first insulating layer and semiconductor die by,
(a) forming a conductive layer, and
(b) forming a bump over the conductive layer, wherein the interconnect structure is disposed within a footprint of the semiconductor die;

wherein a thickness of the encapsulant disposed over a side surface of the semiconductor die is less than 100 micrometers.

21. The method of claim 20, wherein the first insulating layer terminates at an outside surface of the encapsulant.

22. The method of claim 20, wherein a thickness of the encapsulant over the semiconductor die is at least 100 micrometers.

23. The method of claim 20, wherein the thickness of the encapsulant disposed over the side surface of the semiconductor die ranges from 30 to 50 micrometers.

* * * * *